United States Patent
Hamaguchi et al.

(10) Patent No.: US 6,787,780 B2
(45) Date of Patent: Sep. 7, 2004

(54) MULTI-BEAM EXPOSURE APPARATUS USING A MULTI-AXIS ELECTRON LENS, FABRICATION METHOD OF A SEMICONDUCTOR DEVICE

(75) Inventors: Shinichi Hamaguchi, Tokyo (JP); Takeshi Haraguchi, Tokyo (JP); Hiroshi Yasuda, Tokyo (JP)

(73) Assignee: Advantest Corporation, Tokyo (JP)

( * ) Notice: Subject to any disclaimer, the term of this patent is extended or adjusted under 35 U.S.C. 154(b) by 204 days.

(21) Appl. No.: 09/824,880

(22) Filed: Apr. 4, 2001

(65) Prior Publication Data

US 2001/0028046 A1 Oct. 11, 2001

(30) Foreign Application Priority Data

Apr. 4, 2000 (JP) ........................................ 2000-102619
Aug. 23, 2000 (JP) ........................................ 2000-251885
Oct. 3, 2000 (JP) ........................................ 2000-342661

(51) Int. Cl.$^7$ ............................................. H01J 37/12
(52) U.S. Cl. ................. 250/398; 250/492.1; 250/492.2; 250/492.21; 250/492.22; 250/396 R; 250/396 ML; 250/491.1; 250/493.1; 355/53; 355/18
(58) Field of Search ................... 250/396 ML, 396 R, 250/398, 491.1, 492.1, 492.2, 492.3, 492.21, 492.22; 355/53, 18

(56) References Cited

U.S. PATENT DOCUMENTS

| | | | |
|---|---|---|---|
| 3,715,580 A | | 2/1973 | Maekawa et al. |
| 4,209,702 A | | 6/1980 | Shirai et al. |
| 4,390,789 A | * | 6/1983 | Smith et al. ............. 250/492.2 |
| 4,996,441 A | * | 2/1991 | Lischke ................... 250/492.2 |
| 5,260,579 A | * | 11/1993 | Yasuda et al. ........... 250/492.2 |
| 5,384,463 A | * | 1/1995 | Honjo et al. ................. 250/398 |
| 5,834,783 A | * | 11/1998 | Muraki et al. .............. 250/398 |
| 5,962,859 A | | 10/1999 | Groves et al. |
| 5,981,962 A | | 11/1999 | Groves et al. |
| 6,014,200 A | | 1/2000 | Sogard et al. |
| 6,104,035 A | * | 8/2000 | Muraki .................. 250/492.22 |
| 6,175,122 B1 | | 1/2001 | Groves et al. |

FOREIGN PATENT DOCUMENTS

| | | |
|---|---|---|
| EP | 0 518633 A1 | 12/1992 |
| JP | 5-275322 | 10/1993 |
| JP | 8-191042 | 7/1996 |
| JP | 11-87206 | 3/1999 |
| JP | 11-317357 | 11/1999 |

* cited by examiner

Primary Examiner—John R. Lee
Assistant Examiner—David A. Vanore
(74) Attorney, Agent, or Firm—Morrison & Foerster LLP

(57) ABSTRACT

An electron beam exposure apparatus for exposing a wafer includes: a multi-axis electron lens operable to converge a plurality of electron beams independently of each other; and a lens-intensity adjuster including a substrate provided to be substantially parallel to the multi-axis electron lens, and a lens-intensity adjusting unit operable to adjust the lens intensity of the multi-axis electron lens applied to the electron beams passing through the lens openings, respectively.

21 Claims, 55 Drawing Sheets

MULTI-BEAM EXPOSURE APPARATUS USING A MULTI-AXIS ELECTRON LENS, FABRICATION METHOD OF A SEMICONDUCTOR DEVICE

This is a counterpart application of a Japanese patent applications 2000-102619, filed on Apr. 4, 2000, 2000-251885, filed on Aug. 23, 2000, and 2000-342661, filed on Oct. 3, 2000, the contents of which are incorporated herein by reference.

BACKGROUND OF THE INVENTION

1. Field of the Invention

The present invention relates to a multi-electron-beam exposure apparatus, a multi-axis electron lens, a fabrication method of the multi-axis electron lens and a fabrication method of a semiconductor device.

2. Description of the Related Art

Conventionally, it is known an electron-beam exposure apparatus capable of exposing a wafer with a plurality of electron beams in order to form a semi-conductor device. For example, an electrons-beam exposure apparatus including an electron lens having a pair of magnetic plates placed in parallel relationship with each other is disclosed in U.S. Pat. No. 3,715,580 or in U.S. Pat. No. 4,209,702. The pair of magnetic plates has a plurality of through holes at places corresponding to each other for respectively having the plurality of electron beams pass therethrough in order for focusing images.

The conventional electron beam exposure apparatus disclosed in above patents corrects the focus of the electron beams by using exciting coils provided between the pair of magnetic plates. However, it is difficult to provide the exciting coils between the pair of magnetic plate. Especially, in case that the electron beam exposure apparatus uses a number of electron beams, it is difficult to provide them between the pair of magnetic plate.

SUMMARY OF THE INVENTION

Therefore, it is an object of the present invention to provide a multi-beam exposure apparatus using a multi-axis electron lens, a fabrication method of a multi-axis electron lens and a fabrication method of a semiconductor device, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, an electron beam exposure apparatus for exposing a wafer, comprising: a multi-axis electron lens operable to converge a plurality of electron beams independently of each other; and a lens-intensity adjuster including a substrate provided to be substantially parallel to said multi-axis electron lens, and a lens-intensity adjusting unit operable to adjust the lens intensity of said multi-axis electron lens applied to said electron beams passing through said lens openings, respectively.

The multi-axis electron lens may include a plurality of magnetic conductive members arranged to be substantially parallel to each other, said plurality of magnetic conductive members having a plurality of lens openings forming a plurality of lens openings allowing said plurality of electron beams to pass therethrough, respectively.

The lens-intensity adjusting unit may include an adjusting electrode provided to surround said electron beams from said substrate to said lens opening, said adjusting electrode being insulated from said plurality of magnetic conductive members.

A length of said adjusting electrode in a direction in which said electron beams are radiated may be longer than an inner diameter of said adjusting electrode.

The adjusting electrode may be provided to project from one of said magnetic conductive members other than a magnetic conductive member opposed to said substrate.

The lens-intensity adjusting unit may include a plurality of adjusting electrodes provided to surround said electron beams, respectively, from said substrate to said lens openings.

The lens-intensity adjusting unit may include a means operable to apply different voltages to said plurality of adjusting electrodes.

The lens-intensity adjusting unit may include an adjusting coil operable to adjust magnetic field intensities in said lens openings, said adjusting coil being provided to surround said electron beams from said substrate along a direction in which said electron beams are radiated.

The adjusting coil may be arranged to be insulated from said magnetic conductive members.

The lens-intensity adjusting unit may further include: a plurality of adjusting coils provided to surround said electron beams from said substrate to said plurality of lens openings; and an adjusting coil controller operable to supply different currents to said plurality of adjusting coils.

The multi-axis electron lens may further include a non-magnetic conductive member provided between said plurality of magnetic conductive members, said non-magnetic conductive member having a plurality of through holes, wherein said through holes of said non-magnetic conductive member and said openings of said plurality of magnetic conductive members form together said plurality of lens openings.

The multi-axis electron lens may further include a coil part having: a coil provided in an area surrounding said magnetic conductive members for generating a magnetic field; and a coil magnetic conductive member provided in an area surrounding said coil.

The coil magnetic conductive member may be formed from a material having a different magnetic permeability from that of a material for said plurality of magnetic conductive members.

The electron beam exposure apparatus may further comprises at least one further multi-axis electron lens operable to reduce cross sections of said electron beams.

The electron beam exposure apparatus may further comprises an electron beam shaping unit that comprises: a first shaping member having a plurality of first shaping openings operable to shape said plurality of electron beams; a first shaping-deflecting unit operable to deflect said plurality of electron beams after passing through said first shaping member, independently of each other; and a second shaping member having a plurality of second shaping openings operable to shape said plurality of electron beams after passing through said first shaping-deflecting unit to have desired shapes.

The electron beam shaping unit may further include a second shaping-deflecting unit operable to deflect said plurality of electron beams deflected by said first shaping-deflecting unit independently of each other toward a direction substantially perpendicular to a surface of said wafer onto which said electron beams are incident, wherein said electron beam shaping unit allows said plurality of electron beams deflected by said second shaping-deflecting unit to pass through said second shaping member so as to shape said electron beams to have said desired shapes.

The second shaping member may include a plurality of shaping-member illumination areas onto which said electron beams deflected by the second shaping-deflecting unit are incident, and said second shaping member includes said second shaping openings and other openings having different sizes from sizes of said second shaping openings in said shaping-member illumination area.

The electron beam exposure apparatus may further comprise: a plurality of electron guns operable to generate said plurality of electron beams; and a further multi-axis electron lens operable to converge said generated electron beams to make said converged electron beams incident on said first shaping member, wherein said first shaping member divides said electron beams after passing through said further multi-axis electron lens.

The electron beam exposure apparatus may comprise a plurality of multi-axis electron lenses.

The electron beam exposure apparatus may further comprises: a plurality of electron guns operable to generate said plurality of electron beams; and a voltage controller, connected to said electron guns, operable to apply different voltages to said plurality of electron guns.

According to the second aspect of the present invention, a fabrication method of a semiconductor device on a wafer, comprising: performing focus adjustments for said plurality of electron beams independently of each other by a multi-axis electron lens having a plurality of lens openings for converging a plurality of electron beams independently of each other and a lens-intensity adjusting unit for adjusting a lens intensity of said multi-axis electron lens applied to said electron beams passing through said lens openings, said lens-intensity adjusting unit being provided on a substrate substantially parallel to said multi-axis electron lens; and exposing a pattern onto said wafer by illuminating said wafer with said plurality of electron beams.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIGS. 44A and 44B show the deflecting unit 60. The

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
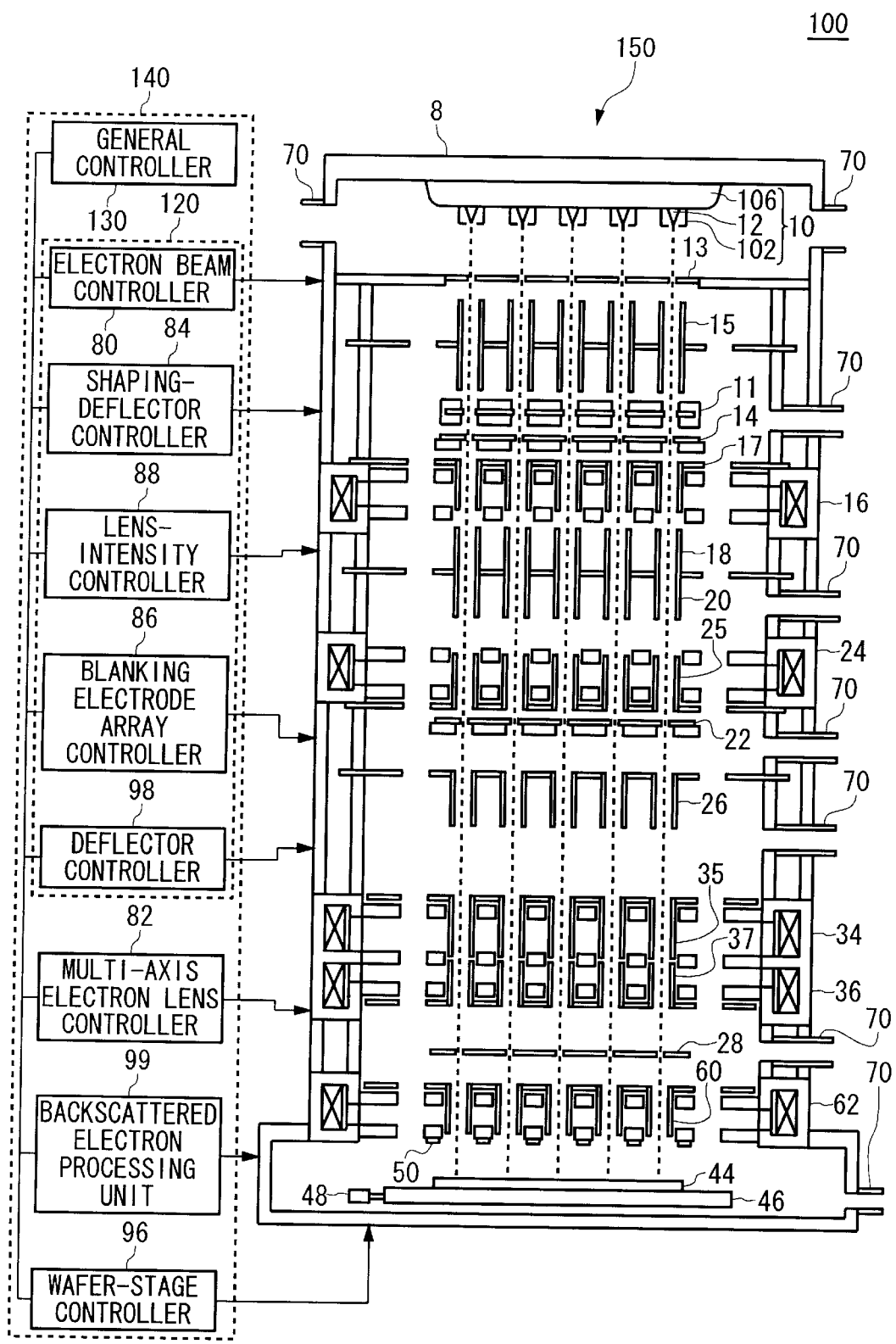
FIG. 1 shows an electron beam exposure apparatus 100 according to an embodiment of the present invention.

FIG. 1 shows an electron beam exposure apparatus 100 according to an embodiment of the present invention. The electron beam exposure apparatus 100 includes an exposure unit 150 for performing a predetermined exposure process for a wafer 44 with electron beams and a controlling system 140 for controlling operations of respective components included in the exposure unit 150.

The exposure unit 150 includes: a body 8 provided with a plurality of exhaust holes 70; an electron beam shaping unit which can emit a plurality of electron beams and shape a cross-sectional shape of each electron beam so that each electron beam has a desired shape; an illumination switching unit which can independently switch for each electron beam whether or not the electron beam is cast onto the wafer 44; and an electron optical system including a wafer projection system which can adjust the orientation and size of a pattern image transferred onto the wafer 44. In addition, the exposure unit 150 includes a stage system having a wafer stage 46 on which the wafer 44, onto which the pattern is to be transferred by exposure, can be placed and a wafer-stage driving unit 48 which can drive the wafer stage 46.

The electron beam shaping unit includes an electron beam generator 10 which can generate a plurality of electron beams, an anode 13 which allows the generated electron beams to be radiated, a slit cover 11 having a plurality of openings for shaping the cross-sectional shapes of the electron beams by allowing the electron beams to pass therethrough, a first shaping member 14, a second shaping member 22, a first multi-axis electron lens 16 which can converge the electron beams to adjust focal points of the electron beams independently of each other, a first lens-intensity adjuster 17 which can adjust the lens intensity which is the force that the magnetic field, which is formed in each lens opening of the first multi-axis electron lens 16, gives to the electron beam passing through the lens opening, The electron beam generator 10 includes an insulator 106, cathodes 12 which can generate thermoelectrons, and grids 102 formed to surround the cathodes 12 so as to stabilize the thermoelectrons generated by the cathodes 12. It is preferable that the cathodes 12 and the grids 102 are electrically insulated from each other. In this example, the electron beam generator 10 forms an electron gun array by having a plurality of electron guns 104 arranged at a predetermined interval on the insulator 106.

It is desirable that the slit cover 11 and the first and the second shaping member 14 and 22 have grounded metal films such as platinum films, on surfaces thereof onto which the electron beams are cast. It is also desirable that each of the slit covers 11, the first shaping member 14 and the second shaping member 22 include a cooling unit for suppressing the increase in the temperature caused by the incident electron beams.

The openings included in each of the slit covers 11, the first shaping member 14 and the second shaping member may have cross-sectional shapes each of which becomes wider along the radiated direction of the electron beams in order to allow the electron beams to pass efficiently. Moreover, the openings of each of the slit covers 11, the first shaping member 14 and the second shaping member 22 are preferably formed to be rectangular.

The illumination switching unit includes: a second multi-axis electron lens 24 which can converge a plurality of electron beams independently of each other and adjust focal points thereof; a second lens-intensity adjuster 25 which can independently adjust the lens-intensity in each lens opening of the second multi-axis electron lens 24; a blanking electrode array 26 which switches for each of the electron beams whether or not the electron beam is allowed to reach the wafer 44 by deflecting the electron beam independently of each other; and an electron beam blocking member 28 that has a plurality of openings allowing the electron beams to pass there-through and can block the electron beams deflected by the blanking electrode array 26. The openings of the electron beam blocking member 28 may have cross-sectional shapes each of which becomes wider along the illumination direction of the electron beams in order to allow the electron beams to efficiently pass there-through.

The wafer projection system includes: a third multi-axis electron lens 34 which can converge a plurality of electron beams independently of each other and adjust the rotations of the electron beams to be incident onto the wafer 44; a third lens-intensity adjuster 35 which can independently adjust the lens intensity in each lens opening of the third multi-axis electron lens 34; a fourth multi-axis electron lens 36 which can converge a plurality of electron beams independently of each other and adjust the reduction ratio of each electron beam to be incident onto the wafer 44; a fourth lens-intensity adjuster 37 which can independently adjust the lens intensity in each of lens openings of the fourth multi-axis electron lens 36; a deflecting unit 60 which can deflect a plurality of electron beams independently of each other to direct desired portions on the wafer 44; and a fifth multi-axis electron lens 62 which can function as an objective lens for the wafer 44 by converging a plurality of electron beams independently of each other. In this example, the third multi-axis electron lens 34 and the fourth multi-axis electron lens 36 are integrated with each other. In an alternative example, however, the third and fourth multi-axis electron lenses may be formed as separate components.

The controlling system 140 includes a general controller 130, a multi-axis electron lens controller 82, a backscattered electron processing unit 99, a wafer-stage controller 96 and an individual controller 120 which can control exposure parameters for each of the electron beams. The general controller 130 is, for example, a work station and can control the respective controllers included in the individual controller 120. The multi-axis electron lens controller 82 controls currents to be respectively supplied to the first multi-axis electron lens 16, the second multi-axis electron lens 24, the third multi-axis electron lens 34 and the fourth multi-axis electron lens 36. The backscattered electron processing unit 99 receives a signal based on the amount of backscattered electrons or secondary electrons detected in a backscattered electron detector 50 and notifies the general controller 130 that the backscattered electron processing unit 99 received the signal. The wafer-stage controller 96 controls the wafer-stage driving unit 48 so as to move the wafer stage 46 to a predetermined position.

The individual controller 120 includes an electron beam controller 80 for controlling the electron beam generator 10, a shaping-deflector controller 84 for controlling the first and second-shaping deflecting units 18 and 20, a lens-intensity controller 88 for controlling the first, second, third and fourth lens-intensity adjusters 17, 25, 35 and 37, a blanking electrode array controller 86 for controlling voltages to be applied to deflection electrodes included in the blanking electrode array 26, and a deflector controller 98 for controlling voltages to be applied to electrodes included in the deflectors of the deflecting unit 60.

Next, the operation of the electron beam exposure apparatus 100 in the present embodiment is described. First, the electron beam generator 10 generates a plurality of electron beams. The generated electron beams pass the anode 13 to enter a slit-deflecting unit 15. The slit-deflecting unit 15 adjusts the incident positions on the slit cover 11 onto which the electron beams that have passed through the anode 13 are incident.

The slit cover 11 can block a part of each electron beam so as to reduce the area of the electron beam incident on the first shaping member 14, thereby shaping the cross section of the electron beam to have a predetermined size. The thus shaped electron beam is incident on the first shaping member 14 in which it is further shaped. Each of the electron beams that have passed through the first shaping member 14 has a rectangular cross section in accordance with a corresponding one of the openings included in the first shaping member 14.

The first multi-axis electron lens 16 converges the electron beams that have been shaped to have rectangular cross sections by the first shaping member 14 independently of other electron beams, thereby the focus adjustment of the electron beam with respect to the second shaping member 22 can be performed for each electron beam. The first lens-intensity adjuster 17 adjusts the lens intensity in each lens opening of the first electron lens 16 in order to correct the focal point of the corresponding electron beam incident on the lens opening.

The first shaping deflecting unit 18 deflects each of the electron beams having the rectangular cross sections independently of the other electron beams, in order to make the electron beams incident on desired positions on the second shaping member 22. The second shaping deflecting unit 20 further deflects the thus deflected electron beams independently of each other in a direction approximately perpendicular to the second shaping member 22, thereby making adjustment in such a manner that the electron beams are incident on the desired positions of the second shaping member 22 approximately perpendicular to the second shaping member 22. The second shaping member 22, having a plurality of rectangular openings, further shapes the electron beams incident thereon in such a manner that the electron beams have desired rectangular cross sections respectively when being incident on the wafer 44. In this example, the first shaping deflecting unit 18 and the second shaping deflecting unit 20 are provided on the same substrate as shown in FIG. 1. In an alternative example, however, the first and second shaping deflecting units 18 and 20 may be formed separately.

The second multi-axis electron lens 24 converges the electron beams that have passed through the second shaping deflecting unit 20 independently of each other so as to perform the focus adjustment of the electron beam with respect to the blanking electrode array 26 for each electron beam. The second lens-intensity adjuster 25 adjusts the lens intensity in each lens opening of the second multi-axis electron lens 24 in order to correct the focal point of each electron beam incident onto the lens opening. The electron beams having the focal points adjusted by the second multi-axis electron lens 24 then pass through a plurality of apertures included in the blanking electrode array 26, respectively.

The blanking electrode array controller 86 controls whether or not voltages are applied to deflection electrodes provided in the vicinity of the respective apertures of the blanking electrode array 26. Based on the voltages applied to the deflection electrodes, the blanking electrode array 26 switches for each of the electron beams whether or not the electron beam is to be incident on the wafer 44. When the voltage is applied, the electron beam passing through the corresponding aperture is deflected. Thus, the electron beam cannot pass a corresponding opening of the electron beam blocking member 28, so that it cannot be incident on the wafer 44. When the voltage is not applied, the electron beam passing through the corresponding aperture is not deflected, so that it can pass through the corresponding opening of the electron beam blocking member 28. Thus, the electron beam can be incident on the wafer 44.

The third multi-axis electron lens 34 adjusts the rotation of the electron beams that have passed through the blanking electrode array 26. More specifically, the third multi-axis electron lens 34 adjusts the rotation of the image of the electron beams illuminated onto the wafer 44. The third lens-intensity adjuster 35 also adjusts the lens intensity in each lens opening of the third multi-axis electron lens 36 in order to make the rotations of the images of the respective electron beams incident on the third multi-axis electron lens 34 uniform.

The fourth multi-axis electron lens 36 reduces the illumination diameter of each of the electron beams incident thereon. The fourth lens-intensity adjuster 37 adjusts the lens intensity in each lens opening of the fourth multi-axis electron lens 36, thereby making the reduction rates of the electron beams substantially the same. Among the electron beams that have passed through the third multi-axis electron lens 34 and the fourth multi-axis electron lens 36, only the electron beam to be incident onto the wafer 44 passes through the electron beam blocking member 27, so as to enter the deflecting unit 60.

The deflector controller 98 controls a plurality of deflectors included in the deflecting unit 60 independently of each other. The deflecting unit 60 deflects the electron beams incident on the deflectors thereof independently of each other, in such a manner that the deflected electron beams are incident on the desired positions on the wafer 44. The fifth multi-axis electron lens 62 further adjusts the focus of the electron beams incident on the deflecting unit 60 with respect to the wafer 44 independently of each other. Then, the electron beams that have passed through the deflecting unit 60 and fifth multi-axis electron lens 62 can be incident on the wafer 44.

During the exposure process, the wafer-stage controller 96 moves the wafer stage 48 in predetermined directions. The blanking electrode array 86 determines the apertures that allow the electron beams to pass there-through and performs electric-power control for the respective apertures. In accordance with the movement of the wafer 44, the apertures allowing the electron beams to pass there-through are changed and the electron beams that have passed through the apertures are further deflected by the deflecting unit 60, thereby the wafer 44 is exposed to have a desired circuit pattern transferred.

The multi-axis electron lens of the present invention converges a plurality of electron beams independently of each other. Thus, although a cross over is formed for each electron beam, all the electron beams as a whole do not have a crossover. Therefore, even in a case where the current density of each electron beam is increased, the electron beam error, which may cause a shift of the focus or position of the electron beam due to coulomb interaction, can be decreased. Accordingly, the current density of each electron beam can be reduced, greatly shortening the exposure time.

Figure 2:
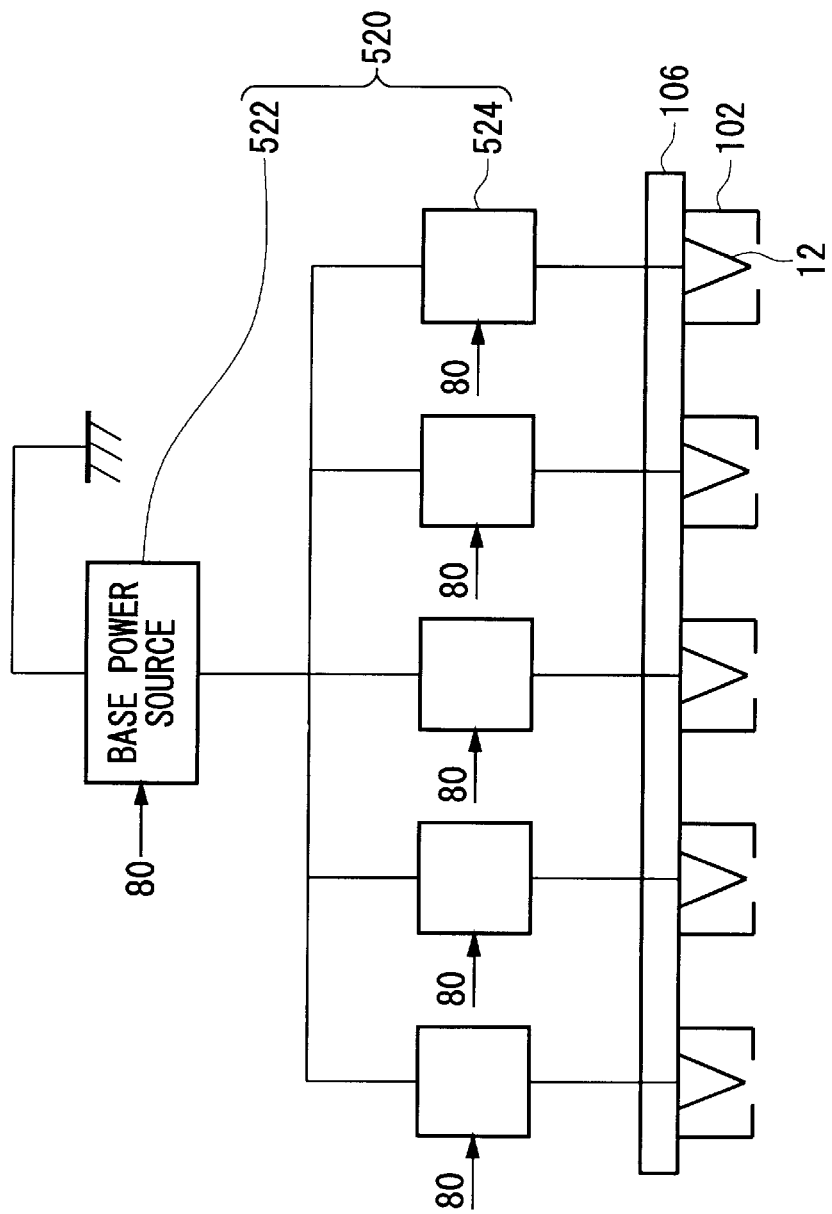
FIG. 2 schematically shows an arrangement of a voltage controller 520.

FIG. 2 schematically shows an arrangement of a voltage controller 520 which can apply a predetermined voltage to the electron beam generator 10. The voltage controller 520 includes a base power source 522 that generates the predetermined voltage, and adjusting power sources 524 that increase or reduce the predetermined voltage and apply the increased or reduced voltages to the respective cathodes 12.

The voltage controller 520 controls an acceleration voltage of each electron beam by controlling the voltage to be applied to the cathode 12 based on an instruction from the electron beam controller 80. It is preferable that the voltage controller 520 may control the acceleration voltage of each electron beam by applying, to the cathode 12 of the corresponding electron gun, the voltage that depends on the magnetic-field intensity applied to the electron beam by the multi-axis electron lenses 16, 24, 34, 36 and 62.

Moreover, it is preferable that the voltage controller 520 controls the acceleration voltages of the respective electron beams by applying different voltages to the cathodes of the electron guns, the voltages being determined in such a manner that the positions of the focal points of the respective electron beams to be incident on the wafer 44 are equal to each other. Furthermore, the voltage controller 520 may further control the acceleration voltages of the electron beams by applying different voltages to the cathodes 12 of the electron guns in such a manner that predetermined sides of the cross sections of the respective electron beams to be incident on the wafer 44 are substantially parallel to each other.

In this example, the base power source 522 generates a voltage of 50 kV. Each of the adjusting power sources 524 increases or lowers the voltage generated by the base power source 522 in accordance with the magnetic-field intensities generated in the lens openings of the multi-axis electron lenses 16, 24, 34, 36 and 62 through which the electron beam generated by the corresponding cathode 12 passes, so that the adjusted voltage is applied to the corresponding cathode 12. In a case where the magnetic-field intensity in the lens opening on the center of the multi-axis electron lens is weaker than that in the outer periphery of the multi-axis electron lens by 3%, for example, the acceleration voltage of the cathode 12 for generating an electron beam that is to pass through the lens opening on the center of the multi-axis electron lens is increased by 3%.

The electron beam controller 80 can adjust a time period for which each of the electron beams passes through the lens opening by controlling the acceleration voltage for the electron beam, even if the intensity of the magnetic field in the lens opening of the multi-axis electron lens is varied. Thus, the electron beam controller 80 can control effects of the magnetic field on the respective electron beams in the lens openings. Also, the electron beam controller 80 can control the focal point positions of the electron beams with respect to the wafer 44 and the rotation of the exposure images of the electron beams to be incident on the wafer 44.

Figure 3:
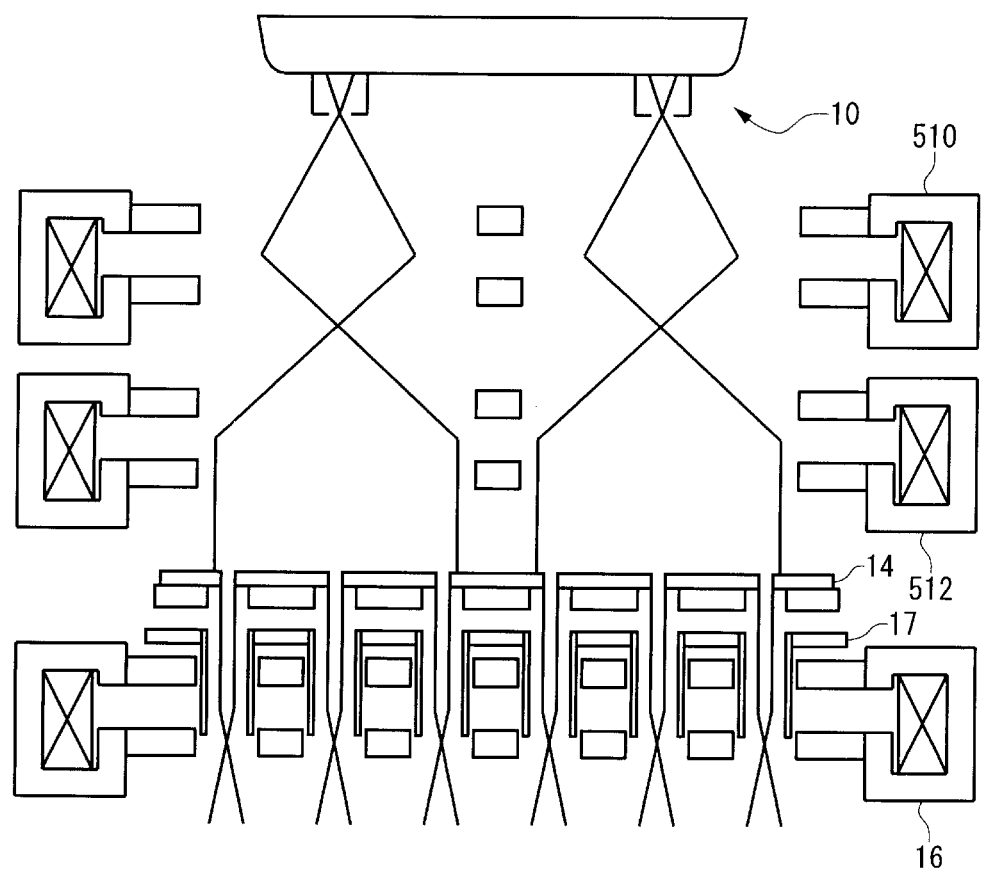
FIG. 3 shows another example of an electron beam shaping unit.

FIG. 3 shows another example of the electron beam shaping unit. The electron beam shaping unit of this example further includes a first illumination multi-axis electron lens 510 and a second illumination multi-axis electron lens 512 for converging the electron beams generated by the electron beam generator 10 independently of each other so as to allow the converged electron beams to be incident on the first shaping member 14. The first and second illumination multi-axis electron lenses 510 and 512 are provided between the electron beam generator 10 and the first shaping member 14.

The number of the lens openings included in each of the first and second illumination multi-axis electron lenses 510 and 512 is preferably less than the number of the lens openings of the first multi-axis electron lens 16. It is also preferable that the opening size of the lens opening of the first and second illumination multi-axis lenses 510 and 512 is larger than that of the first multi-axis lens 16. The number of the lens openings of each of the first and second illumination multi-axis electron lenses 510 and 512 may be the same as the number of the cathodes 12 included in the electron beam generator 10. Moreover, each of the first and second illumination multi-axis electron lenses 510 and 512 may further include at least one dummy lens opening through which no electron beam passes during the exposure process.

The first illumination multi-axis electron lens 510 adjusts the focal point of the electron beams generated at the electron beam generator 10. More specifically, it is preferable that the first illumination multi-axis electron lens 510 adjusts the focal point of each of the electron beams, so that each of the electron beams, which have passed through the first illumination multi-axis electron lens 510, form a cross over between the first and the second illumination multi-axis electron lens 510 and 512. Then, the second illumination multi-axis electron lens 512 performs a further focus adjustment for the electron beam that has been subjected to the focus adjustment in the first illumination multi-axis electron lens 510, so as to make the electron beam incident on the first shaping member 14. In this case, it is preferable that the second illumination multi-axis electron lens 512 adjusts the focal points of the electron beams incident thereon in such a manner that the electron beams after passing through the second illumination multi-axis electron lens 512 are incident on the first shaping member 14 substantially perpendicular thereto.

The electron beams after passing through the first and second illumination multi-axis electron lenses 510 and 512 are incident on the first shaping member 14, in which the electron beams are divided. The respective divided electron beams are independently converged of each other by the first multi-axis electron lens 16. The electron beams are then deflected by the first and second shaping deflecting units 18 and 20, and are incident on the desired positions on the second shaping member 22. The second shaping member 22 shapes the electron beams to have desired cross-sectional shapes. In addition, the electron beam shaping unit may further include the slit cover 11 (shown in FIG. 1) between the electron beam generator 10 and the first shaping member 14.

As described above, the electron beam shaping unit 110 of this example can cast the electron beams generated by the electron beam generator 10 onto the first shaping member 14 by means of the illumination multi-axis electron lenses to divide the cast electron beams. Therefore, even in a case where the interval between the cathodes 12 of the electron beam generator 10 that is an electron gun array is relatively large, for example, a number of electron beams can be generated efficiently. Also, since the interval between the cathodes 12 can be made larger, it is possible to form the electron beam generator 10 easily.

Figure 4:
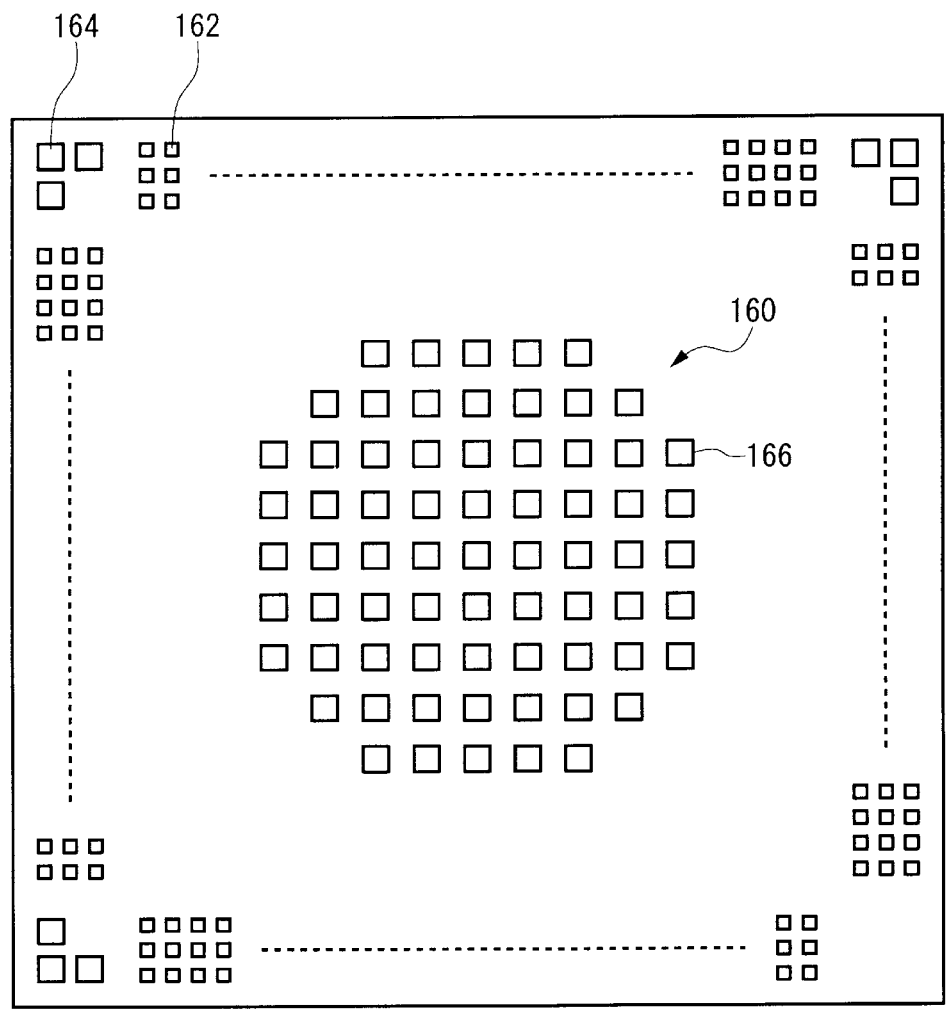
FIG. 4 shows an exemplary structure of a blanking electrode array 26.

FIG. 4 schematically shows an exemplary structure of the blanking electrode array 26. The blanking electrode array 26 includes an aperture part 160 having a plurality of apertures 166 that allow the electron beams passing there-through, respectively, deflecting electrode pads 162 and grounded electrode pads 164 that are to be used as connections with the blanking electrode array controller 86 shown in FIG. 1. It is desirable that the aperture part 160 is arranged at the center of the blanking electrode array 26. It is also preferable that the blanking electrode array 26 has at least one dummy opening through which no electron beam passes in an area surrounding the aperture part 160. When the blanking electrode array 26 has the dummy opening, the inductance of exhaustion can be reduced, thus allowing the pressure in the body 8 to be lowered efficiently.

Figure 5:
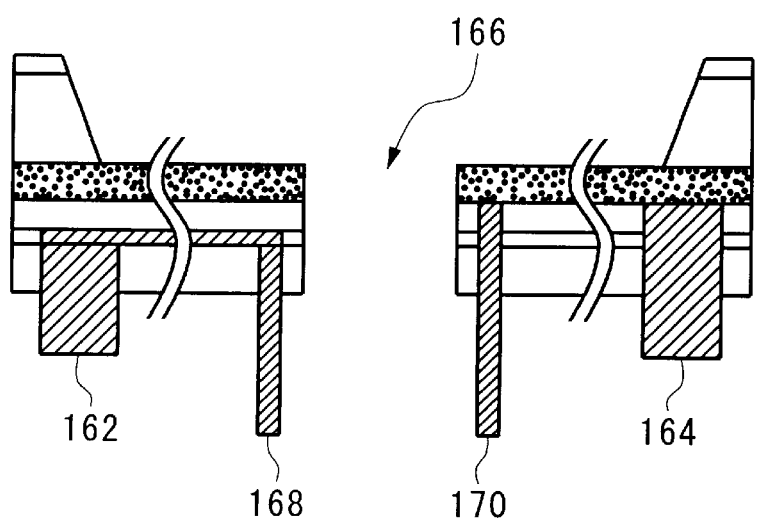
FIG. 5 shows a cross section of the blanking electrode array 26.

FIG. 5 shows a cross section of the blanking electrode array 26 shown in FIG. 4. The blanking electrode array 26 has the apertures 166 each of which can allow the corresponding electron beam to pass there-through, a deflecting electrode 168 and a grounded electrode 170 provided for each aperture that are used for deflecting the passing electron beam, and the deflecting electrode pads 166 and the grounded electrode pads 164 to be use as the connection with the blanking electrode array controller 86 (shown in FIG. 1), as shown in FIG. 5.

The deflecting electrode 168 and the grounded electrode 170 are provided for each aperture 166. The deflecting electrode 168 is electrically connected to the deflecting electrode pad 162 via a wiring layer, while the grounded electrode 170 is electrically connected to the grounded electrode pad 164 via a conductive layer. The blanking electrode array controller 86 supplies control signals for controlling the blanking electrode array 26 to the deflecting electrode pads 162 and the grounded electrode pads 164 via connectors such as a probe card or a pogo pin array.

Next, the operation of the blanking electrode array 26 is described. When the blanking electrode array controller 86 does not apply the voltage to the deflecting electrode 168 of the aperture 166, no electric field is generated between the deflecting electrode 168 and the associated grounded electrode 170. Thus, the electron beam entering the aperture 166 passes through the aperture 166 with no substantial effect of the electric field. The electron beam that has passed through the aperture then passes through the corresponding opening of the electron beam blocking member (shown in FIG. 1) so as to reach the wafer 44.

When the blanking electrode array controller 86 applies the voltage to the deflecting electrode 168 of the aperture 166, an electric field is generated between the deflecting electrode 168 and the associated grounded electrode 170 based on the applied voltage. Thus, the electron beam entering the aperture 166 is affected by the generated electric field so as to be deflected. More specifically, the electron beam is deflected in such a manner that the electron beam after passing through the aperture is incident on the outer area of the corresponding opening of the electron beam blocking member 28. Therefore, the deflected electron beam can pass through the aperture but cannot pass through the corresponding opening of the electron beam blocking member 28, failing to reach the wafer 44. The blanking electrode array 26 and the electron beam blocking member 28 operate in the above-mentioned manner, thereby it can be switched for each electron beam independently of other electron beams whether or not the electron beam is incident on the wafer 44.

Figure 6:
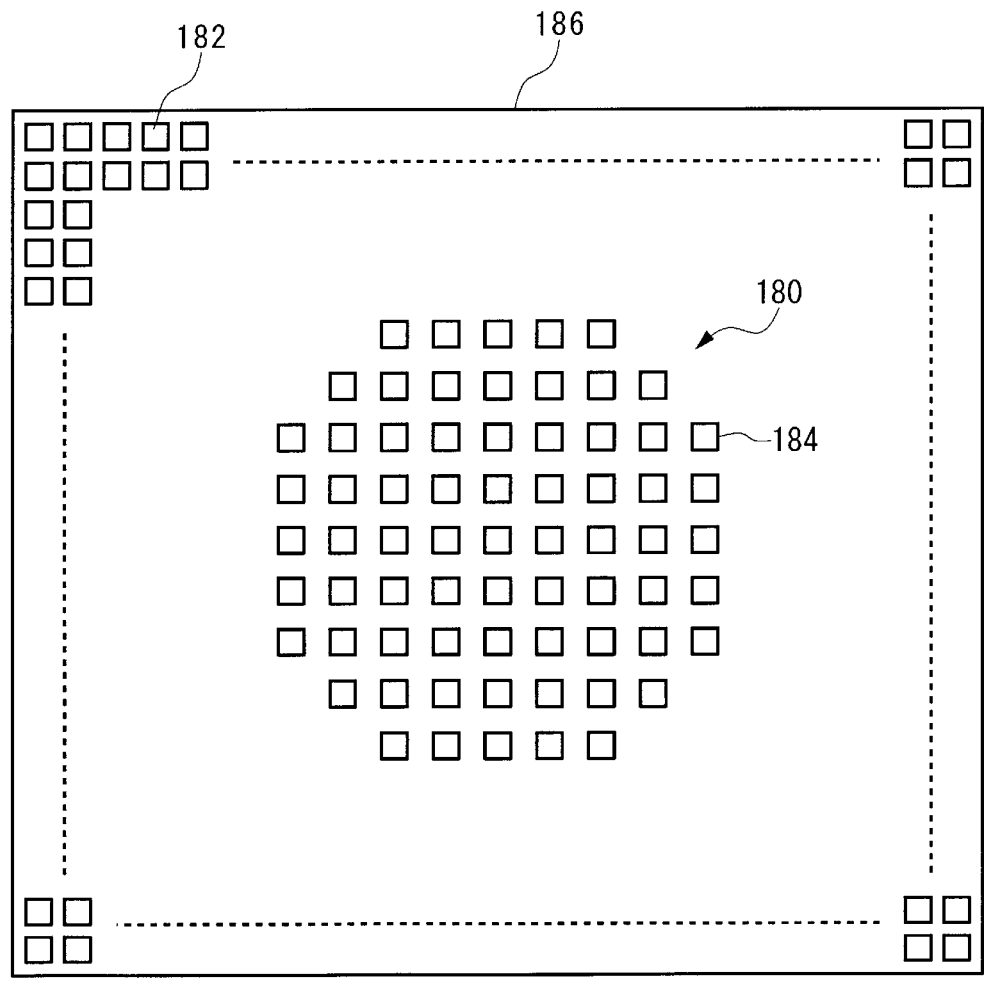
FIG. 6 schematically shows a structure of a first shaping deflecting unit 18.

FIG. 6 schematically shows a structure of the first shaping deflecting unit 18 for deflecting the electron beams. It should be noted that the second shaping deflecting unit 20 and the deflecting unit 60 included in the electron beam exposure apparatus 100 can have the same structure as that of the first shaping deflecting unit 18. Thus, only the structure of the first shaping deflecting unit 18 is described below as a typical example.

The first shaping deflecting unit 18 includes a substrate 186, a deflector array 180 and deflecting electrode pads 182. The deflector array 180 is provided at the center of the substrate 186. The deflecting electrode pads 182 are desirably arranged in peripheral areas of the substrate 186. It is preferable that the substrate 186 has at least one dummy opening (see FIG. 1) through which no electron beam passes in an area surrounding the region where the deflector array 180 is provided.

The deflector array 180 has a plurality of deflectors 184, each of which is formed by deflecting electrodes and an opening. The deflecting electrode pads 182 are electrically connected to the shaping-deflector controller 84 (shown in FIG. 1) via connectors such as a probe card or a pogo pin array. Referring to FIG. 4, the deflectors 184 of the deflector array 180 are provided so as to correspond to the apertures of the blanking electrode array 26, respectively.

Figure 7A:
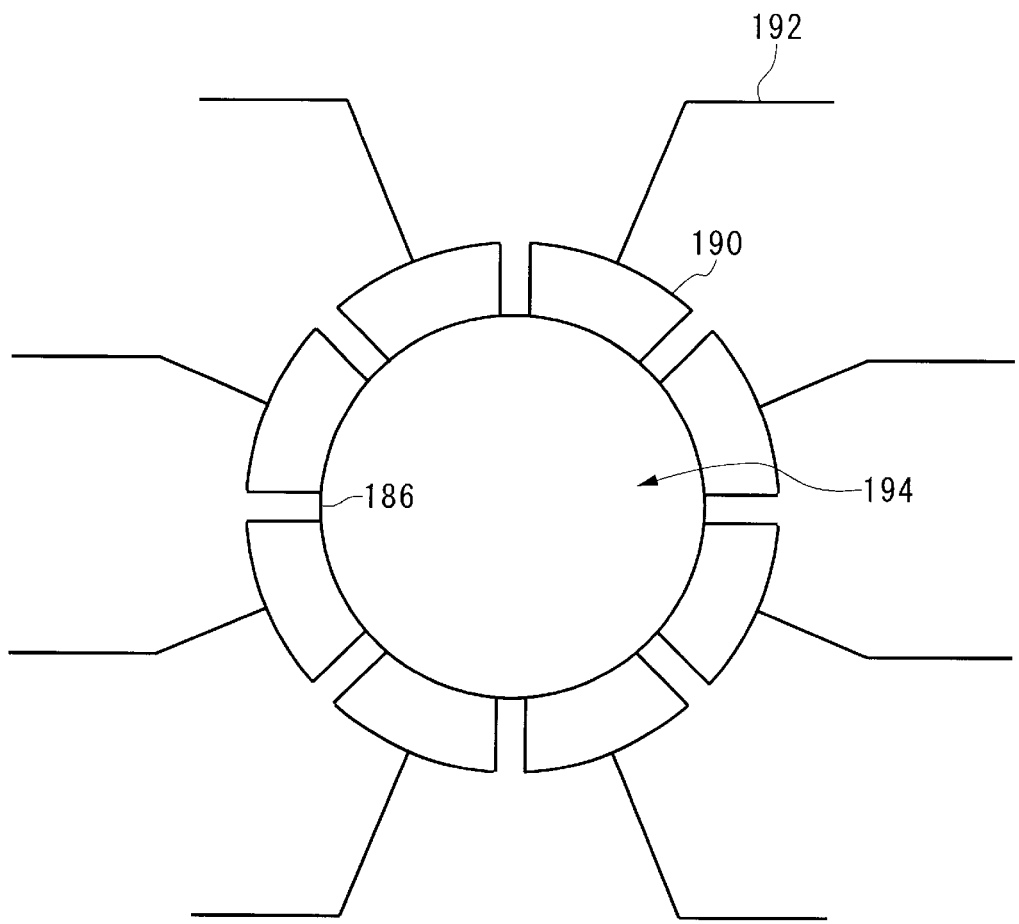
FIGS. 7A, 7B and 7C schematically show an exemplary arrangement of the deflector 184.
Figure 7B:
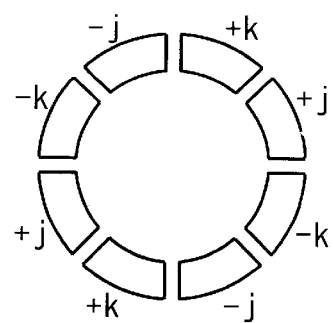
Figure 7C:
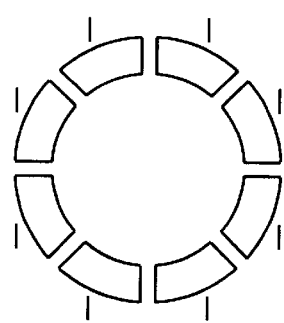

FIGS. 7A, 7B and 7C schematically show an exemplary arrangement of the deflector 184. As shown in FIG. 7A, the deflector 184 includes an opening 194 through which an electron beam can pass, a plurality of deflecting electrodes 190 which can deflect the electron beam pass through the opening 194, and wirings 192 for electrically connecting the deflecting electrodes 190 to the deflecting electrode pads 182 (see FIG. 6), respectively. The deflecting electrodes 190 are provided to surround the opening 194. The deflector 184 is preferably an electrostatic type deflector that can deflect the electron beam at high speed by using an electric field, and is more preferably a cylindrical eight-electrode type having four pairs of electrodes in which the electrodes of each pair are opposed to each other.

The operation of the deflector 184 is described. When a predetermined voltage is applied to each of the deflecting electrodes 190, an electric field is generated in the opening 194. The electron beam incident on the opening 194 is affected by the generated electric field, so as to be deflected in a predetermined direction corresponding to the orientation of the electric field by the amount corresponding to the electric-field intensity. Thus, the electron beam can be deflected to a desired position by applying the voltages to the respective deflecting electrodes 190 so as to generate the electric field that can deflect the electron beam in the desired direction by the desired amount.

As shown in FIG. 7B, the deflector 184 can correct astigmatism for the electron beam passing through the opening 194 by applying a predetermined voltage to predetermined ones of the deflecting electrodes 190 that are opposed to each other and applying different voltages to other deflecting electrodes 190. Moreover, as shown in FIG. 7C, the focus correction can be performed for the electron beam passing through the opening 194 by applying substantially the same voltages to all the deflecting electrodes 190.

Figure 8:
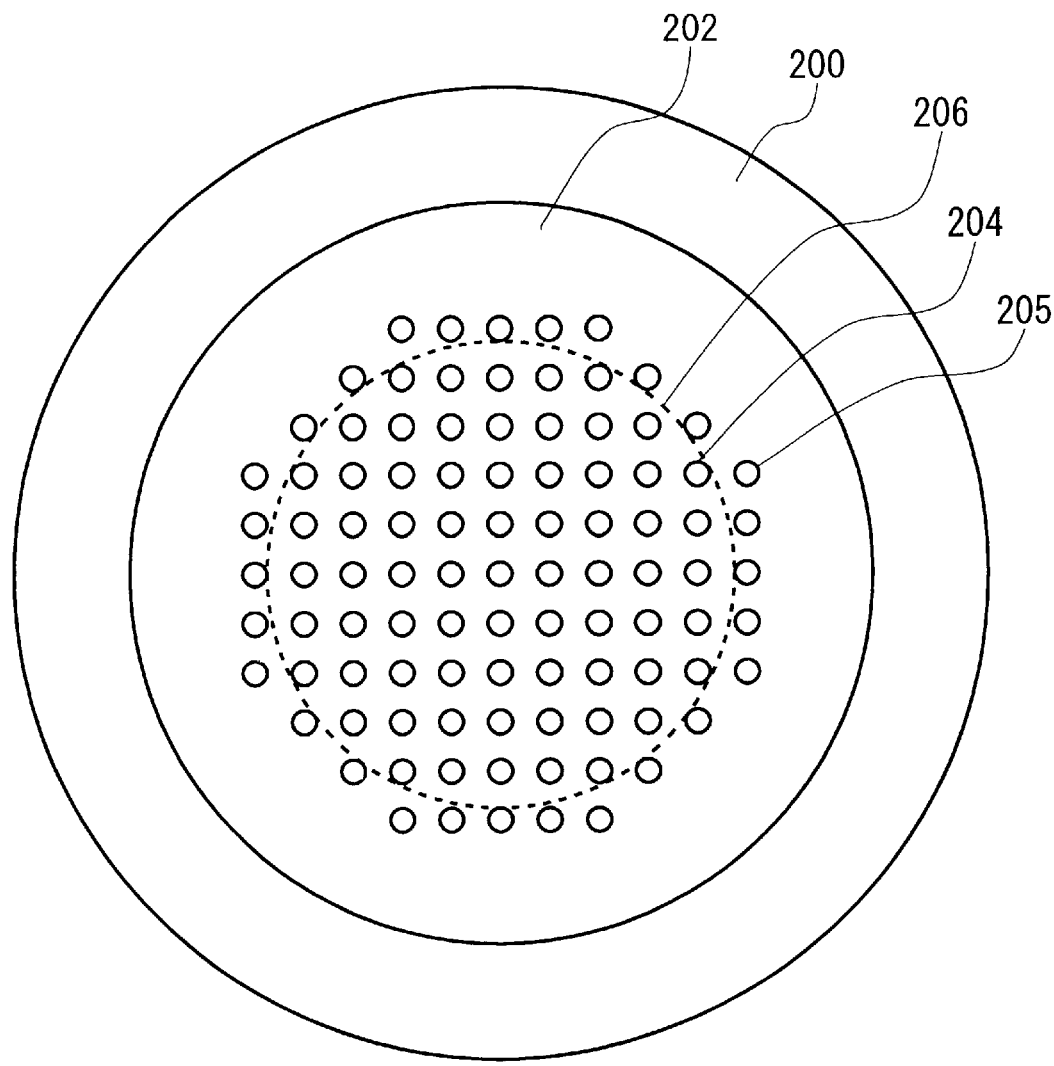
FIG. 8 shows a first multi-axis electron lens 16 that is an electron lens according to an embodiment of the present invention.

FIG. 8 is a top view of the first multi-axis electron lens 16 that is an electron lens according to an embodiment of the present invention. Please note that the second multi-axis electron lens 24, the third multi-axis electron lens 34, the fourth multi-axis electron lens 36 and the fifth multi-axis electron lens 62 all included in the electron beam exposure apparatus 100 have the same structure as that of the first multi-axis electron lens 16. Thus, the structure of the multi-axis electron lens is described referring to the first multi-axis electron lens 16 as a typical example.

The first multi-axis electron lens 16 includes a lens part 202 having a plurality of lens openings 204 through which electron beams can pass, respectively, and a coil part 200 provided in an area surrounding the lens part 202 to generate a magnetic field. The lens part 202 includes a lens region 206 where the lens openings 204 are provided. It is preferable that the lens opening 204 is arranged to correspond to the position of the associated aperture 166 of the blanking electrode array 26 and the position of the associated deflector 184 of the deflector array 180, referring to FIGS. 4 and 6. It is further preferable that each of the lens openings 204 is provided to have substantially the same axis as those of the corresponding openings of the electron beam shaping members, the deflecting units and the blanking electrode array 26.

It is desirable that the lens part 202 has at least one dummy opening 205 through which no electron beam passes. The dummy opening 205 is desirably arranged in the lens part 202 so as to make the lens intensity in each lens opening 204 substantially equal to the lens intensity in the other lens opening 204. Such dummy openings 205 provided in the lens part 202 enable the adjustment of the lens intensity so as to be substantially equal in all the lens openings 204, i.e., to make the magnetic field intensity substantially uniform at all the lens openings 204.

In this example, the dummy openings 205 are provided in the outer region of the lens region 206. In this case, the lens openings 204 and the dummy openings 205 may be provided to form a lattice including the lens openings 204 and the dummy openings 205 as lattice points. Moreover, the dummy openings 205 may be arranged to be circular in the outer periphery of the lens region 206. In an alternative example, the dummy openings 205 maybe arranged inside of the lens region 206 in the lens part 206. By adjusting the arrangement of the dummy openings 205, the lens intensity in each lens opening 204 can be more finely adjusted.

The lens part 202 may include the dummy opening 205 having different sizes and/or shapes from those of the lens openings 204. In this case, the lens intensities in the lens openings 204 can be more finely adjusted by adjusting the sizes and/or shapes of the dummy openings 205.

Figure 9:
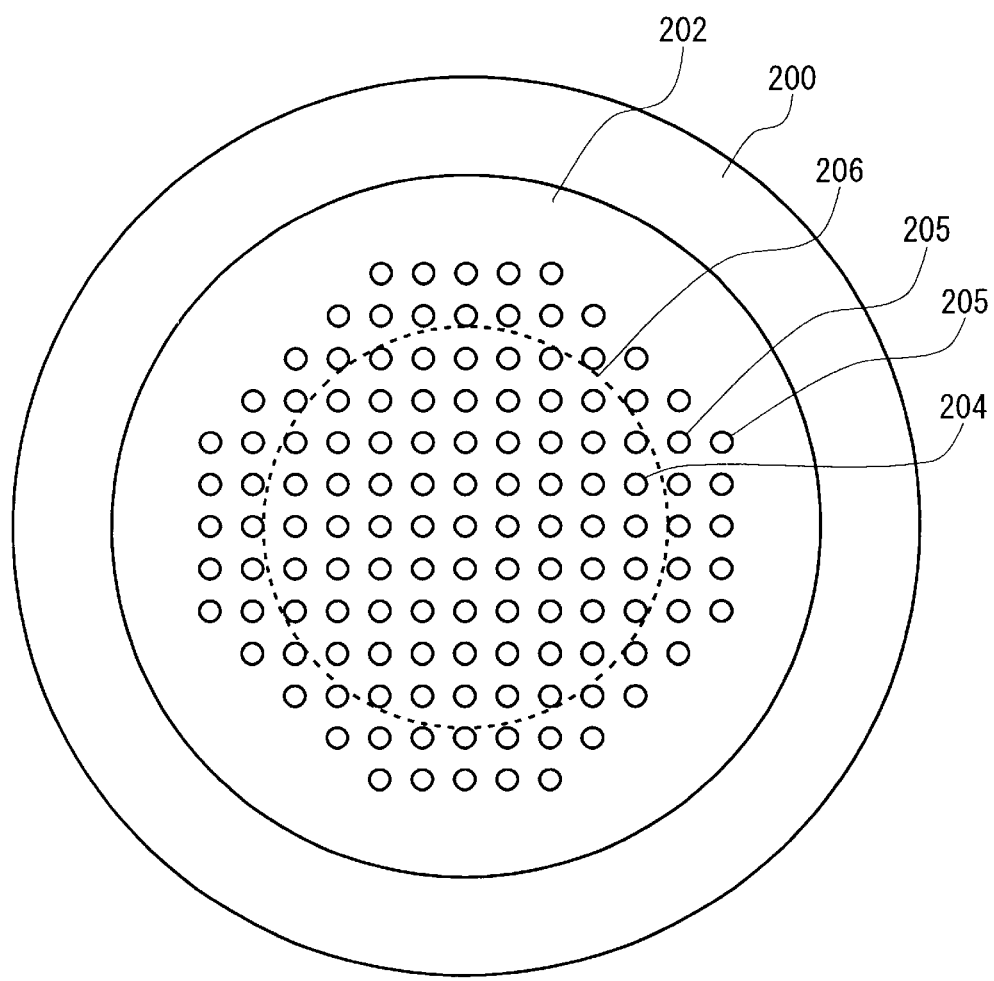
FIG. 9 shows another exemplary first multi-axis electron lens 16.

FIG. 9 is a top view of another exemplary first multi-axis electron lens 16. The lens part 202 may include the dummy openings 205 arranged to multiple plies. In this case, the lens openings 204 and the dummy openings 205 may be arranged to form a lattice including the lens openings 204 and the dummy openings 205 as lattice points. Moreover, the dummy openings 205 may be provided to form a circle in the outer peripheral region of the lens region 206. Furthermore, the lens part 202 may include the dummy openings 205 in the outer peripheral region of the lens region 206, some of which are arranged to form a lattice while the remaining ones are arranged to be circular. The first multi-axis electron lens 16 can perform further fine adjustment of the lens intensity in each lens opening 204 by including the dummy openings 205 arranged to be multiple plies.

Figure 10:
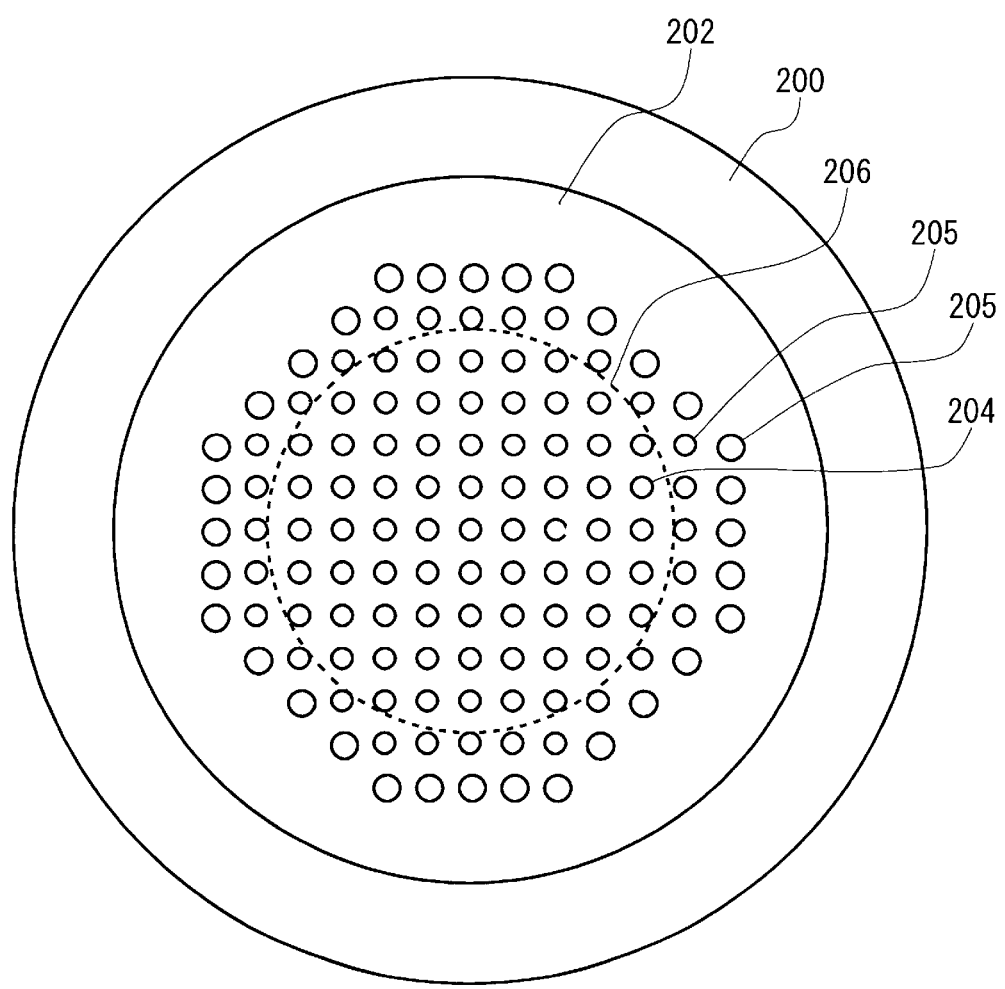
FIG. 10 shows another exemplary first multi-axis electron lens 16.

FIG. 10 shows another exemplary first multi-axis electron lens 16. The lens part 202 may include a plurality of dummy openings 205 having different opening sizes in the outer peripheral region of the lens region 206. For example, in a case where the magnetic field generated in the lens opening 204 in the outer peripheral region of the lens region 206 is stronger than that at the center thereof, it is preferable that a particular lens opening 204 is formed to have a larger opening size than that of other lens openings 204 positioned on the inner side of the predetermined lens opening 204. It is also preferable that the opening sizes of the lens openings 204 are substantially symmetrical with respect to a center axis of the lens region 206 where the lens openings 204 are provided.

The lens part 202 may include the dummy openings 205 having different opening sizes to be multiple plies in the outer peripheral region of the lens region 206. In this case, the lens openings 204 and the dummy openings 205 may be arranged to form a lattice. Also, the dummy openings 205 may be formed to be circular in the outer peripheral region of the lens region 206. The first multi-axis electron lens 16 can perform further fine adjustment of the lens intensity in each lens opening 204 by including the dummy openings 205 having the different opening sizes arranged to be multiple plies.

Figure 11:
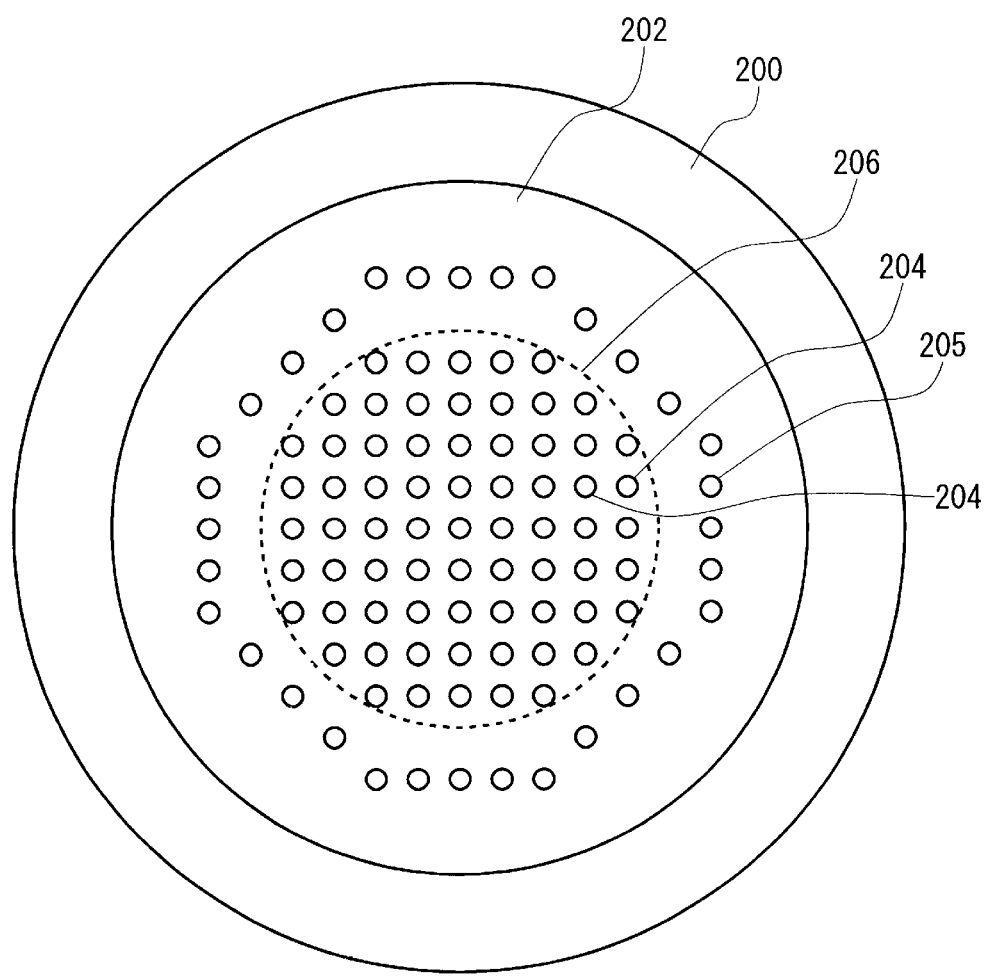
FIG. 11 shows another exemplary first multi-axis electron lens 16.

FIG. 11 shows another exemplary first multi-axis electron lens 16. As shown in FIG. 11, the lens part 202 may include the dummy lens openings 205 arranged in such a manner that a distance between the dummy opening 205 and the adjacent lens opening 204 is different from a distance between the lens openings 204. Also, the lens part 202 may include the dummy openings 205 arranged to be multiple plies at different intervals there-between. The first multi-axis electron lens 16 can perform further fine adjustment of the lens intensity in each lens opening 204 by including the dummy openings 205 having the appropriately adjusted distances to the adjacent lens openings 204.

Figure 12A:
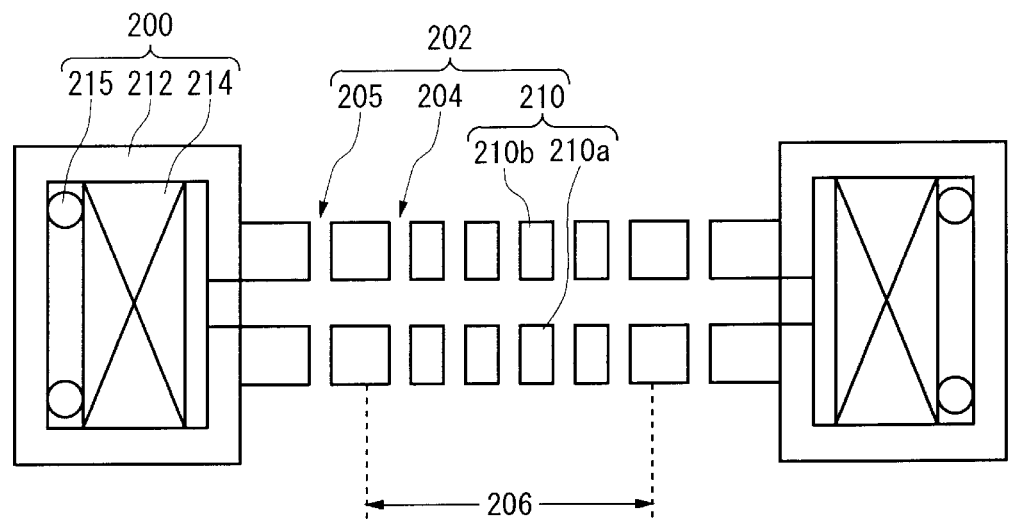
FIGS. 12A and 12B show examples of the cross section of the first multi-axis electron lens 16.

FIG. 12A shows an exemplary cross section of the first multi-axis electron lens 16. Please note that the second multi-axis electron lens 24, the third multi-axis electron lens 34, the fourth multi-axis electron lens 36 and the fifth multi-axis electron lens 62 may have the same structure as that of the first multi-axis electron lens 16. Thus, the structure of the multi-axis electron lens is described below based on that of the first multi-axis electron lens 16 as a typical example.

As shown in FIG. 12A, the first multi-axis electron lens 16 includes coils 214, coil-magnetic conductive members 212 provided in areas surrounding the coils 214 and cooling units 215 provided between the coils 214 and the coil-magnetic conductive members 212 that can cool the coils 214. The lens part 202 includes a lens-magnetic conductive member 210 that is a magnetic conductive member and a plurality of openings provided in the lens-magnetic conductive member 210. These openings serve as the lens openings 204 allowing the electron beams to pass there-through.

In this example, the lens-conductive member 210 includes a first lens-magnetic conductive member 210a and a second lens-magnetic conductive member 210b, both of which have a plurality of openings. It is preferable that the first lens-magnetic conductive member 210a and the second lens-magnetic conductive member 210b are arranged to be substantially parallel to each other with a non-magnetic conductive member 208 interposed there-between. The openings provided in the first and second lens-magnetic conductive members 210a and 210b form the lens openings 204. In other words, the magnetic field is generated in the lens openings 204 by the first and second lens-magnetic conductive members 210a and 210b. The electron beams entering the lens openings 204 are converged independently of each other by the effects of the magnetic field between the lens-magnetic conductive members 210a and 210b without forming a crossover.

The coil magnetic conductive members 212 may be formed from magnetic conductive material having a magnetic permeability different from that of material for the first and second lens magnetic conductive members 210a and 210b. It is desirable that the material for the coil magnetic conductive member 212 has magnetic permeability higher than that of the material for the lens magnetic conductive members 210a and 210b. For example, the coil magnetic conductive members 212 are formed of malleable iron while the lens magnetic conductive members 210 are formed of Permalloy. By forming the coil magnetic conductive members from the material different from that for the lens magnetic conductive members, the intensities of the magnetic fields generated in the lens openings 204 can be made uniform.

Figure 12B:
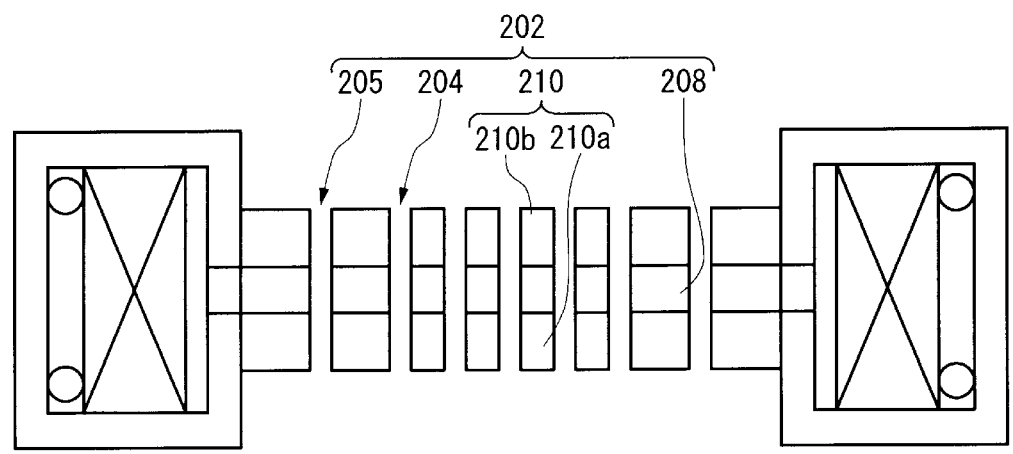

As shown in FIG. 12B, it is preferable that the lens part 202 has a non-magnetic conductive member 208 between the lens magnetic conductive members 210 in the areas other than the areas in which the lens openings 204 are provided. The non-magnetic conductive member 208 may be provided to fill a space between the lens magnetic conductive members 210 in the areas other than the areas in which the lens openings 204 are provided. In this case, the non-magnetic member 208 has through holes that form the lens openings 204 together with the openings of the lens magnetic conductive members 210. The non-magnetic conductive member 208 has a function of blocking the coulomb force generated between the adjacent electron beams passing through the lens openings 204. The non-magnetic conductive member 208 also serves as a spacer between the first lens magnetic conductive member 210a and the second lens magnetic conductive member 210b when the lens part 202 is formed.

Figure 13:
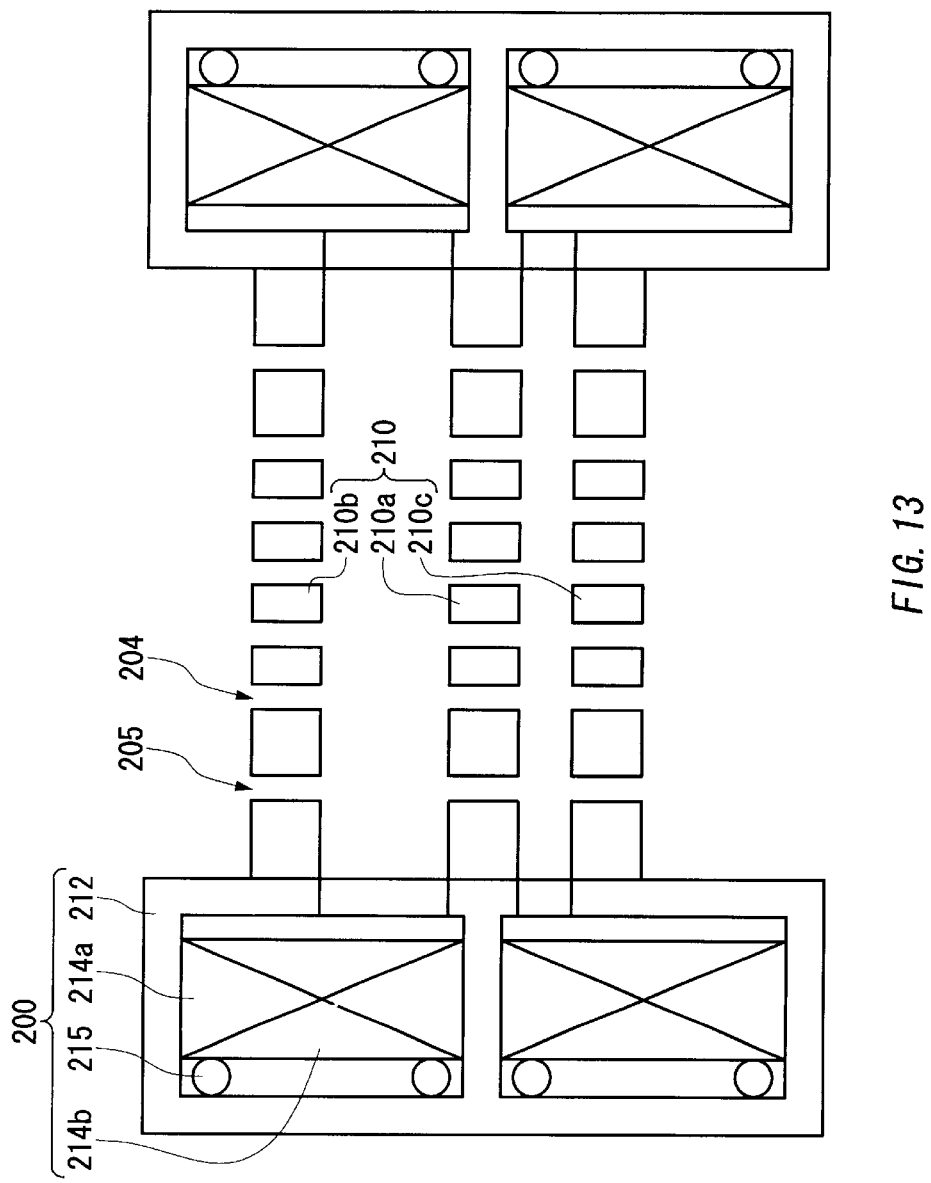
FIG. 13 shows another exemplary multi-axis electron lens.

FIG. 13 shows another exemplary multi-axis electron lens. A plurality of multi-axis electron lens may be integrated with each other to form a single multi-axis electron lens. In this example, the multi-axis electron lens includes the first and second magnetic conductive members 210a and 210b, and further includes the third magnetic conductive members 210c arranged to be substantially parallel to the first and second magnetic conductive members 210a and 210b, as shown in FIG. 13. Moreover, the coil part 200 includes a plurality of coils 200.

The openings provided in the respective magnetic conductive members 210a, 210b and 210c form the lens openings 204. The magnetic fields are formed between the first and second magnetic conductive members 210a and 210b and between the first and third magnetic conductive members 210a and 210c. When the magnetic conductive members 210b and 210c are arranged to be away from the conductive member 210a by different distances, the different lens intensities can be obtained between the respective lens magnetic conductive members 210a, 210b and 210c. As described above, the multi-axis electron lens of this example is formed by integrating a plurality of multi-axis electron lenses together. Thus, the size of the lens serving as a plurality of multi-axis electron lenses can be reduced. Also, this size reduction of the lens can reduce the size of the electron beam exposure apparatus 100.

Figure 14A:
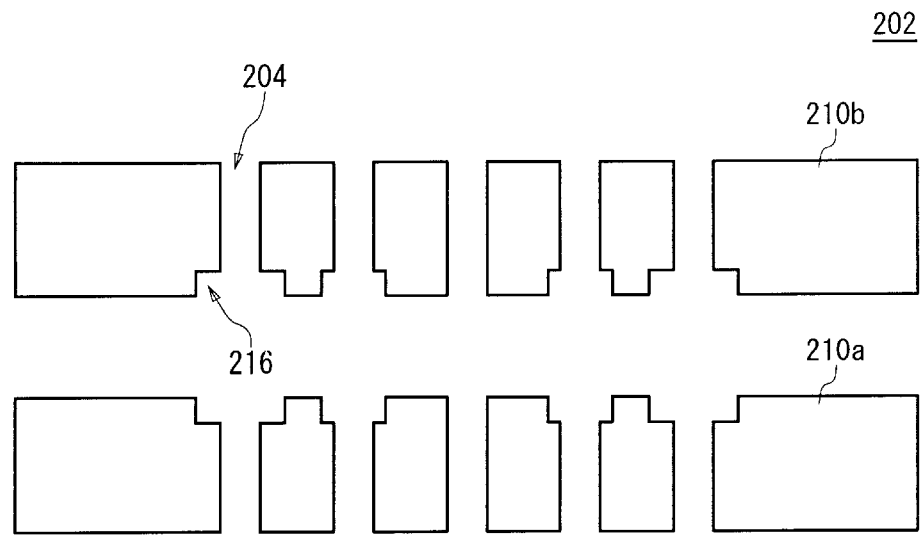
FIGS. 14A and 14B show other examples of the lens part 200.
Figure 14B:
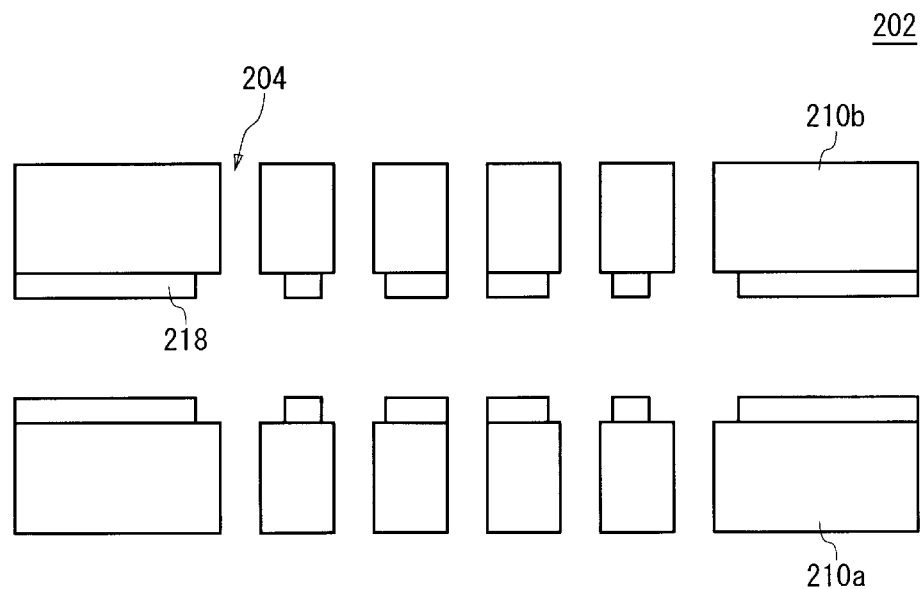

FIGS. 14A and 14B show other examples of the lens part 200. At least one of the lens magnetic conductive members 210a and 210b may include at least one cut portion 216 formed in the outer periphery of each opening, as shown in FIG. 14A. In this case, it is preferable to form the cut portions 216 on a face of the first lens magnetic conductive member 210a and a face of the second lens magnetic conductive member 210b that are opposed to each other.

Moreover, the lens magnetic conductive members 210a and 210b preferably include the cut portions 216 having different dimensions. More specifically, the depths of the cut portions 216 in a depth direction of the lens magnetic conductive members 210a and 210b may be different. Also, the sizes of the cut portions 216 may be changed to make the sizes of the openings provided in the lens magnetic conductive members 210a and 210b different.

In a case where the intensity of the magnetic field generated in the lens opening 204 in the vicinity of the outer periphery of the lens magnetic conductive members 210 is stronger than that at the center of the lens magnetic conductive members 210, for example, it is preferable to make the dimension of a certain cut portion 216 larger than that of the cut portion 216 arranged on the inner side of the certain cut portion 216. Moreover, it is preferable that the dimensions of the cut portions 216 are determined to be symmetrical with respect to the center axis of the lens region 206 that is a region of the lens magnetic conductive members 210 in which the lens openings 204 are provided.

The lens magnetic conductive members 210 can adjust the intensities of the magnetic fields generated in the lens openings 204 by including the cut portions 216. Alternatively, as shown in FIG. 14B, the lens magnetic conductive members 210 may include magnetic projections 218 having electro-conductivity provided between adjacent openings of the lens magnetic conductive members 210 so as to project from surfaces of the lens magnetic conductive members 210 that are opposed to each other. In this case, the same effects obtained in the case of including the cut portions 216 can be obtained.

Figure 15A:
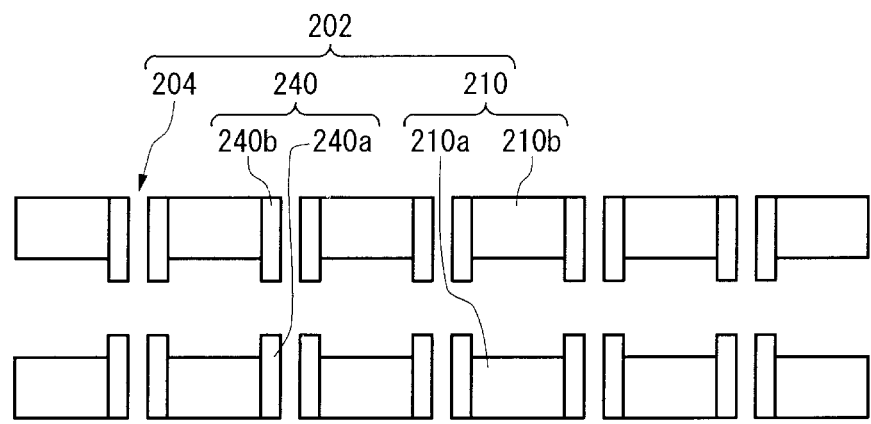
FIGS. 15A and 15B show another example of the lens part 202.
Figure 15B:
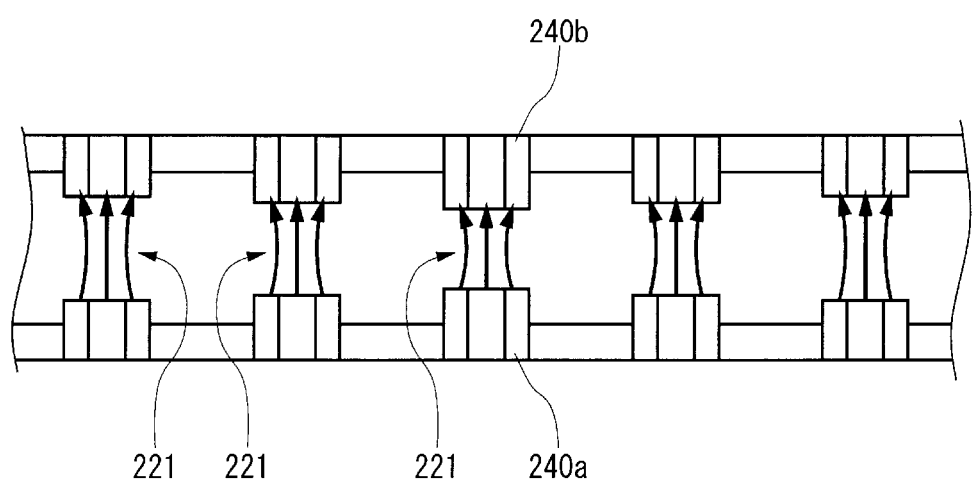

FIGS. 15A and 15B show another example of the lens part 202. As shown in FIG. 15A, the lens part 202 includes a plurality of first sub-magnetic conductive members 240a provided in areas surrounding the openings of the first lens magnetic conductive member 210a and a plurality of second sub-magnetic conductive members 240b provided in areas surroundings the openings of the second lens magnetic conductive member 210b. The first sub-magnetic conductive members 240a and the second sub-magnetic conductive members 240b are formed to project from the respective lens magnetic conductive members 210a and 210b, respectively, along the direction in which the electron beams are emitted.

It is preferable that the first and second sub-magnetic conductive members 240a and 240b are cylindrical in a plane substantially perpendicular to the direction in which the electron beams are emitted. In this example, the first sub-magnetic conductive members 240a are arranged in the inner faces of the openings of the first lens magnetic conductive members 210a while the second sub-magnetic conductive members 240b are arranged in the inner faces of the openings of the second lens magnetic conductive members 210b. The openings formed by the first sub-magnetic conductive members 240a and the openings formed by the second sub-magnetic conductive members 240b together form the lens openings 204 allowing the electron beams to pass there-through.

In the lens openings 204, magnetic fields are generated by the first and second sub-magnetic conductive members 240a and 240b. The electron beams entering the lens openings 204 are converged independently of each other by effects of the magnetic fields formed between the first and second sub-magnetic conductive members 240a and 240b.

A distance between a particular one of the first sub-magnetic conductive members 240a and the second sub-magnetic conductive member 240b opposed to the particular first sub-magnetic conductive member 240a may be different from the distance between another first sub-magnetic conductive member 240a and the corresponding second sub-magnetic conductive member 240b. In a case where the lens part 202 includes a plurality of pairs of the first and second sub-magnetic conductive members 240a and 240b, the distance between the first and second sub-magnetic conductive members 240a and 240b in one pair being different from that in another pair, as shown in FIG. 15B, the intensity of the magnetic field 220 generated in each lens opening 204 can be adjusted. Thus, it is possible to make the intensities of the magnetic fields in the respective lens openings 204 uniform. Moreover, the lens axis formed in each lens opening 204 can be made substantially parallel to the direction in which the electron beams are emitted. Furthermore, the electron beams passing through the respective lens openings 204 can be converged on substantially the same plane.

More specifically, in a case where the intensity of the magnetic field formed in the lens opening 204 in the vicinity of the outer periphery of the lens magnetic conductive member 210 is stronger than that at the center of the lens magnetic conductive member 210, for example, it is preferable that the distance between the first and second sub-magnetic conductive member 240a and 240b in a particular pair is larger than the distance between the first and second sub-magnetic conductive members 240a and 240b in the other pair farther from the coil 200 than the particular pair. Furthermore, it is preferable to determine the distances between the first and second sub-magnetic conductive members 240a and 240b to be symmetrical with respect to a center axis of a region of the second magnetic conductive member 210b where the openings are provided.

Figure 16A:
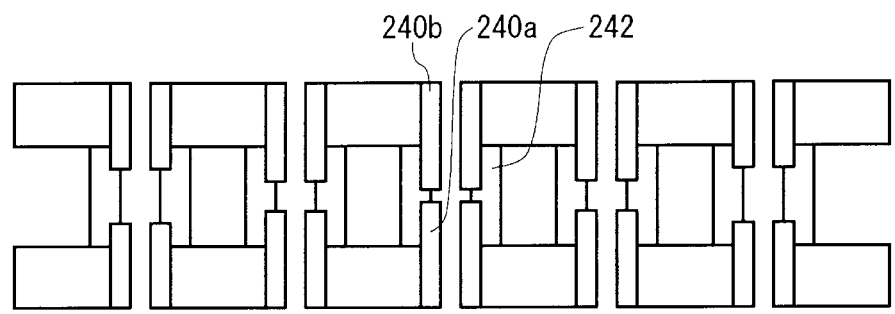
FIGS. 16A, 16B and 16C shows other examples of the lens part 202.
Figure 16B:
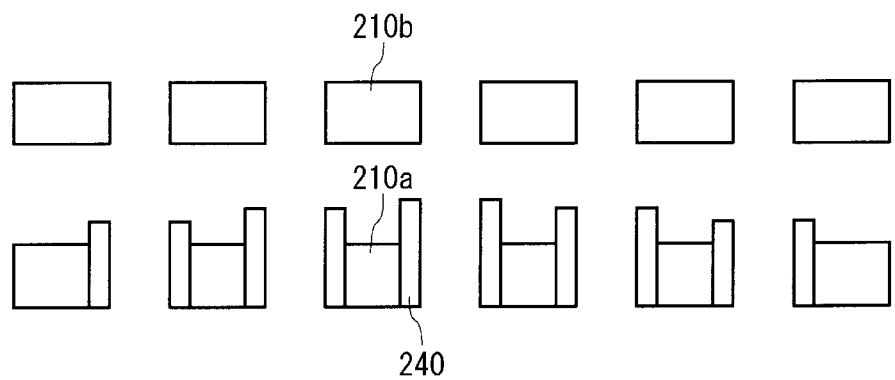
Figure 16C:
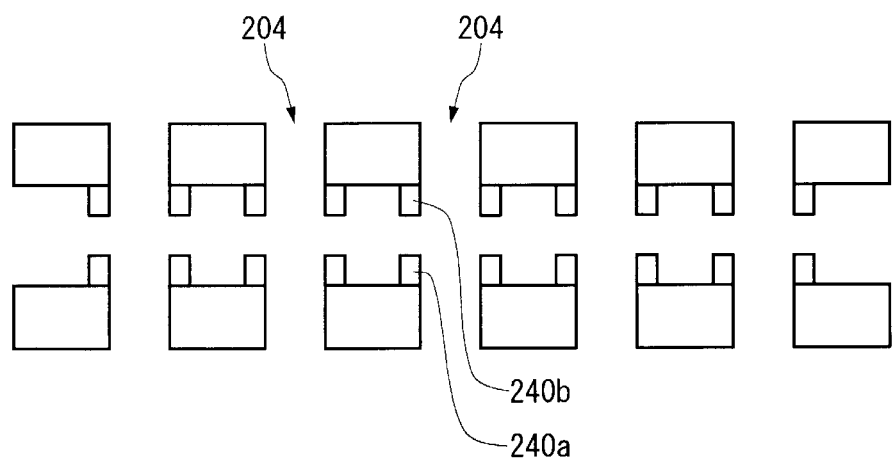

FIGS. 16A, 16B and 16C show other examples of the lens part 202. As shown in FIG. 16A, the lens part 202 may include fixing parts 242 that are non-magnetic conductive members provided in areas surrounding the first sub-magnetic conductive members 240a and the second sub-magnetic conductive members 240b arranged on substantially the same axes as the first sub-magnetic conductive members 240a. By providing the fixing parts 242 in the surrounding areas of the first and second sub-magnetic conductive members 240a and 240b, the concentricity of the first and second sub-magnetic conductive members 240a and 240b can be controlled with high precision. Moreover, it is desirable to arrange the fixing parts 242 so as to be sandwiched between the first and second sub-magnetic conductive members 240a and 240b while being in contact with the first and second sub-magnetic conductive members 240a and 240b. In this case, the distance between the first sub-magnetic conductive member 240a and the corresponding second sub-magnetic conductive member 240b can be controlled with high precision. Furthermore, the fixing part 242 may be provided to be sandwiched between the first magnetic conductive member 210a and the corresponding second magnetic conductive member 210b while being in contact with the first and second magnetic conductive members 210a and 210b. In this case, the fixing part 242 can serve as a spacer for the first and second magnetic conductive members 210a and 210b.

As shown in FIG. 16B, a plurality of sub-magnetic conductive members 240 may be provided on either one of the first and second lens magnetic conductive members 210a and 210b. FIG. 16B shows a case where only the first lens magnetic conductive member 210a includes the sub-magnetic conductive members 240 as an example. In this case, the openings provided in the second lens magnetic conductive member 210b and the openings formed by the sub-magnetic conductive members 240 provided in the first lens magnetic conductive member 210a together form the lens openings 204 allowing the electron beams passing there-through. Moreover, it is preferable that the openings provided in the second lens magnetic conductive member 210b have substantially the same sizes as those of the openings formed by the sub-magnetic conductive members 240 provided in the first lens magnetic conductive member 210a. Please note the above description is also applicable to a case where only the second lens magnetic conductive member 210b includes the sub-magnetic conductive members 240.

In addition, the distances between the sub-magnetic conductive members 240 and the corresponding second lens magnetic conductive members 210b may be varied, as shown in FIG. 16B. By varying the distances between the sub-magnetic conductive members 240 and the second lens magnetic conductive members 210b, it is possible to adjust the intensities of the magnetic fields formed in the respective lens openings 204. Thus, the intensities of the magnetic fields of the lens openings 204 can be made uniform. Moreover, the magnetic field formed in each lens opening 204 can have a distribution substantially symmetrical with respect to the center axis of the lens opening 204. Furthermore, the electron beams passing through the respective lens openings 204 can be converged on substantially the same plane.

In a case where the intensity of the magnetic field formed in the lens opening 204 is stronger in the vicinity of the outer periphery of the lens magnetic conductive members 210 than that at the center thereof, for example, it is preferable to make the distance between a particular sub-magnetic conductive member 240 and the corresponding second lens magnetic conductive member 210b larger than the distance between the sub-magnetic conductive member 240 that is farther from the coil 200 than the particular sub-magnetic conductive member 240 and the corresponding second magnetic conductive member 210b. Furthermore, it is preferable to determine the distances between the sub-magnetic conductive members 240 and the second lens magnetic conductive members 210b respectively corresponding thereto so as to be substantially symmetrical with respect to the center axis of the region where the lens openings 204 are provided.

As shown in FIG. 16C, the first sub-magnetic conductive members 240a may be provided on a face of the first lens magnetic conductive member 210a that is opposed to the second lens magnetic conductive member 210b, while the second sub-magnetic conductive members 240b are provided on a face of the second lens magnetic conductive member 210b that is opposed to the first lens magnetic member 210a. In this case, it is preferable that each opening formed by the first and second sub-magnetic conductive members 240a and 240b are substantially the same as the corresponding openings in the first and second lens magnetic conductive member 210a and 210b.

Figure 17A:
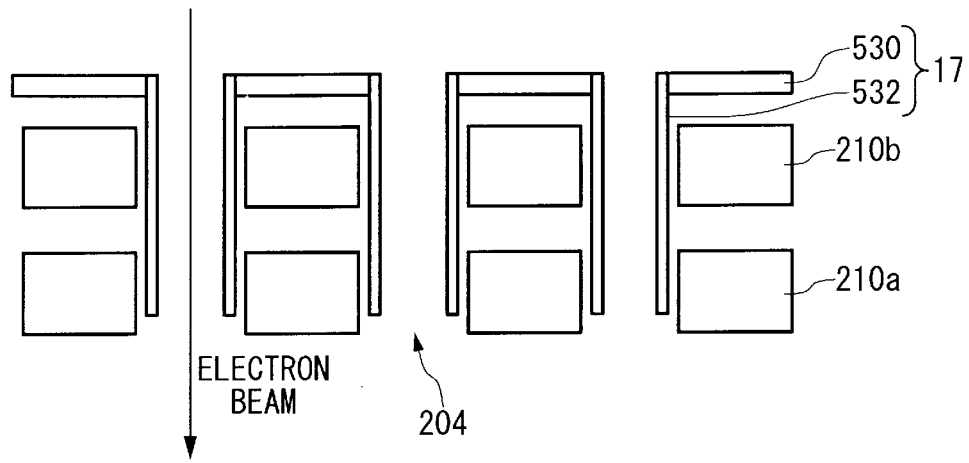
FIGS. 17A and 17B show an example of a lens-intensity adjuster for adjusting the lens intensity of the multi-axis electron lens.
Figure 17B:
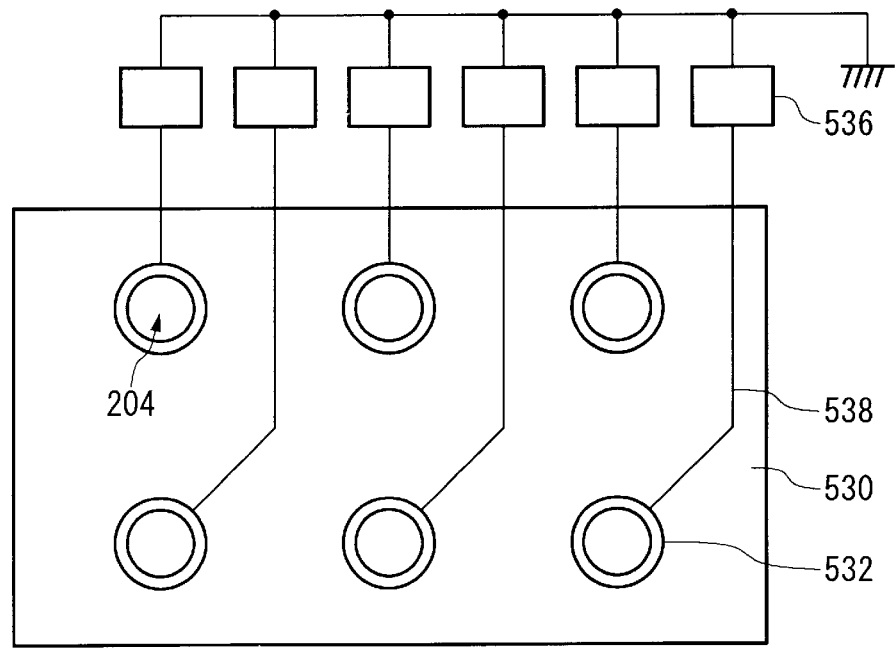

FIGS. 17A and 17B show an example of the lens-intensity adjuster that can adjust the lens intensity of the multi-axis electron lens. The first, second, third and fourth lens-intensity controllers 17, 25, 35 and 37 may have the same structure and functions. The first lens-intensity adjuster 17 is described as a typical example in the following description.

FIG. 17A is a cross-sectional view of the first lens-intensity adjuster 17 and the lens part 202 included in the multi-axis electron lens. The first lens-intensity adjuster 17 includes a substrate 530 arranged substantially parallel to the multi-axis electron lens and adjusting electrodes 532 provided on the substrate 530. The adjusting electrodes 532 are an example of a lens-intensity adjuster for adjusting the lens intensity of the multi-axis electron lens.

The first lens-intensity adjuster 17 generates a desired electric field by applying a predetermined voltage to the adjusting electrode 532, so that the speed of the electron beam that is to enter the lens opening 204 can be increased or reduced. The electron beam entering the lens opening 204 after the speed thereof has been reduced requires a longer time period for passing through the lens opening 204, as compared to the electron beam entering the lens opening 204 without being decelerated. In other words, the lens intensity applied by the magnetic field formed in the lens opening 204 to the electron beam incident thereon can be adjusted. Therefore, since the electron beam has been affected by the magnetic field formed in the lens opening 204 by the first and second lens magnetic conductive members 210a and 210b for a longer time period than the electron beam entering the lens opening 204 without being decelerated or the electron beam incident on the other lens opening 204, the position of the focal point of the electron beam and the rotation of the exposed image of the electron beam can be adjusted. When the adjusting electrode 532 is provided for each lens opening 204, the adjustment of the position of the focal point, the adjustment of the rotation of the exposed image or the like can be performed for each electron beam independently of other electron beams.

It is desirable to provide the adjusting electrodes 532 to be electrically insulated from the lens magnetic conductive members 210a and 210b from the substrate 530 to the lens opening 204. In this example, the adjusting electrodes 532 are cylindrical electrodes each of which is provided to surround the electron beam passing thorough the lens opening 204. In addition, in this example, the substrate 530 is arranged between the multi-axis electron lens and the electron beam generator 10 that generates the electron beams, so as to be opposed to the second lens magnetic conductive member 210b. The length of the adjusting electrode 532 in a direction along the direction in which the electron beams are emitted is set to be longer than the inner diameter of the adjusting electrode 532. Also, the substrate 530 is provided to project from the first lens magnetic conductive member 210a that is different from the second lens magnetic conductive member 210b towards the direction in which the electron beams are emitted. In an alternative example, the substrate 530 may be provided between the multi-axis electron lens and the wafer 44 to be opposed to the first lens magnetic conductive member 210a.

FIG. 17B is a top view of a surface of the first lens-intensity adjuster 17 on which the adjusting electrodes 532 are provided. The first lens-intensity adjuster 17 further includes an adjusting electrode controller 536 that can apply desired voltages to the adjusting electrodes 532. It is desirable that the adjusting electrodes 532 are electrically connected to the adjusting electrode controller 536 via wirings 538 provided on the substrate 530. Moreover, it is preferable that the first lens-intensity adjuster 17 includes a plurality of adjusting electrode controllers 536 for applying the adjusting electrodes 532, respectively. The adjusting electrodes 532 may have a multi-electrode structure in which the electrodes can form an electric field in a direction substantially perpendicular to the direction in which the electron beams are emitted. For example, the adjusting electrode 532 has eight electrodes opposed to each other, as shown in FIG. 8A. In this case, it is preferable that the first lens-intensity adjuster 17 further includes a means operable to apply different voltages to the respective electrodes included in the multi-electrode structure of the adjusting electrode 532. By applying the different voltages to the respective electrodes of the adjusting electrode 532, astigmatism correction and/or deflection of the electron beam can be realized. Furthermore, a shift of the focal point caused by the deflected position and/or the cross-sectional size of the electron beam can be corrected.

Figure 18A:
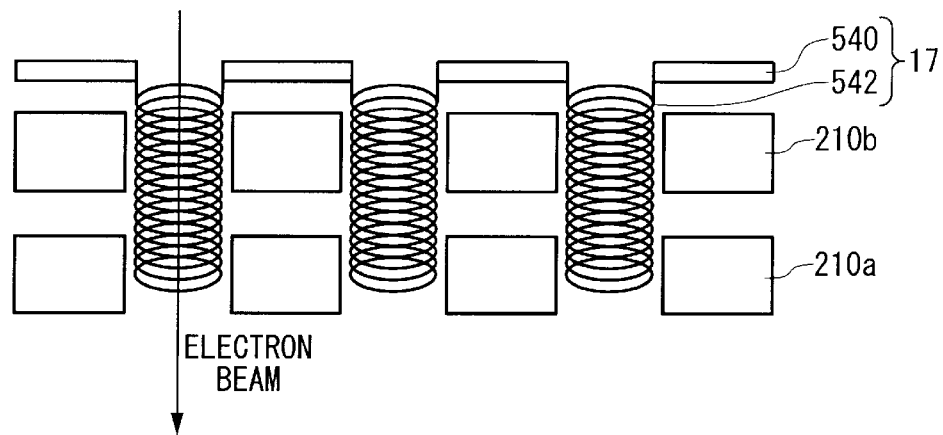
FIGS. 18A and 18B show another exemplary lens-intensity adjuster.
Figure 18B:
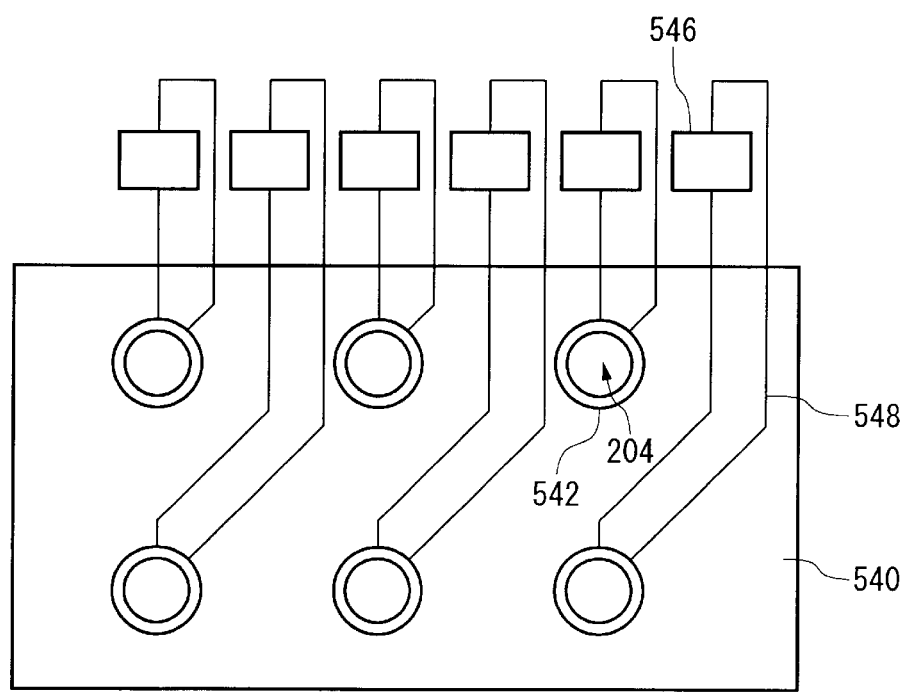

FIGS. 18A and 18B show another exemplary lens-intensity adjuster that can adjust the lens intensity of the multi-axis electron lens. FIG. 18A is a cross-sectional view of the first lens-intensity adjuster 17 and the lens part 202 of the multi-axis electron lens. The first lens-intensity adjuster 17 includes a substrate 540 arranged substantially parallel to the multi-axis electron lens and adjusting coils 542 provided on the substrate 540 as an example of the lens-intensity adjuster for adjusting the lens intensity of the multi-axis electron lens. The first lens-intensity adjuster 17 generates desired electric fields by supplying predetermined currents to the adjusting electrodes 542, thereby making it possible to adjust the intensities of the magnetic fields formed in the lens openings 204 by the first and second lens magnetic conductive members 210a and 210b. Thus, the lens intensity applied to the electron beam incident on the lens opening 204 by the magnetic field formed in that lens opening 204 can be adjusted. Then, since the electron beam entering the lens opening 204 is affected both by the magnetic field formed by the first and second lens magnetic conductive members 210a and 210b and the magnetic field formed by the adjusting coil 542, the focus position of the electron beam and the rotation of the exposed image can be adjusted. Furthermore, the adjustment of the focus position and the adjustment of the rotation of the exposed image can be performed for the each of the electron beams passing through the respective lens openings 204 by providing the adjusting coil 542 in each of the lens openings 204.

It is desirable to arrange the adjusting coil 542 to be electrically insulated from the lens magnetic conductive members 210a and 210b from the substrate 540 to the lens opening 204. The adjusting coil 542 of this example is a solenoid coil provided to surround the electron beam passing through the corresponding lens opening 204. Moreover, in this example, the substrate 540 is provided between the multi-axis electron lens and the electron beam generator 10 so as to be opposed to the second lens magnetic conductive member 210b and to project from the first lens magnetic conductive member 210a differently from the second lens magnetic conductive member 210b toward the direction in which the electron beams are radiated. In an alternative example, the adjusting coil 542 maybe provided in the outside of the corresponding lens opening 204 to surround the optical axis of the electron beam passing through the lens opening 204 so that the magnetic field formed in the lens opening 204 is affected by the adjusting coil 542. Furthermore, the first lens-intensity adjuster 17 may include a radiation member, provided in the vicinity of the adjusting coil 542 or in contact with the adjusting coil 542, for inducing heat generated in the adjusting coil 542. The radiation member may be a cylindrical non-magnetic conductive member, for example. Also, the radiation member may be arranged in the surrounding area of the adjusting coil 542.

FIG. 18B is a top view of the surface of the first lens-intensity adjuster 17 on which the adjusting coils 542 are provided. The first lens-intensity adjuster 17 further includes an adjusting coil controller 546 for supplying desired currents to the respective adjusting coils 542. It is desirable that the adjusting coils 542 are electrically connected to the adjusting coil controller 546 via wirings 548 provided on the substrate 540. Moreover, it is preferable that the first lens-intensity adjuster 17 includes a plurality of adjusting coil controllers 546 each of which independently applies a voltage to a corresponding one of the adjusting coils 542.

Figure 19A:
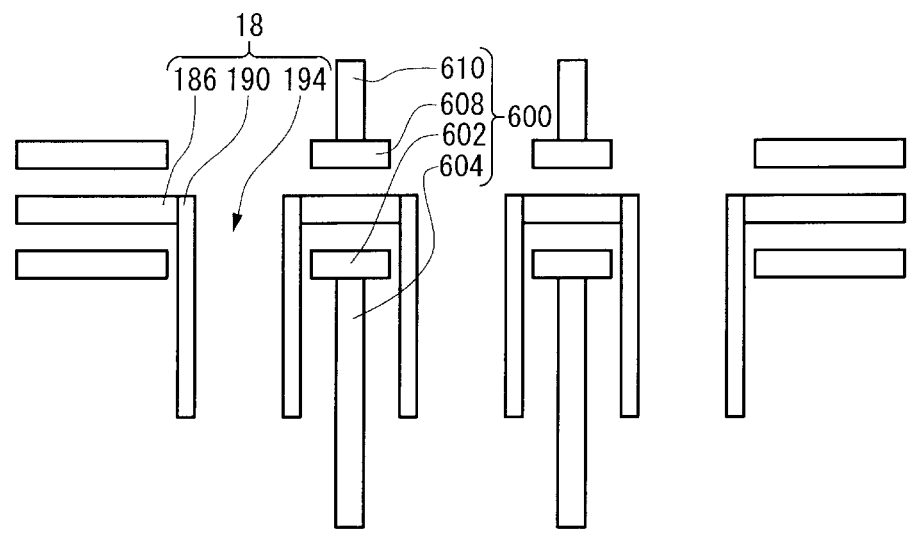
FIGS. 19A and 19B show an exemplary arrangement of a first shaping-deflecting unit 18 and a blocking unit 600.
Figure 19B:
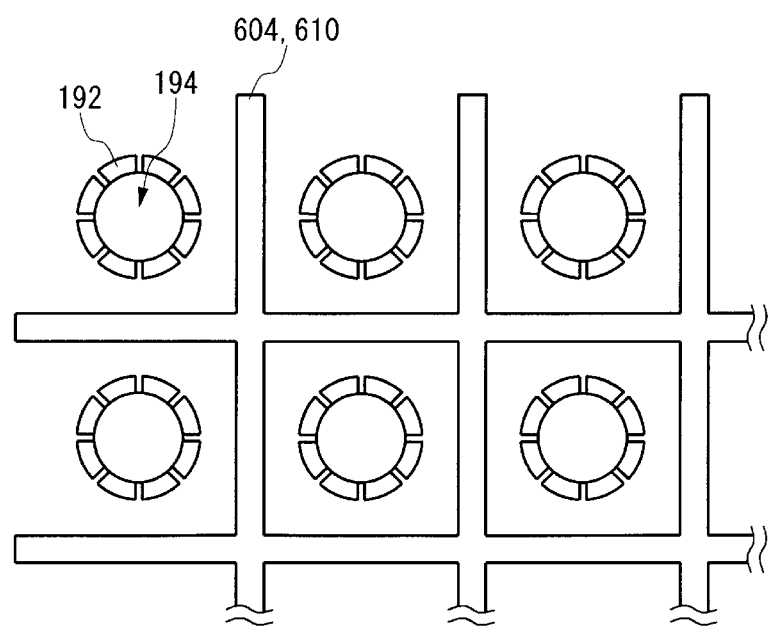

FIGS. 19A and 19B show an exemplary arrangement of the first shaping-deflecting unit 18 and the blocking unit 600. FIG. 19A is a cross-sectional view of the first shaping-deflecting unit 18 and the blocking unit 600, while FIG. 19B is a top view thereof. Although the first shaping-deflecting unit 18 is described as an example in the following description, the second shaping-deflecting unit 20 and the blanking electrode array 26 can have the same arrangement as the first shaping-deflecting unit 18.

The first shaping-deflecting unit 18 includes a substrate 186 provided to be substantially perpendicular to the direction in which the electron beams are emitted, openings 194 provided in the substrate 186, deflectors 190 respectively provided in the openings 194 along the direction in which the electron beams are emitted, as shown in FIG. 19A. The blocking unit 600 includes a first blocking substrate 602 and a second blocking substrate 608 provided to be substantially perpendicular to the direction in which the electron beams are emitted, first blocking electrodes 604 provided on the first blocking substrate 602 along the direction in which the electron beams are emitted, and second blocking electrodes 610 provided on the second blocking substrate 608 along the direction in which the electron beams are emitted. The first and second blocking substrate 602 and 608 are arranged to be opposed to each other with the substrate 186 of the first shaping-deflecting unit 18 interposed there-between.

The first blocking electrodes 604 are preferably arranged between the deflectors 190 so as to extend along the direction in which the electron beams are emitted from a position closer to the electron beam generator 10 (shown in FIG. 1) than the end of the deflector 190 that is closer to the electron beam generator 10 to a position closer to the wafer 44 (shown in FIG. 1) than the other end of the deflector 190. It is also preferable that the first blocking electrodes 604 are grounded. Moreover, the second blocking electrodes 610 are preferably arranged to be opposed to the first blocking electrodes 604 with the substrate 186 sandwiched there-between so as to extend along the direction in which the electron beams are emitted. Also, it is preferable to ground the second blocking electrodes 610. Furthermore, as shown in FIG. 19B, the first and second blocking electrodes 604 and 610 are preferably arranged to form a lattice between the deflectors 190.

Figure 20:
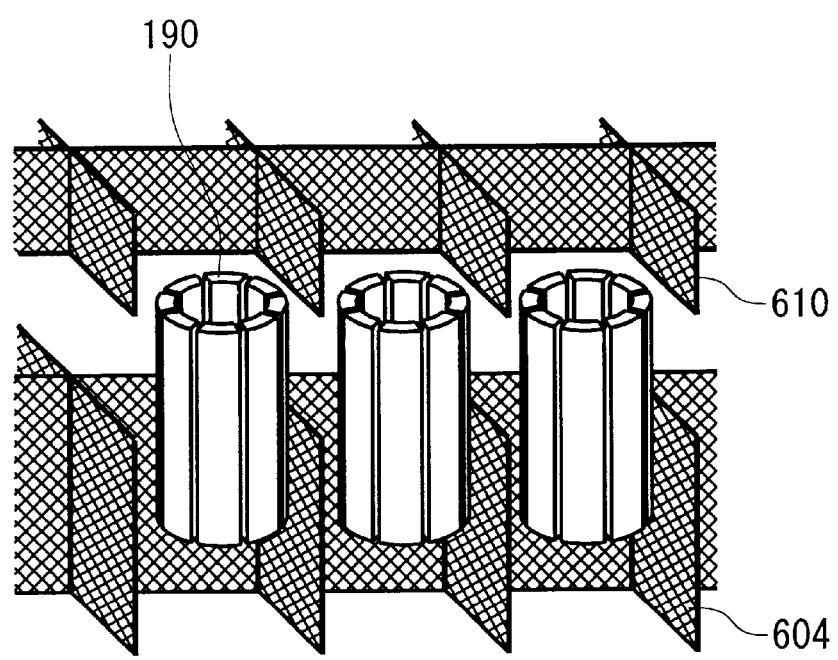
FIG. 20 shows a specific example of first and second blocking electrodes 604 and 610.

FIG. 20 shows an exemplary specific arrangement of the first and second blocking electrodes 604 and 610. It is preferable that the first and second blocking electrodes 604 and 610 have a plurality of holes each of which opens substantially perpendicular to the direction in which the electron beams are emitted. It is more preferable that the first and second blocking electrodes 604 and 610 are meshes, as shown in FIG. 20. By providing the first and second blocking electrodes 604 and 610 arranged in the body 8 with the holes, interference between each of the electron beams and the electric fields generated for other electron beams can be prevented without reducing the conductance of exhaustion in a case where the body 8 is exhausted to vacuum via the exhaustion holes 708, thereby the electron beams can be made incident on the wafer 44 with high precision.

Figure 21A:
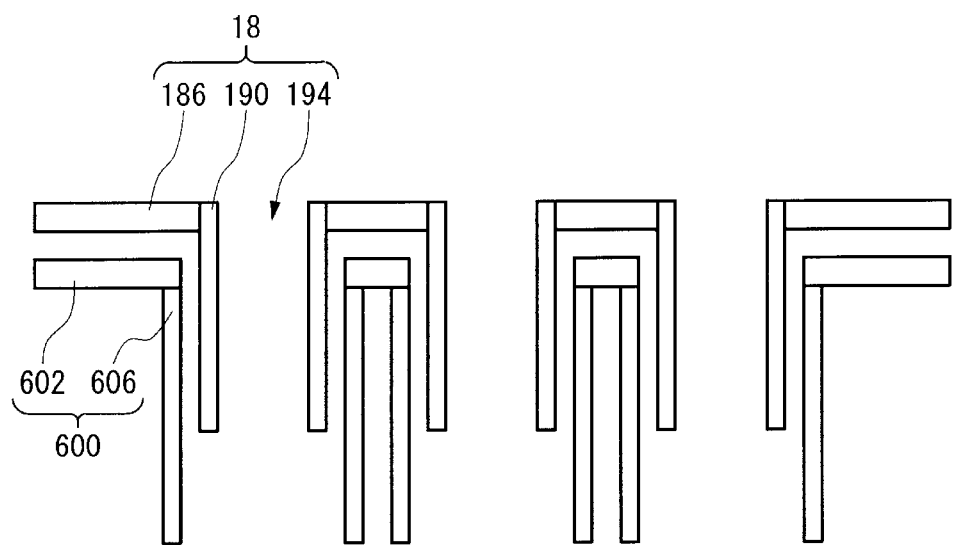
FIGS. 21A and 21B show another example of the first shaping-deflecting unit 18 and the blocking unit 600.
Figure 21B:
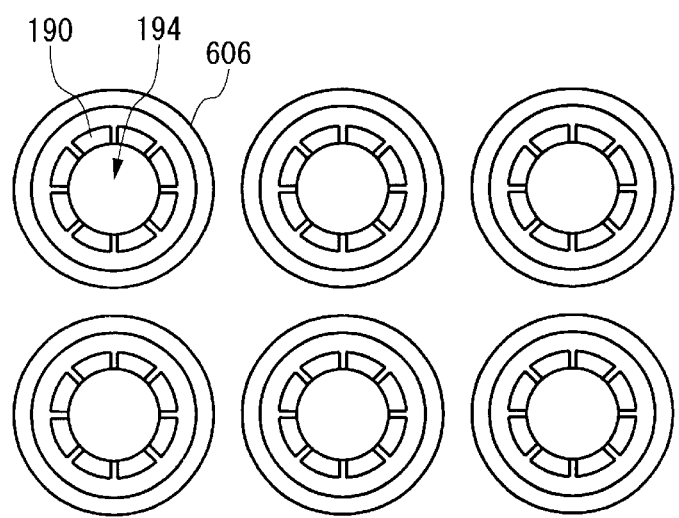

FIGS. 21A and 21B show another example of the first shaping-deflecting unit 18 and the blocking unit 600. FIG. 21A is a cross-sectional view of the first shaping-deflecting unit 18 and the blocking unit 600 while FIG. 21B is a view thereof seen from a wafer-side.

The blocking unit 600 includes the substrate 602 and a plurality of blocking electrodes 606. As shown in FIGS. 21A and 21B, the blocking electrodes 606 may be arranged to be cylindrical in the areas surrounding the respective deflectors 190. It should be noted the blocking electrodes 606 can have any shape as long as the electric field generated by a particular first shaping-deflecting unit 18 can be blocked from the electric fields generated by the other first shaping-deflecting units 18 so that the electric field generated by the particular first shaping-deflecting unit 18 cannot affect the electron beams other than the corresponding electron beam.

Figure 22:
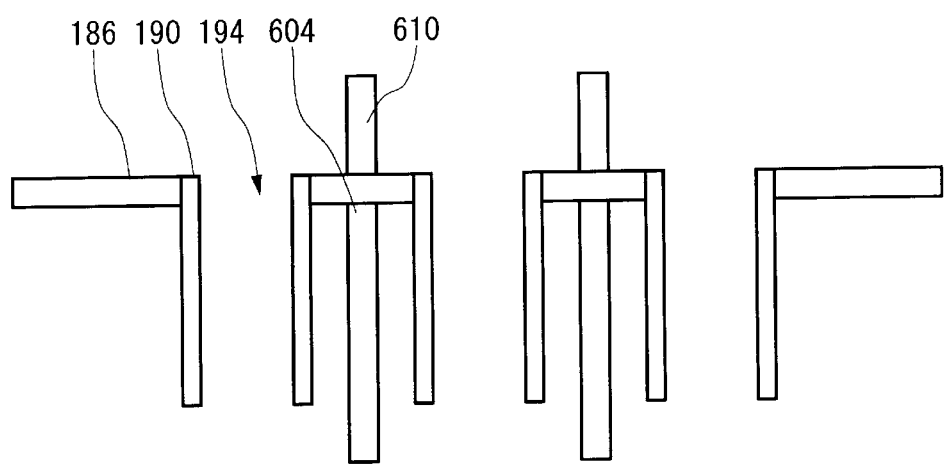
FIG. 22 shows another exemplary arrangement of the first shaping-deflecting unit 18.

FIG. 22 shows another exemplary arrangement of the first shaping-deflecting unit 18. As shown in FIG. 22, the first shaping-deflecting unit 18 of this example includes a substrate 186 provided to be substantially perpendicular to the direction in which the electron beams are emitted, openings 194 provided in the substrate 186, deflectors 190 provided for the respective openings 194, first blocking electrodes 604 provided between adjacent openings 194 and second blocking electrodes 610 provided to be opposed to the first blocking electrodes 604 with the substrate 186 sandwiched there-between so as to extend along a direction substantially perpendicular to the substrate 186.

The deflectors 190 are arranged along the first direction substantially perpendicular to the substrate 186. The first blocking electrodes 604 are preferably arranged along the first direction so as to extend longer than the deflectors 190. The first and second blocking electrodes 604 and 610 may be arranged to form a lattice between the openings 194. Moreover, the first and second blocking electrodes 604 and 610 may have holes arranged in a direction substantially perpendicular to the substrate 186. In this case, it is preferable that the first and second blocking electrodes 604 and 610 are meshes. Furthermore, the first and second blocking electrodes 604 and 610 are arranged at any position as long as the first and second blocking electrodes 604 and 610 are arranged between the openings 194 on the lower surface and the upper surface of the substrate 186, respectively.

Figure 23A:
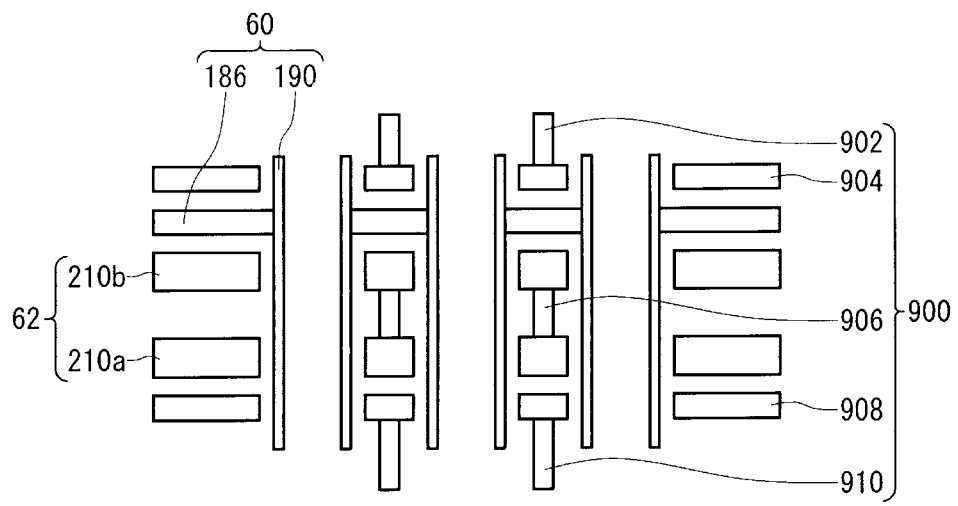
FIGS. 23A and 23B show an exemplary arrangement of a deflecting unit 60, a fifth multi-axis electron lens 62 and a blocking unit 900.
Figure 23B:
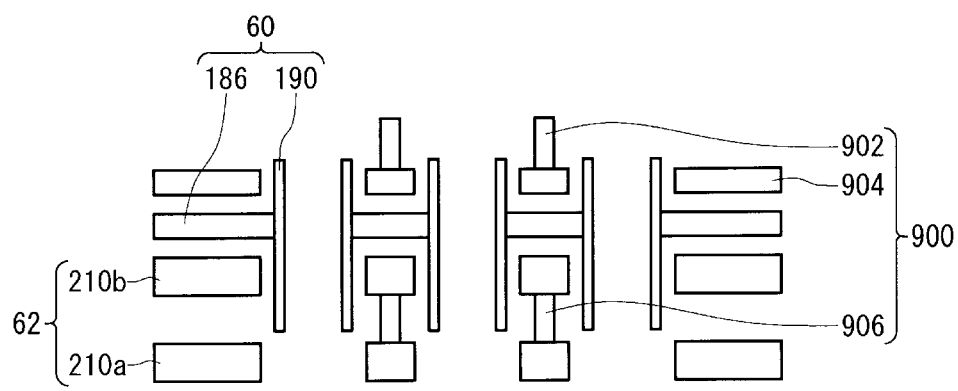

FIGS. 23A and 23B show an exemplary arrangement of the deflecting unit 60, the fifth multi-axis electron lens 62 and a blocking unit 900. As shown in FIG. 23A, the deflecting unit 60 includes a substrate 186 and a plurality of deflectors 190 respectively provided in the lens openings of the fifth multi-axis electron lens 62. The fifth multi-axis electron lens 62 includes the first magnetic conductive member 210b having a plurality of first openings allowing electron beams passing there-through and the second magnetic conductive member 210a having a plurality of second openings allowing the electron beams that have passed through the first openings to pass there-through. The first and second magnetic conductive members 210b and 210a are arranged to be substantially parallel to each other. The blocking unit 900 includes first blocking electrodes 902 provided to extend in a direction from the first magnetic conductive member 210b toward the electron beam generator 10, a first blocking substrate 904 provided to be substantially parallel to the first magnetic conductive member 210b for holding the first blocking electrodes 902, second blocking electrodes 910 provided to extend in a direction from the second magnetic conductive member 210a toward the wafer 44, a second blocking substrate 908 provided to be substantially parallel to the second magnetic conductive member 210a for holding the second blocking electrodes 910, and third blocking electrodes 906 provided between the first and second magnetic conductive members 210b and 210a, as shown in FIG. 23A.

The first, second and third blocking electrodes 902, 910 and 906 maybe arranged to form a lattice between the lens openings. Also, the first, second and third blocking electrodes 902, 910 and 906 may be provided in the surrounding areas of the lens openings. Moreover, the first, second and third blocking electrodes 902, 910 and 906 may have holes arranged in a direction substantially perpendicular to the substrate 186. In this case, it is preferable that the first, second and third blocking electrodes 902, 910 and 906 are formed by meshes. In addition, the blocking unit 900 may include no first blocking substrate 904. In this case, the first blocking electrodes 902 can be held by the substrate 186. Similarly, the blocking unit 900 may include no second blocking substrate 908. In this case, the second blocking electrodes 910 can be held by the second magnetic conductive member 210a. Furthermore, the blocking unit 900 may not include the second blocking electrode 910 in a case where the deflectors 190 do not project from the second magnetic conductive member 210a towards the wafer 44, as shown in FIG. 23B.

Figure 24:
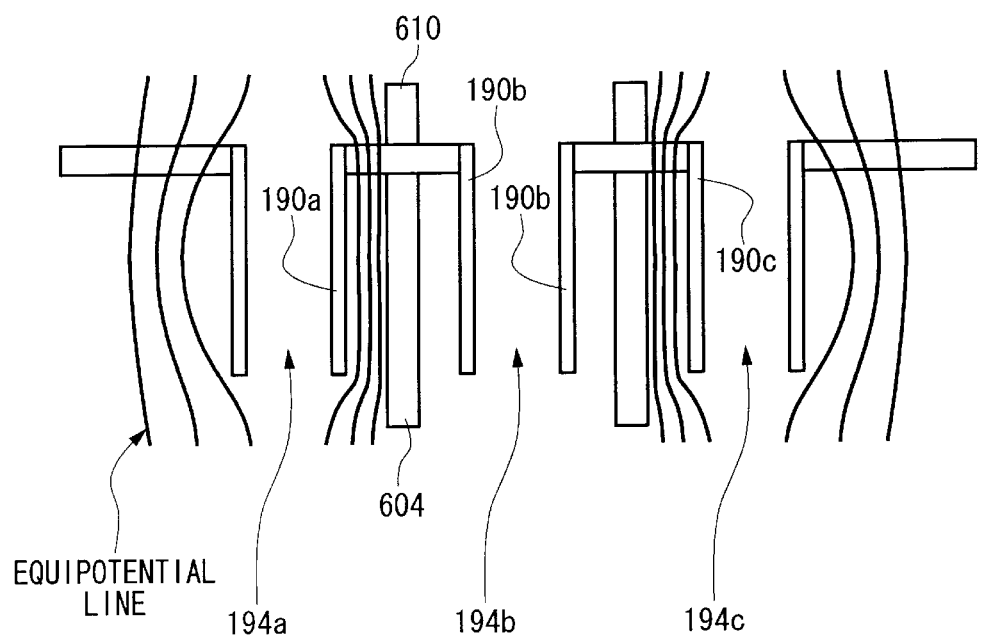
FIG. 24 shows an electric field blocked by the blocking unit 600 or 900.

FIG. 24 shows the electric field blocked by the blocking unit 600 or 900. In FIG. 24, the electric field generated by the deflectors 190 in the first shaping-deflecting unit 18 as an example is shown. When the blocking electrodes are provided between the electrodes of the adjacent deflectors 190, the effects of the electric field generated by a particular deflector 190 on the electron beams other than the corresponding electron beam to be deflected by the particular deflector 190 can be greatly reduced.

As a specific example, a case is considered where a negative voltage is applied to the deflecting electrode of the deflector 190a in order to deflect the electron beam passing through the opening 194a, a positive voltage is applied to the deflecting electrode of the deflector 190c in order to deflect the electron beam passing through the opening 194c and no voltage is applied to the deflecting electrode of the deflector 190b in order to allow the electron beam to pass straight through the opening 194b. In this case, as shown in FIG. 24, the first and second blocking electrodes 604 and 610 can block the electric fields generated by the deflectors 190a and 190c so as to greatly reduce the effects of the deflectors 190a and 190c on the electron beam passing through the deflector 190b. Therefore, a plurality of electron beams can be cast onto the wafer 44 with high precision.

Figure 25:
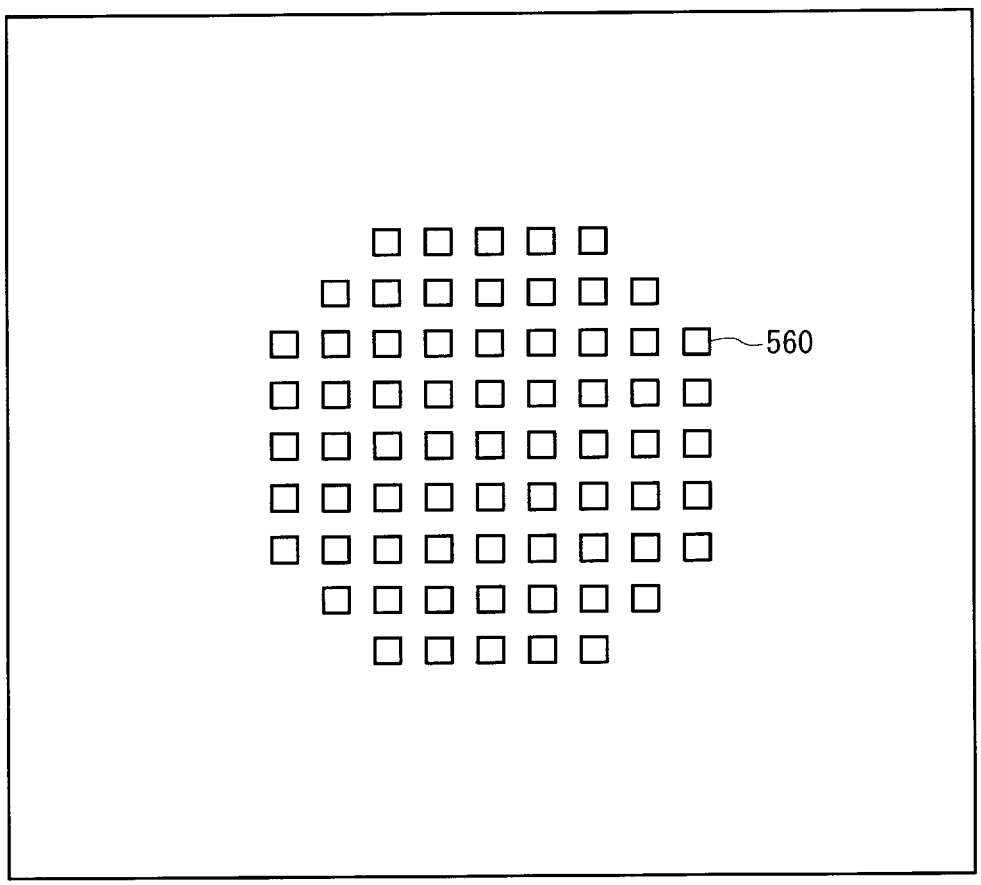
FIG. 25 shows an example of the first and second shaping members 14 and 22.

FIG. 25 shows an example of the first and second shaping members 14 and 22. The first shaping member 14 has a plurality of illumination areas 560 that are to be illuminated with electron beams generated by the electron beam generator 10, respectively. The first shaping member 14 includes a first shaping opening in each illumination area 560 so as to shape the electron beam incident thereon. It is preferable that the first shaping openings have rectangular shapes.

Similarly, the second shaping member 22 has a plurality of illumination areas 560 to be illuminated with the electron beams after being deflected by the first and second shaping-deflecting units 18 and 20. The second shaping member 22 includes a second shaping opening in each illumination area 560 so as to shape the electron beam incident thereon. It is preferable that the second shaping openings have rectangular shapes.

Figure 26A:
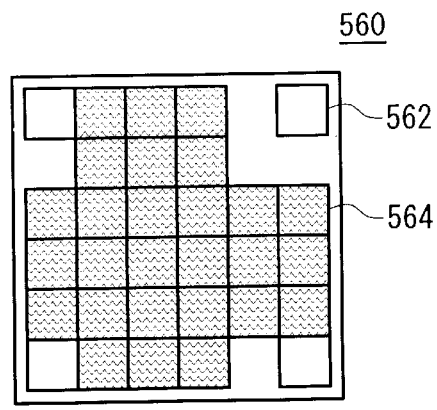
FIGS. 26A, 26B, 26C, 26D and 26E show exemplary pattern openings 566 of the second shaping member 22.

FIG. 26A shows another example of the illumination areas 560 in the second shaping member 22. As shown in FIG. 26A, the illumination area 560 includes the second shaping opening 562 described referring to FIG. 25 and a plurality of pattern-opening areas 564 where pattern openings having different shapes from the second shaping opening 562 are provided. It is preferable that the pattern-opening area 564 has a size that is substantially the same as or less than the maximum size of the electron beam shaped by the first shaping member 14. It is also preferable that the shape of the pattern-opening area 564 is the same as or similar to the cross-sectional shape of the electron beam shaped by the first shaping member 14.

Figure 26B:
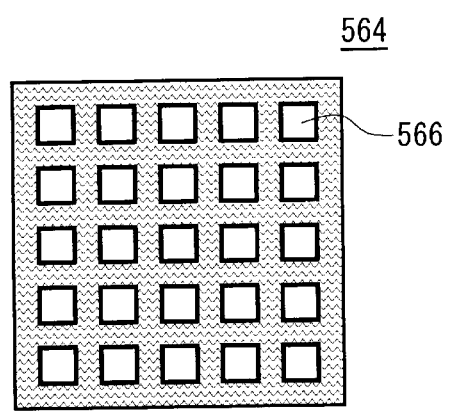
Figure 26C:
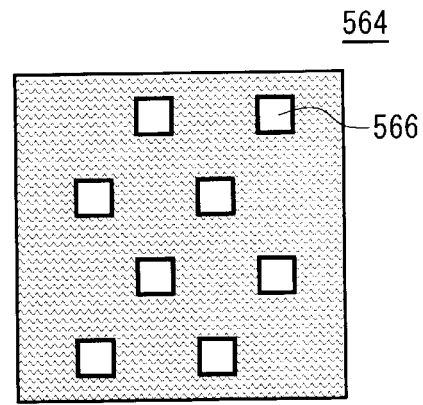
Figure 26D:
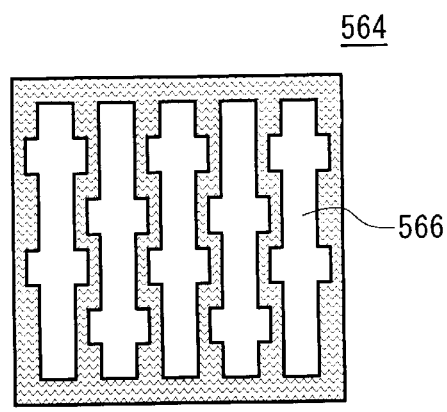
Figure 26E:
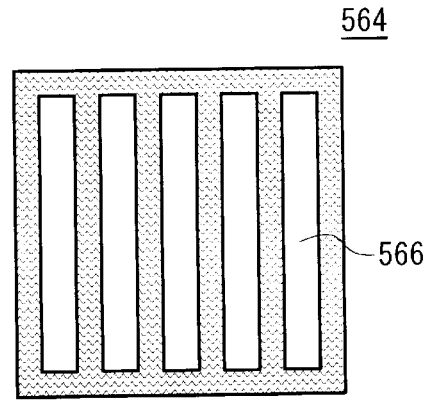

FIGS. 26B, 26C, 26D and 26E show exemplary pattern openings 566. As shown in FIGS. 26B and 26C, it is preferable that the pattern openings 566 are openings for exposing openings to be provided at a constant interval or a constant period, such as contact holes for electrically connecting transistors to be formed on the wafer to wirings or through holes for electrically connecting the wirings to each other. The pattern openings 566 may be openings for exposing a line and space pattern provided at a constant interval or a constant period, such as gate electrodes of the transistors or the wirings, as shown in FIGS. 26D and 26E.

When each of the electron beams shaped in the first shaping member 14 is incident entirely on the pattern-opening area 564 of the illumination area 560 corresponding to the electron beam, a pattern to be formed by electron beams after passing through the pattern openings 566 included in the pattern-opening area 564 is exposed at once.

Figure 27:
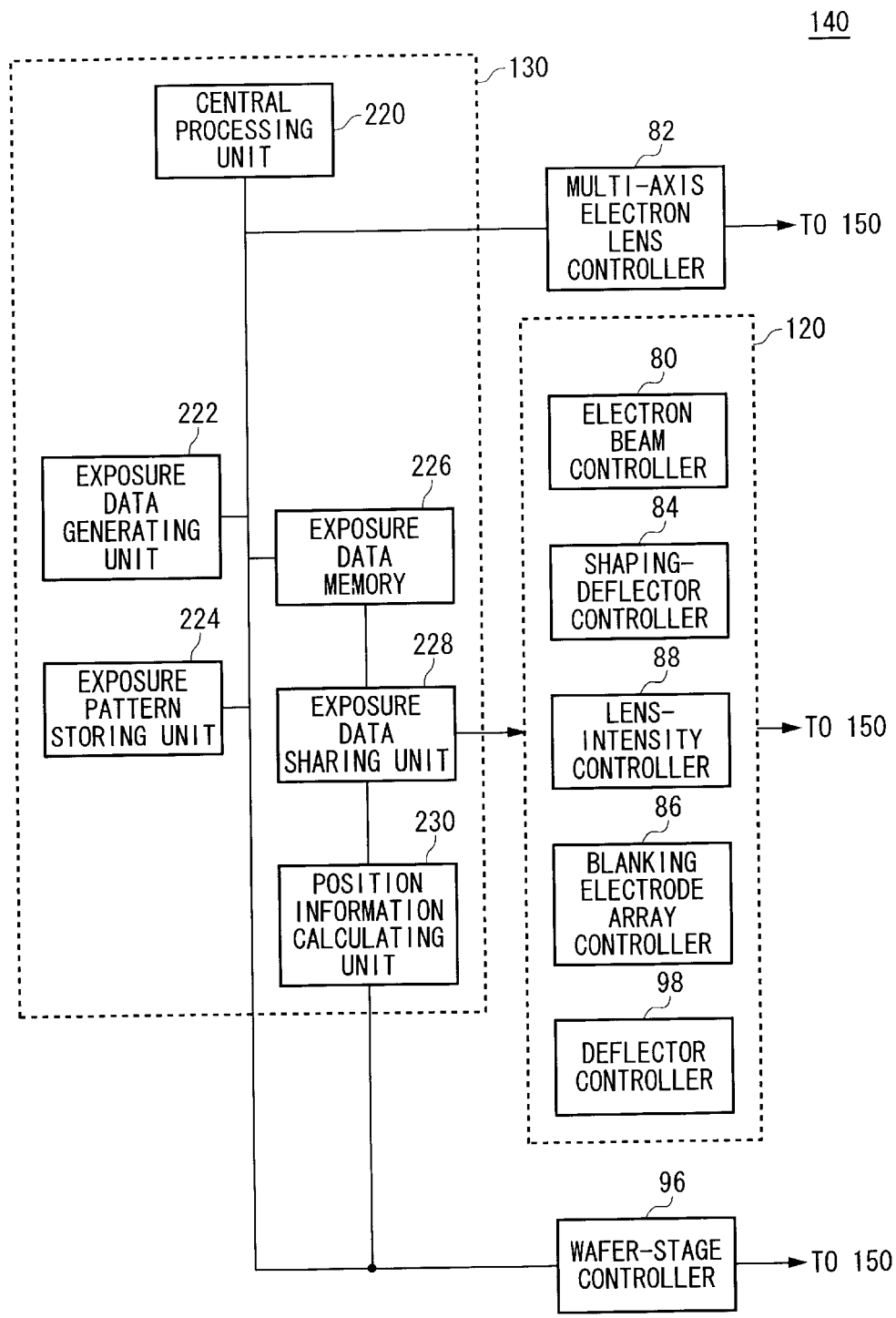
FIG. 27 shows an exemplary arrangement of a controlling system 140 shown in FIG. 1.

FIG. 27 shows an exemplary arrangement of the controlling system 140 described before referring to FIG. 1. The controlling system 140 includes the general controller 130, the individual controller 120, the multi-axis electron lens controller 82 and the wafer-stage controller 96. The general controller 130 includes a central processing unit 220 for controlling the controlling system 140, an exposure pattern storing unit 224 for storing an exposure pattern to be exposed onto the wafer 44, an exposure data generating unit 222 for generating exposure data that is an exposure pattern in an area to be exposed by the electron beams based on the exposure pattern stored in the exposure pattern storing unit 224, an exposure data memory 226 that is a memory for the exposure data, an exposure data sharing unit 228 for allowing the exposure data to be shared with other controllers, and a position information calculating unit 230 for calculating the exposure data and position information of the wafer stage 46.

The individual controller 120 includes the electron beam controller 80 for controlling the electron beam generator 10, the shaping-deflector controller 84 for controlling the shaping-deflecting units 18 and 20, the lens-intensity controller 88 for controlling the lens-intensity adjusters 17, 25, 35 and 37, the blanking electrode array controller 86 for controlling the blanking electrode array 26, and the deflector controller 98 for controlling deflecting unit 60. The multi-axis electron lens controller 82 controls currents to be supplied to the coils in the multi-axis electron lenses 16, 24, 34, 36 and 62 in accordance with an instruction from the central processing unit 20.

The operation of the controlling system 140 in this example is described below. Based on the exposure pattern stored in the exposure pattern storing unit 224, the exposure data generating unit 222 generates the exposure data and stores the generated exposure data in the exposure data memory 226. The exposure data sharing unit 228 reads the exposure data stored from the exposure data memory 226, stores it therein, and supplies it to the position information calculating unit 230 and an individual controller 120. The exposure data memory 226 is preferably a buffer memory for temporarily storing the exposure data. More specifically, it is preferable that the buffer memory as the exposure data memory 226 stores the exposure data corresponding to an area to be exposed next. The individual electron beam controller 122 controls each of the electron beams based on the received exposure data. The position information calculating unit 230 supplies information used for adjusting a position to which the wafer stage 46 is to move to the wafer-stage controller 96 based on the received exposure data. The wafer-stage controller 96 then controls the wafer-stage driving unit 48 to move the wafer stage 46 to a predetermined position based on the information from the position information calculating unit 230 and an instruction from the central processing unit 220.

Figure 28:
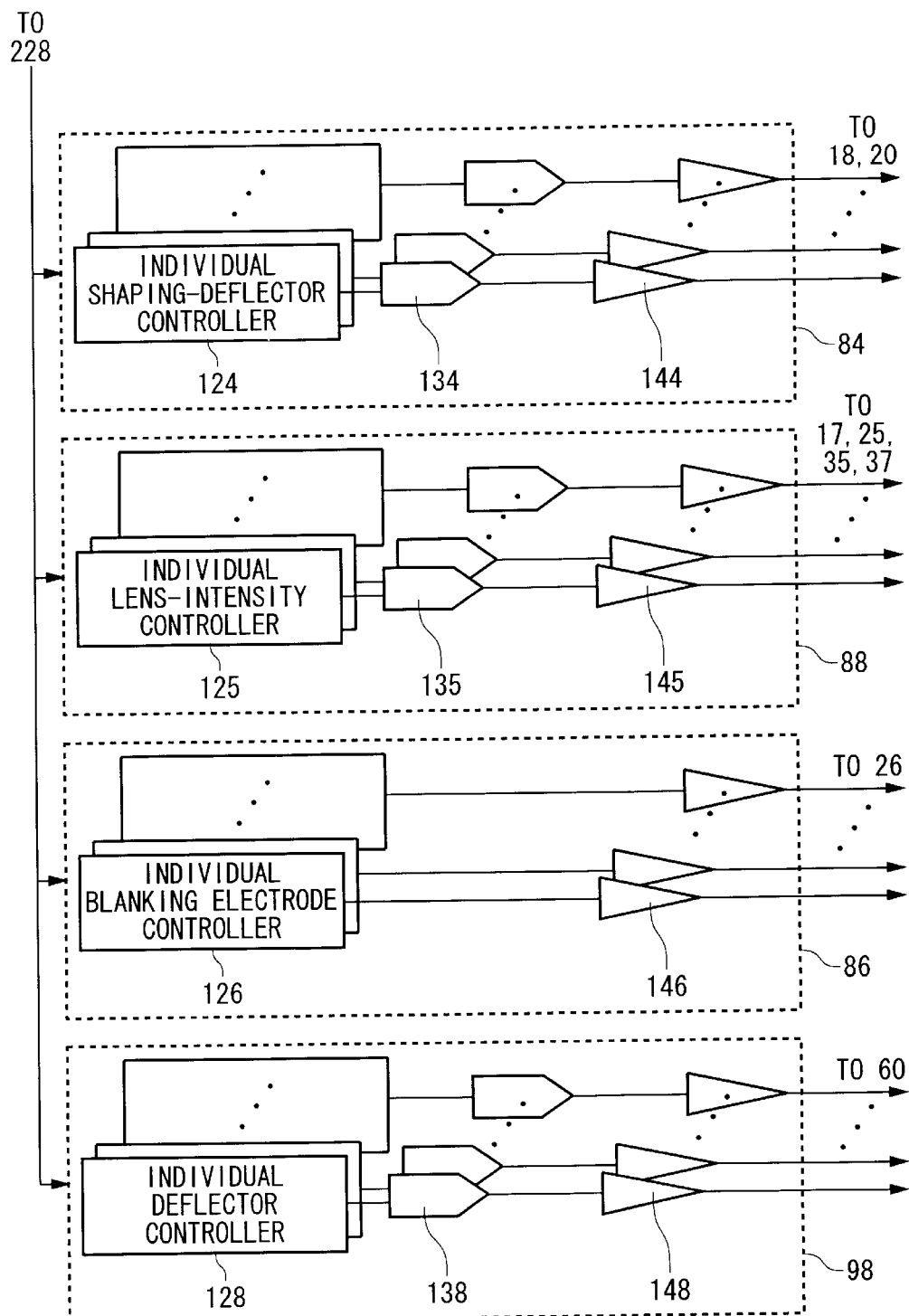
FIG. 28 shows details of components included in an individual controlling system 120.

FIG. 28 shows details of the components included in the individual controlling system 120. The blanking electrode array controller 86 includes individual blanking electrode controllers 126 each of which generates a reference clock and controls, for a corresponding one of the electron beams, whether or not a voltage is applied to the deflecting electrode 168 corresponding to the electron beam in accordance with the reference clock based on the received exposure data, and amplifying parts 146 that amplify signals output from the individual blanking electrode controllers 126 so as to output the amplified signals to the blanking electrode array 26.

The shaping-deflector controller 84 includes a plurality of individual shaping-deflector controllers 124 for outputting a plurality of units of voltage data indicating voltages to be applied to the deflecting electrodes of the shaping-deflecting units 18 and 20, respectively, digital-analog converters (DAC) 134 for converting the voltage data units received from the individual shaping-deflector controllers 124 in digital data form into analog data so as to output the analog data, and amplifying parts 144 each amplifies the analog data received from the corresponding DAC 134 to supply the amplified analog data to the shaping-deflecting unit 18 or 20.

The lens-intensity controller 88 includes individual lens-intensity controllers 125 for respectively outputting a plurality of data units used for controlling voltages to be applied to the lens-intensity adjusters 17, 25, 35 and 37 or currents to be supplied thereto, Daces 135 each of which converts the data unit received from the corresponding individual lens-intensity controller 124 into analog data, and amplifying parts 145 each of which amplifies the analog data received from the corresponding DAC 135 to supply the amplified analog data to the shaping-deflecting unit 18 or 20.

The lens-intensity controller 88 controls the voltages to be applied to the respective lens-intensity adjusters 17, 25, 35 and 37 and/or the currents to be supplied thereto so as to make the lens intensities in the lens openings 204 in each of the multi-axis electron lenses substantially uniform based on the instruction from the central processing unit 220. In this example, the lens-intensity controller 88 supplies a constant voltage and/or current to each of the lens-intensity adjuster 17, 25, 35 or 37 in the exposure process. In this case, the lens-intensity controller 88 controls each of the lens-intensity adjuster 17, 25, 35 or 37 based on data for calibrating the focus and/or rotation of each electron beam with respect to the wafer 44 obtained prior to the exposure process. That is, the lens-intensity controller 88 may control the respective lens-intensity adjusters 17, 25, 35 and 37 in the exposure process without using the exposure data.

The deflector controller 98 includes individual deflector controllers 128 for respectively outputting a plurality of units of voltage data indicating voltages to be applied to the deflecting electrodes of the deflecting unit 60, Daces 138 each of which converts one of the voltage data units received as digital data from the corresponding individual deflector controller 128 into analog data so as to output the analog data, and AMPs 148 each of which amplifies the analog data received from the corresponding DAC 138 to supply the amplified analog data to the deflecting unit 60. It is desirable that the deflector controller 98 includes the individual deflector controller 122, the DAC 138 and the AMP 148 for each of the deflecting electrodes included in the deflecting unit 60.

The operations of the deflector controller 84, the blanking electrode array controller 86, and the deflector controller 98 are described. First, the individual blanking electrode controllers 126 determine times at which the voltages are applied to the respective deflecting electrodes 168 of the blanking electrode array 26 based on the exposure data and the reference clock. In this example, the individual blanking electrode controllers 126 control each of the electron beams whether or not the electron beam is cast onto the wafer 44 at a different time from the time of the other electron beams. In other words, each individual blanking electrode controller 126 generates the time at which the electron beam is cast onto the wafer 44 independently of the time for the other electron beam, and controls whether or not the corresponding electron beam passing through the blanking electrode array 26 is to be cast onto the wafer 44 at the generated time. It is preferable the individual blanking electrode controller 126 determines a time period for which the wafer 44 is illuminated with the corresponding electron beam based on the received exposure data and the reference clock.

In accordance with the times generated by the individual blanking electrode controllers 126, the individual shaping-deflector controllers 124 output voltages to be applied to the deflecting electrodes of the shaping-deflecting units 18 and 20 in order to shape the cross-sectional shapes of the electron beams based on the received exposure data. Also in accordance with the times generated by the individual blanking electrode controllers 126, the individual deflectors 128 output a plurality of voltage data units specifying voltages to be applied to the deflecting electrodes of the deflecting unit 60 based on the received exposure data in order to control the electron beams to be positioned at positions on the wafer 44 to be illuminated with the electron beams, respectively.

Figure 29:
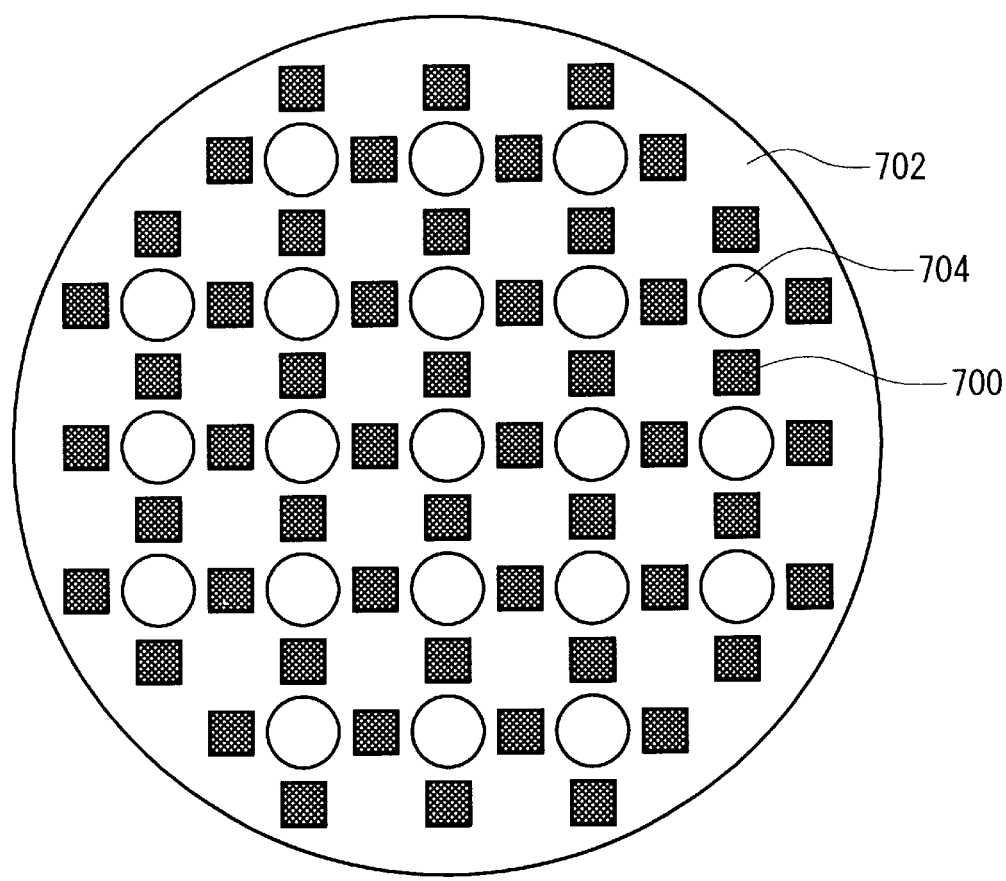
FIG. 29 shows an example of a backscattered electron detector 50.

FIG. 29 shows an example of the backscattered electron detector 50. The backscattered electron detector 50 includes a substrate 702 having a plurality of openings 704 allowing a plurality of electron beams to pass there-through, respectively, and electron detectors 700 for detecting electrons radiated from marked portions (not shown) provided on the wafer 44 or the wafer stage 46 so as to output a detection signal based on the amount of the detected electrons. The electron detectors 700 of this example are provided between the openings 704 provided in the substrate 702. That is, the electron detectors 700 are arranged between two electron beams passing through the adjacent two openings 704.

The electron detectors 700 are preferably arranged in such a manner that each electron detector 700 is positioned on substantially the same line as the optical axes of the two electron beams passing through the two openings 704 adjacent to the electron beam detector 700. Moreover, it is desirable that the electron beam generator 10 generates three or more electron beams with a substantially constant interval while the electron detectors 700 are provided between the three or more electron beams passing through the three or more openings 704. Also, the openings 704 are preferably arranged to form a lattice. In this case, it is desirable that the electron beam detectors 700 are arranged between the openings 704 of the lattice. Furthermore, the electron beam detector 700 may be provided on the outer side of the openings 704 arranged at the outermost positions.

Figure 30:
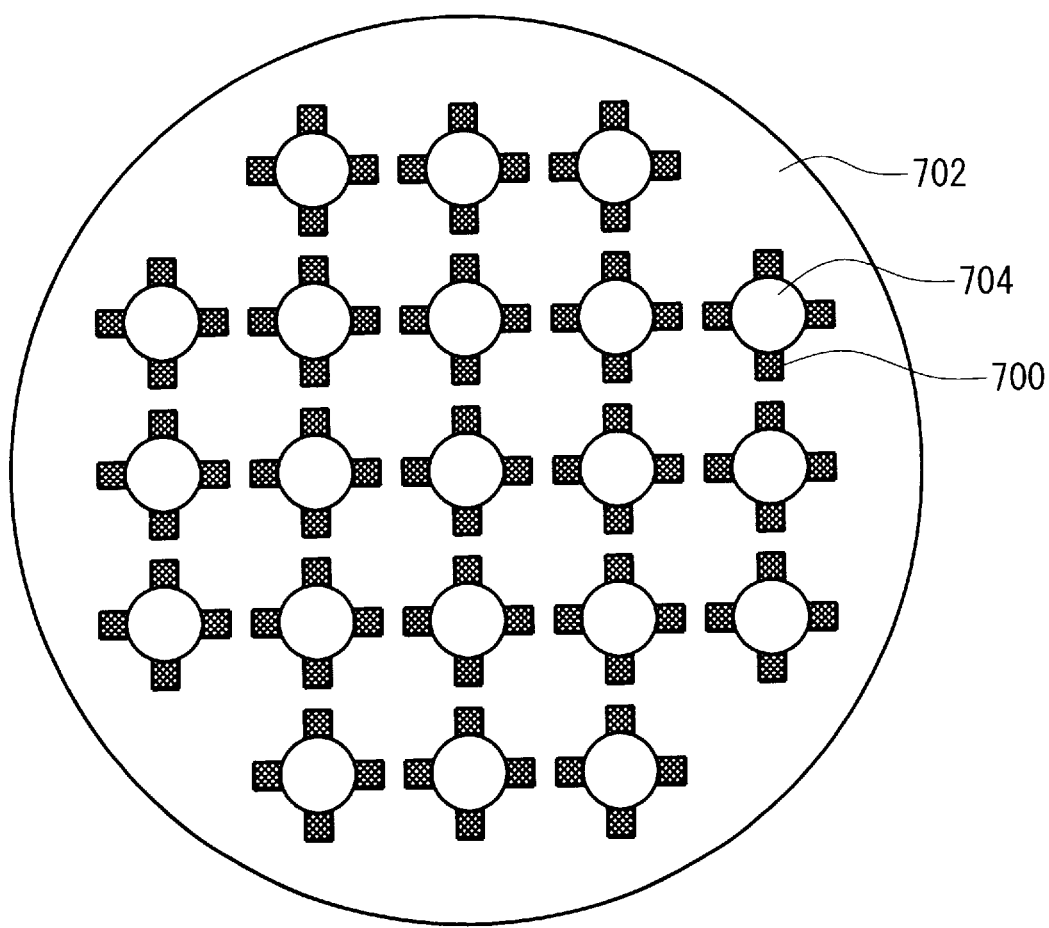
FIG. 30 shows another exemplary backscattered electron detector 50.

FIG. 30 shows another exemplary arrangement of the backscattered electron detector 50. The backscattered electron detector 50 includes a substrate 702 having a plurality of openings 704 allowing a plurality of electron beams to pass there-through, respectively, and electron detectors 700 for detecting electrons radiated from a target mark (not shown) on the wafer 44 or the wafer stage 46 so as to output a detection signal based on the amount of the detected electrons. The electron detectors 700 of this example are arranged in such a manner that two or more of the electron detectors 700 are positioned between the adjacent openings 704. In other words, two or more the electron detectors 700 are arranged between the two electron beams passing through the two openings 704 so as to correspond to the two openings 704, respectively. Moreover, the electron detectors 700 are arranged in the surrounding area of each of the openings 704.

It is preferable that the two or more electron detectors 700 are provided on substantially the same line as the optical axes of the two electron beams passing through the two openings 704 adjacent to these electron detectors 700. Moreover, it is desirable that the electron beam generator 10 generates three or more electron beams at a substantially constant interval. In this case, the electron detectors 700 are desirably arranged in such a manner that two or more of the electron detectors 700 are positioned between the three or more electron beams passing through the three or more openings 704, respectively. In addition, the openings 704 are preferably arranged to form a lattice between which the electron detectors 700 are arranged in such a manner that two or more electron detectors 700 are positioned between the adjacent openings 704. Furthermore, the electron detectors 700 may be provided on the outer side of the outermost openings 704.

Figure 31:
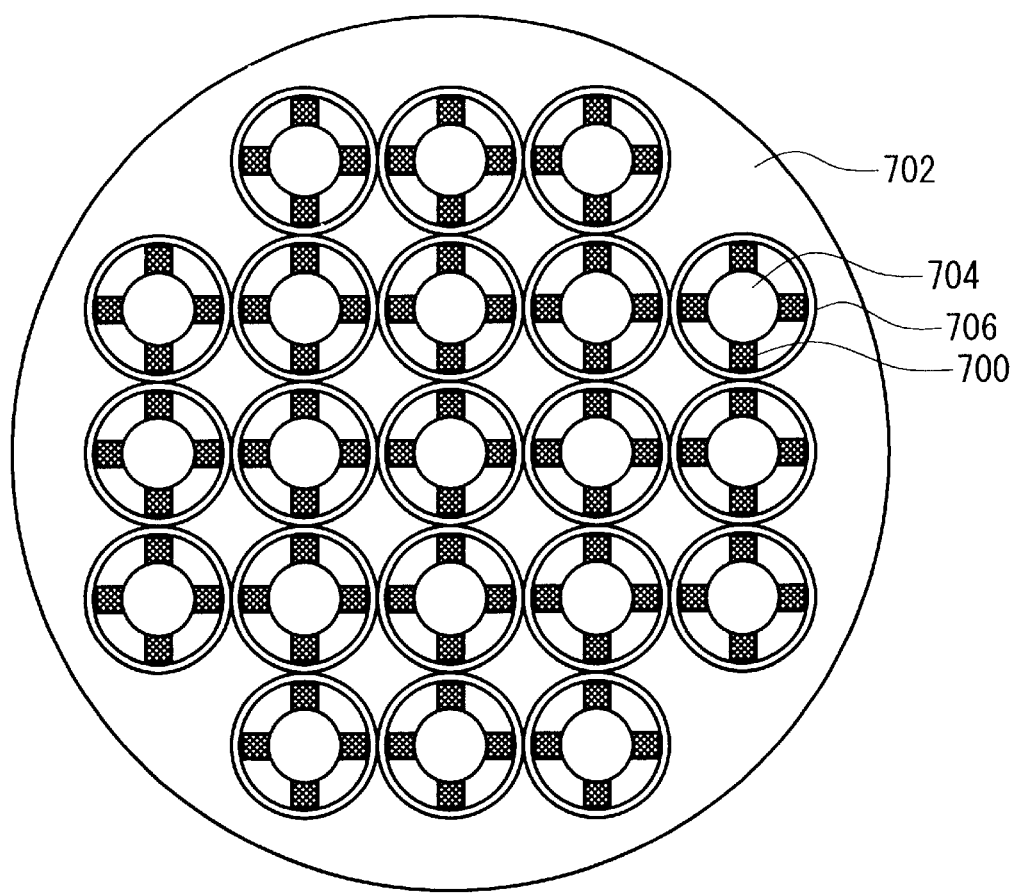
FIG. 31 shows another exemplary backscattered electron detector 50.

FIG. 31 shows another exemplary backscattered electron detector 50. The backscattered electron detector 50 includes a substrate 702 having a plurality of openings 704 allowing a plurality of electron beams to pass there-through, respectively, electron detectors 700 for detecting the electrons radiated from the target mark (not shown) provided on the wafer 44 or the wafer stage 46 to output a detection signal based on the amount of the detected electrons, and blocking plates 706 provided between the openings 704. The electron detectors 700 of this example are arranged in such a manner that two or more electron detectors 700 are positioned between the adjacent openings 704 so as to respectively correspond the openings 704.

It is preferable that the electron detectors 700 are further provided in areas surrounding each of the openings 704 provided on the substrate 702. Moreover, the blocking plates 706 are preferably provided between a particular electron beam and the electron beams adjacent to the particular electron beam. That is, the blocking plates 706 are provided between the electron detectors provided in the surrounding area of a particular opening 704 and the electron detectors provided in the surrounding area of the opening 704 adjacent to the particular opening 704.

The blocking plates 706 are arranged at any portions as long as each blocking plate 706 is positioned between the electron beam and the electron detector 700 that is corresponding thereto. It is preferable that the blocking plate 706 is provided between the illumination position of the electron beam in a surface onto which the wafer is to be placed and the electron detector provided in the second electron beam. It is also desirable that the blocking plates 706 are formed from non-magnetic conductive material. Moreover, it is desirable that the blocking plates 706 are grounded by being electrically connected to the substrate 702.

Figure 32:
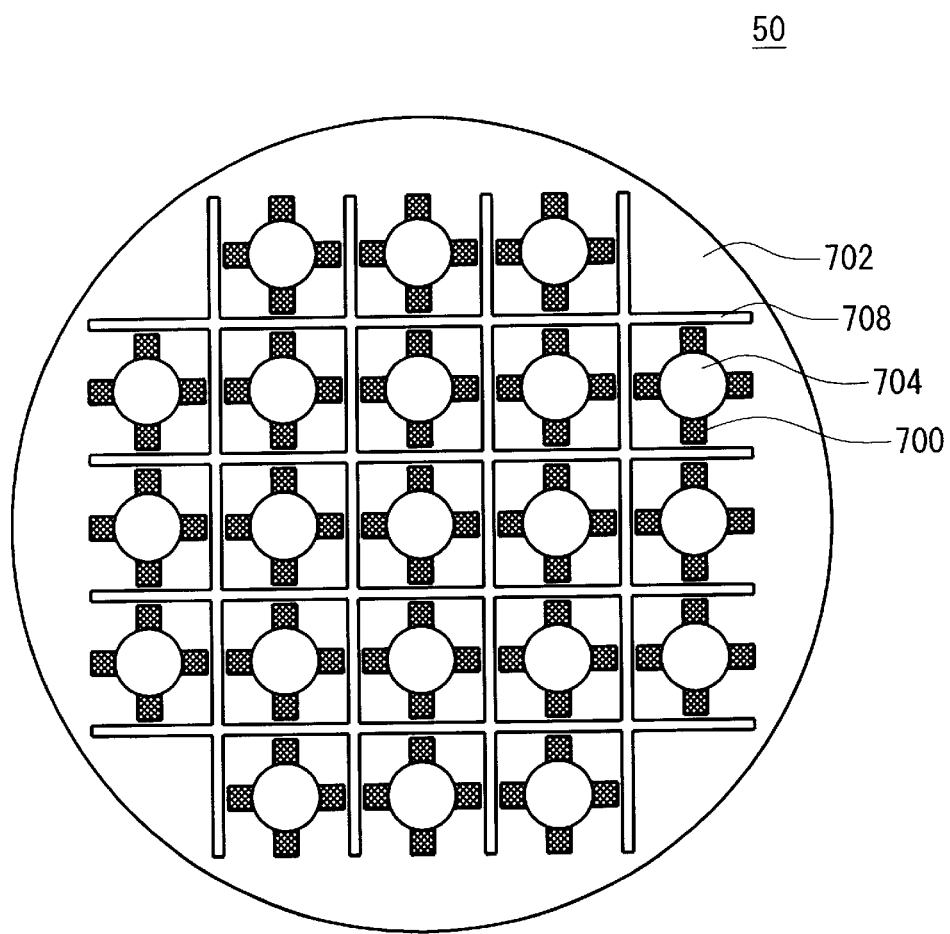
FIG. 32 shows another exemplary backscattered electron detector 50.

FIG. 32 shows still another exemplary arrangement of the backscattered electron detector 50. The blocking plates 708 may be arranged to form a lattice between the electron detectors 700 provided in the surrounding areas of the openings 704 that are also arranged to form a lattice. The blocking plates 708 may have any shapes as long as each blocking plate 708 blocks a predetermined electron detector 700 from other electron detectors 700 so as to avoid the radiation of the electrons from a predetermined target mark (not shown) to electron detectors other than a predetermined electron detector that corresponds to the predetermined marked portion.

Figure 33:
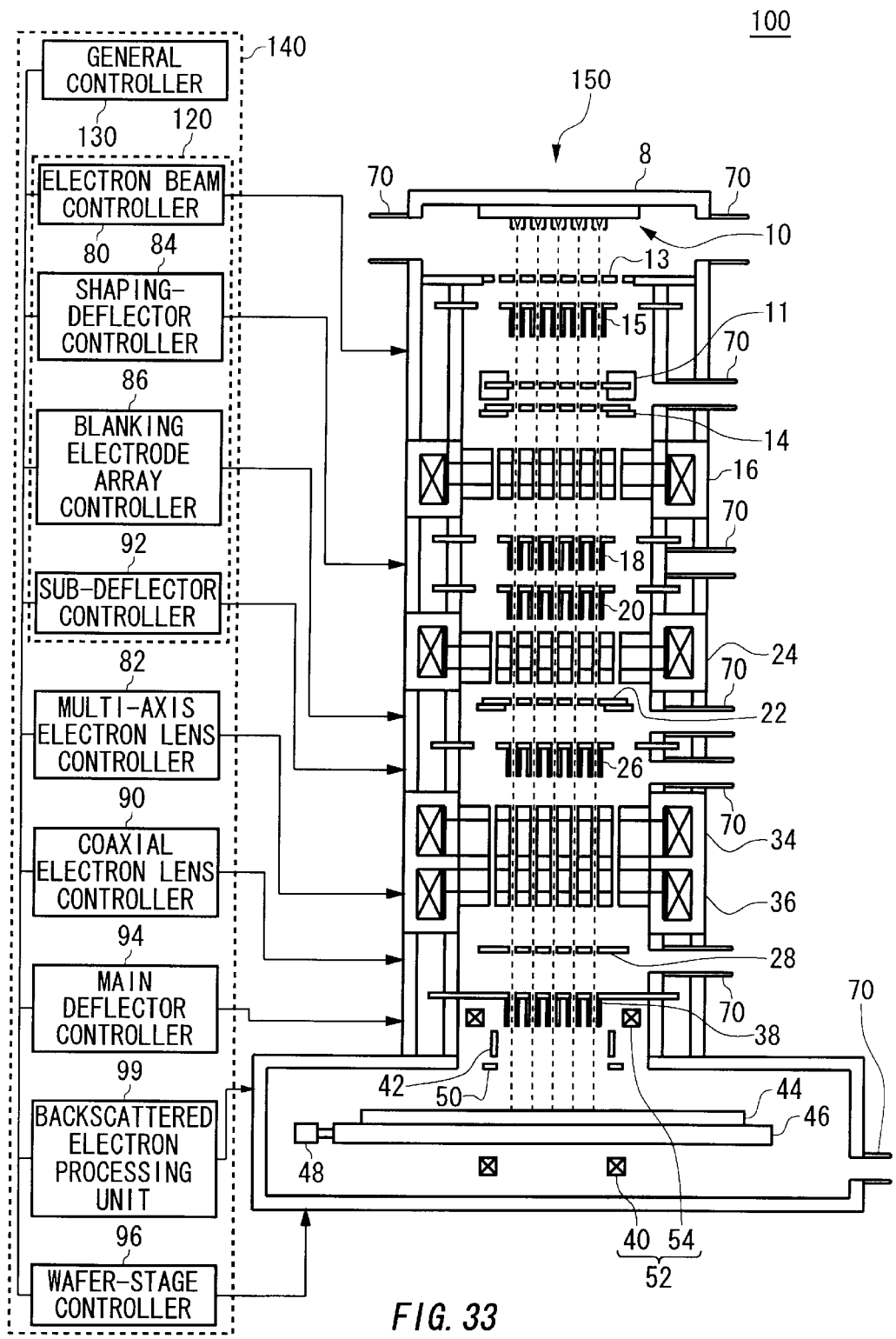
FIG. 33 shows an electron beam exposure apparatus 100 according to another embodiment of the present invention.

FIG. 33 shows an electron beam exposure apparatus 100 according to another embodiment of the present invention. In the present embodiment, each electron beam is provided to be away from electron beams adjacent thereto by narrower distances. The distance between the adjacent electron beams may be set to be such a distance that all the electron beams are incident on an area corresponding to one chip to be provided on the wafer, for example. The components labeled with the same reference numerals in FIG. 33 as those in FIG. 1 may have the same structures and functions as the components of the electron beam exposure apparatus shown in FIG. 1. In the following description, structures, operations and functions of the electron beam exposure apparatus of the present embodiment that are different from those of the electron beam exposure apparatus shown in FIG. 1 are described.

The electron beam shaping unit includes an electron beam generator 10 which can generate a plurality of electron beams, an anode 13 which allows the generated electron beams to be radiated, a slit cover 11 having a plurality of openings for shaping the cross-sectional shapes of the electron beams by allowing the electron beams to pass there-through, respectively, a first shaping member 14, a second shaping member 22, a first multi-axis electron lens 16 which can converge the electron beams independently of each other to adjust focal points of the electron beams, a slit-deflecting unit 15 that can deflect the electron beams after passing through the anode 13 independently of each other, and first and second shaping-deflecting units 18 and 20 which can deflect the electron beams after passing through the first shaping member 14.

It is desirable that the slit cover 11 and the first and the second shaping members 14 and 22 have grounded metal films such as platinum films, on surfaces thereof onto which the electron beams are incident. It is also desirable that each of the slit cover 11 and the first and second shaping members 14 and 22 includes a cooling unit for suppressing the increase in the temperature caused by the incident electron beams.

The openings included in each of the slit cover 11 and the first and second shaping members 14 and 22 may have cross-sectional shapes each of which becomes wider along the radiated direction of the electron beams in order to allow the electron beams to pass efficiently. Moreover, the openings of each of the slit cover 11 and the first and second shaping members 14 and 22 are preferably formed to be rectangular.

The illumination switching unit includes: a second multi-axis electron lens 24 which can converge a plurality of electron beams independently of each other to adjust focal points thereof; a blanking electrode array 26 which switches for each of the electron beams whether or not the electron beam is to be incident on the wafer 44; and an electron beam blocking member 28 that has a plurality of openings allowing the electron beams to pass there-through, respectively, and can block the electron beams deflected by the blanking electrode array 26. The openings of the electron beam blocking member 28 may have cross-sectional shapes each of which becomes wider along the radiated direction of the electron beams in order to allow the electron beams to efficiently pass there-through.

The wafer projection system includes: a third multi-axis electron lens 34 which can converge a plurality of electron beams independently of each other and adjust the rotations of the electron beams to be incident onto the wafer 44; a fourth multi-axis electron lens 36 which can converge a plurality of electron beams independently of each other and adjust the reduction ratio of each electron beam to be incident onto the wafer 44; a sub-deflecting unit 38 that is an independent deflecting unit for deflecting a plurality of electron beams independently of each other towards desired positions on the wafer 44; a coaxial lens 52 which can function as an objective lens and has a first coil 40 and a second coil 54 for converging a plurality of electron beams independently of each other; and a main deflecting unit 42 that is a common deflecting unit for deflecting a plurality of electron beams towards substantially the same direction by desired amounts. The sub-deflecting unit 38 may be provided between the first coil 54 and the second coil 40.

The main deflecting unit 42 is preferably an electrostatic type deflector that can deflect a plurality of electron beams at high speed by using an electric field. More preferably, the main deflecting unit 42 has a cylindrical eight-electrode structure having four pairs of electrodes in which the electrodes of each pair are opposed to each other, or a structure including eight or more electrodes. Moreover, it is preferable that the coaxial lens 52 is provided to be closer to the wafer 44 than the multi-axis electron lens. In addition, although the third multi-axis electron lens 34 and the fourth multi-axis electron lens 36 are integrated with each other in this example, these lenses may be formed separately in an alternative example.

The controlling system 140 includes a general controller 130, a multi-axis electron lens controller 82, a coaxial lens controller 90, a main deflector controller 94, a backscattered electron processing unit 99, a wafer-stage controller 96 and an individual controller 120 which can control exposure parameters for each of the electron beams. The general controller 130 is, for example, a work station and can control the respective controllers included in the individual controller 120. The multi-axis electron lens controller 82 controls currents to be respectively supplied to the first multi-axis electron lens 16, the second multi-axis electron lens 24, the third multi-axis electron lens 34 and the fourth multi-axis electron lens 36. The coaxial electron lens controller 90 controls the number of currents to be supplied to the first and second coils 40 and 54 of the coaxial lens 52. The main deflector controller 94 controls a voltage to be applied to the main deflector 42. The backscattered electron processing unit 99 receives a signal based on the amount of backscattered electrons or secondary electrons detected in a backscattered electron detector 50 and notify the general controller 130 that the backscattered electron processing unit 99 received the signal. The wafer-stage controller 96 controls the wafer-stage driving unit 48 so as to move the wafer stage 46 to a predetermined position.

The individual controller 120 includes an electron beam controller 80 for controlling the electron beam generator 10, a shaping-deflector controller 84 for controlling the first and second shaping-deflecting units 18 and 20, a blanking electrode array controller 86 for controlling voltages to be applied to deflection electrodes included in the blanking electrode array 26, and a sub-deflector controller 98 for controlling voltages to be applied to electrodes included in the deflectors of the sub-deflecting unit 38.

Next, the operation of the electron beam exposure apparatus 100 in the present embodiment is described. First, the electron beam generator 10 generates a plurality of electron beams. The generated electron beams pass through the anode 13 to enter the slit-deflecting unit 15. The slit-deflecting unit 15 adjusts the incident positions on the slit cover 11 onto which the electron beams after passing through the anode 13 are incident.

The slit cover 11 can block a part of each electron beam so as to reduce the area of the electron beam to be incident on the first shaping member 14, thereby shaping the cross section of the electron beam to have a predetermined size. The thus shaped electron beams are then incident on the first shaping member 14 that further shapes the electron beams. Each of the electron beams after passing through the first shaping member 14 has a rectangular cross section in accordance with a corresponding one of the openings included in the first shaping member 14. The electron beams after passing through the first shaping member 14 are converged by the first multi-axis electron lens 16 independently of each other, so that for each of the electron beams the focus adjustment of the electron beam with respect to the second shaping member 22 is performed.

The first shaping-deflecting unit 18 deflects each of the electron beams having the rectangular cross sections independently of the other electron beams in order to make the electron beams incident on desired positions on the second shaping member 22. The second shaping-deflecting unit 20 further deflects the thus deflected electron beams independently of each other towards a direction approximately perpendicular to the second shaping member 22, thereby performing such an adjustment that the electron beams are incident on the desired positions of the second shaping member 22 approximately perpendicular to the second shaping member 22. The second shaping member 22 having a plurality of rectangular openings further shapes the electron beams incident thereon in such a manner that the electron beams have desired rectangular cross sections, respectively, when being incident on the wafer 44.

The second multi-axis electron lens 24 converges a plurality of electron beams independently of each other to perform the focus adjustment of the electron beam with respect to the blanking electrode array 26 for each electron beam. The electron beams that have been subjected to the focus adjustment by the second multi-axis electron lens 24 pass through a plurality of apertures of the blanking electrode array 26.

The blanking electrode array controller 86 controls whether or not voltages are applied to deflection electrodes provided in the vicinity of the respective apertures of the blanking electrode array 26. Based on the voltages applied to the deflection electrodes, the blanking electrode array 26 switches for each of the electron beams whether or not the electron beam is made incident on the wafer 44. When the voltage is applied, the electron beam passing through the corresponding aperture is deflected. Thus, the electron beam cannot pass through a corresponding opening of the electron beam blocking member 28, so that it cannot be incident on the wafer 44. When the voltage is not applied, the electron beam passing through the corresponding aperture is not deflected, so that it can pass through the corresponding opening of the electron beam blocking member 28. Thus, the electron beam can be incident on the wafer 44.

The third multi-axis electron lens 34 adjusts the rotation of the image of the electron beam to be incident on the wafer 44, which has not been deflected by the blanking electrode array 26. The fourth multi-axis electron lens 36 reduces the illumination diameter of each of the electron beams incident thereon. Among the electron beams that have passed through the third multi-axis electron lens 34 and the fourth multi-axis electron lens 36, only the electron beam to be incident onto the wafer 44 passes through the electron beam blocking member 28 so as to enter the sub-deflecting unit 38.

The sub-deflector controller 98 controls a plurality of deflectors included in the sub-deflecting unit 38 independently of each other. The sub-deflecting unit 38 deflects the electron beams incident on the deflectors independently of each other in such a manner that the deflected electron beams are incident on the desired positions on the wafer 44. The electron beams that have passed through the sub-deflecting unit 38 are subjected to the focus adjustment with respect to the wafer 44 by the coaxial lens 52 having the first and second coils 40 and 54, so as to be incident on the wafer 44.

During the exposure process, the wafer-stage controller 96 moves the wafer stage 48 in predetermined directions. The blanking electrode array controller 86 determines the apertures that allow the electron beams to pass and performs an electric-power control for the respective apertures based on exposure pattern data. By changing the apertures allowing the electron beams to pass there-through in accordance with the movement of the wafer 44 and then further deflecting the electron beams by the main deflecting unit 42 and the sub-deflecting unit 38, a desired circuit pattern can be transferred by exposing the wafer 44. The method for illuminating the wafer with the electron beams is described later referring to FIGS. 37, 38A and 38B.

The electron beam exposure apparatus 100 of the present embodiment converges a plurality of electron beams independently of each other. Thus, although a cross over is formed for each electron beam, all the electron beams as a whole do not have its cross over. Therefore, even in a case where the current density of each electron beam is increased, the electron beam error that may cause a shift of the focus or position of the electron beam due to coulomb interaction can be greatly reduced.

Figure 34A:
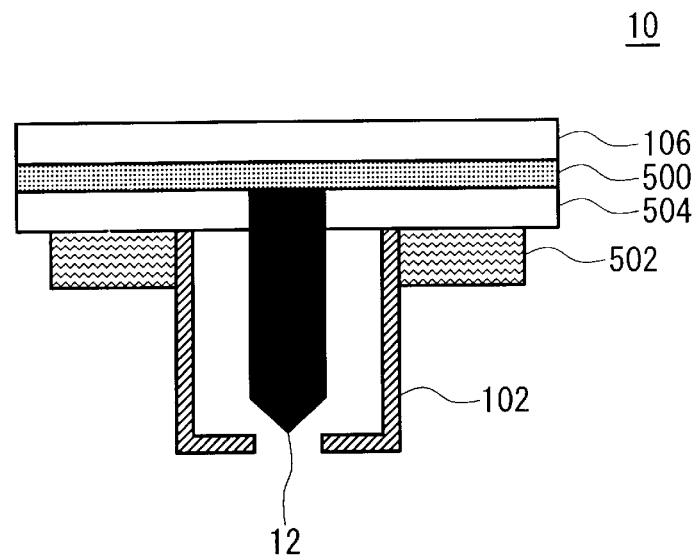
FIGS. 34A and 34B show an exemplary arrangement of the electron beam generator 10.
Figure 34B:
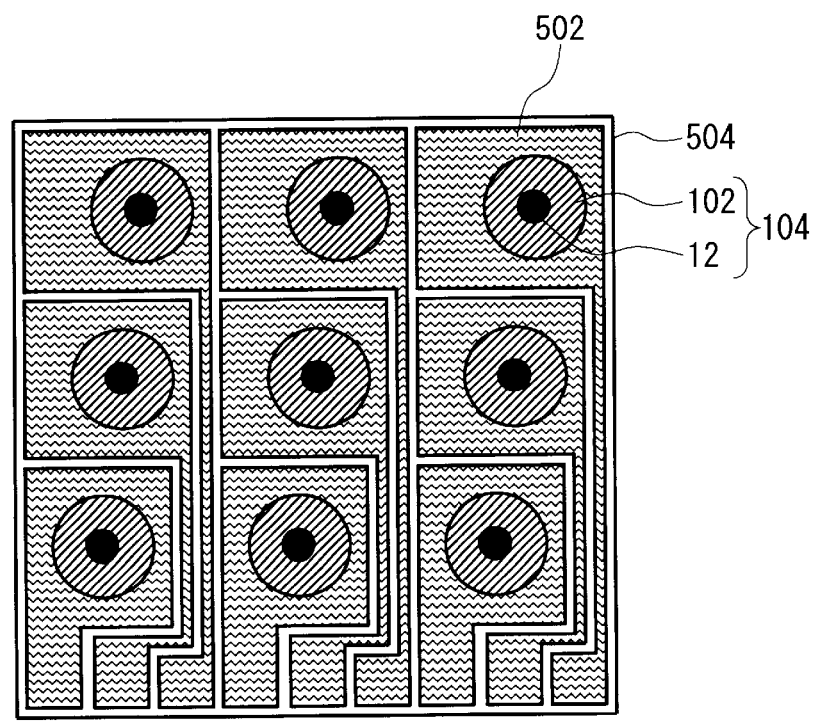

FIGS. 34A and 34B show an exemplary arrangement of the electron beam generator 10 shown in FIG. 33. FIG. 34A is a cross-sectional view of the electron beam generator 10. In this example, the electron beam generator 10 includes an insulator 106, cathodes 12 formed from material that can radiate thermoelectrons, such as tungsten or lanthanum hexaborane, grids 102 formed to surround the cathodes 12, respectively, a cathode wiring 500 for supplying currents to the cathodes 12, grid wirings 502 for applying voltages to the grids 102, and an insulation layer 504. In this example, the electron beam generator 10 forms an electron gun array by including a plurality of electron guns 104 on the insulator 106 at a constant interval.

It is preferable that the electron beam generator 10 includes a base power source (not shown), having an output voltage of about 50 kV, for example, that is commonly provided to the cathodes 12. The cathodes 12 are electrically connected to the base power source via the cathode wiring 500. The cathode wiring 500 is preferably formed of refractory metal, such as tungsten. In an alternative example, the electron beam generator 10 may include a base power source provided for each of the cathodes 12. In this case, the cathode wiring 500 is formed so as to electrically connect each cathode 12 to a corresponding base power source.

In this example, the electron beam generator 10 includes an individual power source (not shown) having an output voltage of about 200 V, for example, for each of the grid units, each including a plurality of grids 102. Each grid 102 is connected to the corresponding individual power source via the grid wiring 502. It is preferable that the grid wiring 502 is formed of refractory metal, such as tungsten. It is also desirable that the grids 102 and the grid wirings 502 are electrically insulated from the cathodes 12 and the cathode wiring 500 by the insulation layer 504. In this example, the insulation layer 504 is formed of insulating heat-resistant ceramics, such as aluminum oxide.

FIG. 34B is a view of the electron beam generator 10 seen from the wafer 44 (shown in FIG. 33). In the present example, the electron beam generator 10 forms an electron gun array by arranging a plurality of electron guns 104 at a predetermined interval on the insulator 106. It is preferable that the grid wirings 502 are formed on the insulation layer 504 so as to suppress the insulation layer 504 from being charged. More specifically, the grid wiring 502 is preferably formed on a straight line connecting the corresponding grid 102 and the insulation layer 504. The grid wirings 502 may be arranged so as not to cause a short-circuit between adjacent grid wirings 502, and preferably are arranged in such a manner that the adjacent grid wirings 502 are as close as possible without causing the short-circuit there-between.

In the present example, the electron beam generator 10 heats the cathodes 12 by supplying the currents to the cathodes 12 so as to generate thermoelectrons. A heating member, such as a carbon member, may be provided between the cathode 12 and the cathode wiring 500. By further applying a negative voltage of 50 kV to the cathode 12, a potential difference is generated between the cathode 12 and the anode 13 (shown in FIG. 33). The generated thermoelectrons are drawn from the electron guns by using the thus generated potential difference, thereby the electron beam is obtained by accelerating the thermoelectrons.

Then, the obtained electron beam is stabilized by applying a negative voltage of several hundred volts with respect to the potential of the cathode 12 to the grid 102 so as to adjust the amount of the thermoelectrons radiated toward the anode 13. It is preferable that the electron beam generator 10 adjusts the electron beam amount for each of the electron beams by applying the voltages to the grids 102 independently of each other by means of the individual power sources so as to adjust the amount of the thermoelectrons radiated towards the anode 13. In an alternative example, the slit cover 11 (shown in FIG. 33) may be used as the anode.

Alternatively, the electron beam generator 10 may include a field emission device to generate the electron beams. Moreover, it is preferable that the electron beam generator 10 always generates the electron beams for a period of the exposure process, since it takes a predetermined time for the electron beam generator 10 to generate the electron beams that are stabilized.

Figure 35A:
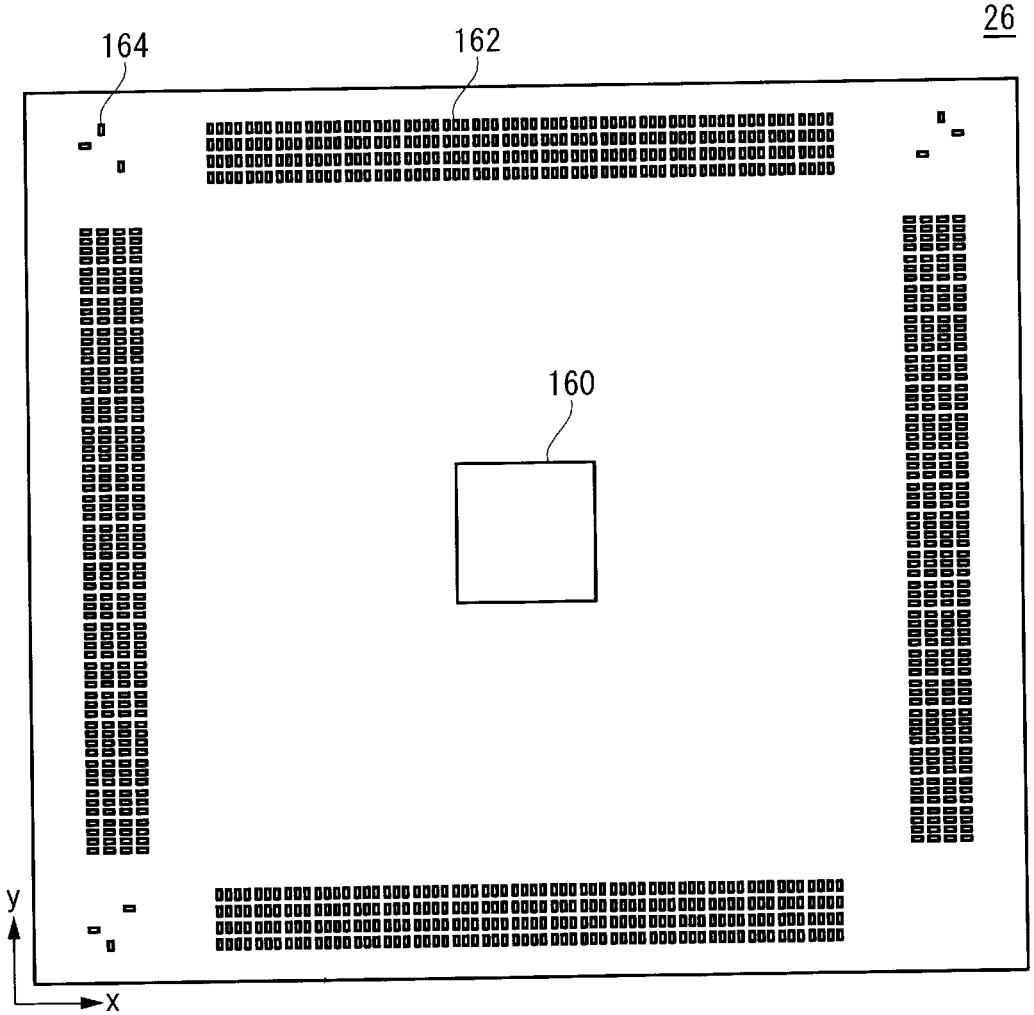
FIGS. 35A and 35B show an exemplary arrangement of the blanking electrode array 26.
Figure 35B:
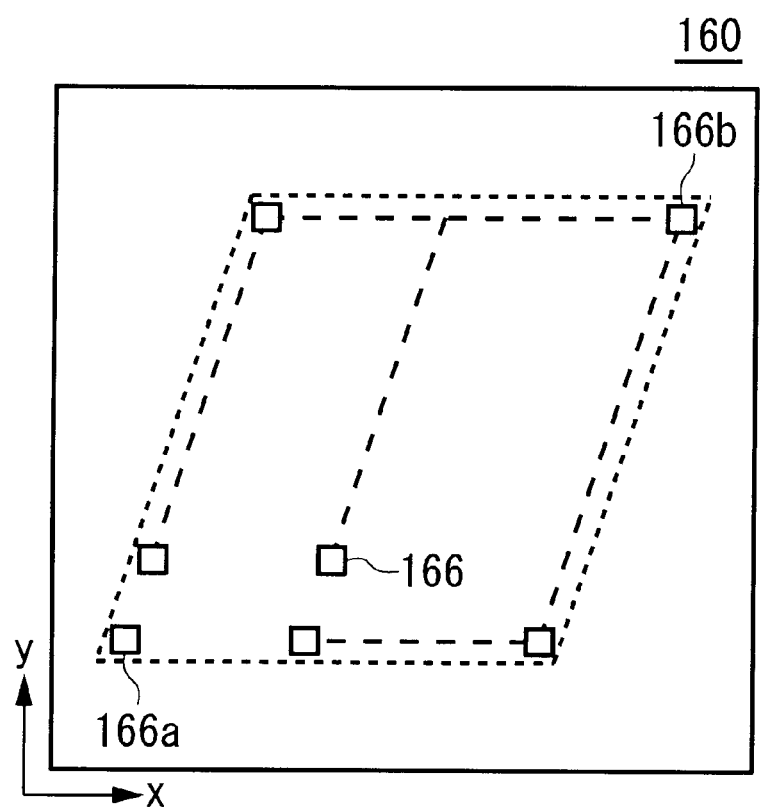

FIGS. 35A and 35B show an exemplary arrangement of the blanking electrode array 26 shown in FIG. 33. FIG. 35A is an entire view of the blanking electrode array 26. The blanking electrode array 26 includes an aperture part 160 having a plurality of apertures through which the electron beams pass, and deflecting electrode pads 162 and grounded electrode pads 164 both of which are used as connectors with the blanking electrode array controller 86 shown in FIG. 33. It is desirable that the aperture part 160 is arranged at the center of the blanking electrode array 26. To the deflecting electrode pads 162 and the grounded electrode pads 164, electric signals are supplied from the blanking electrode array controller 86 via a probe card or a pogo pin array.

FIG. 35B is a top view of the aperture part 160. In FIG. 35B, the horizontal direction of the aperture part 160 is represented with an x-axis while the vertical direction thereof is represented with a y-axis. The x-axis corresponds to a direction in which the wafer stage 46 (shown in FIG. 33) moves the wafer 44 in a graded manner during the exposure process, while the y-axis corresponds to a direction in which the wafer stage 46 moves the wafer 44 continuously. More specifically, with respect to the wafer stage 46, the y-axis corresponds to a direction in which the wafer 44 is scanned to be exposed while the x-axis corresponds to a direction in which the wafer 44 is moved in a graded manner for exposing an area of the wafer 44 that has not been exposed after the scanning exposure has been completed.

The aperture part 160 includes the apertures 166. The apertures 166 are arranged so as to allow all scanned areas to be exposed. In the example shown in FIG. 35B, the apertures are formed so as to cover the entire area between the apertures 166a and 166b positioned at both ends of the x-axis. The apertures 166 adjacent to each other in the x-axis direction are preferably arranged at a constant interval. In this case, referring to FIG. 33, it is preferable to determine the interval between the adjacent apertures 166 to be equal to or less than the maximum deflection amount by which the main deflecting unit 42 deflects the electron beam.

Figure 36A:
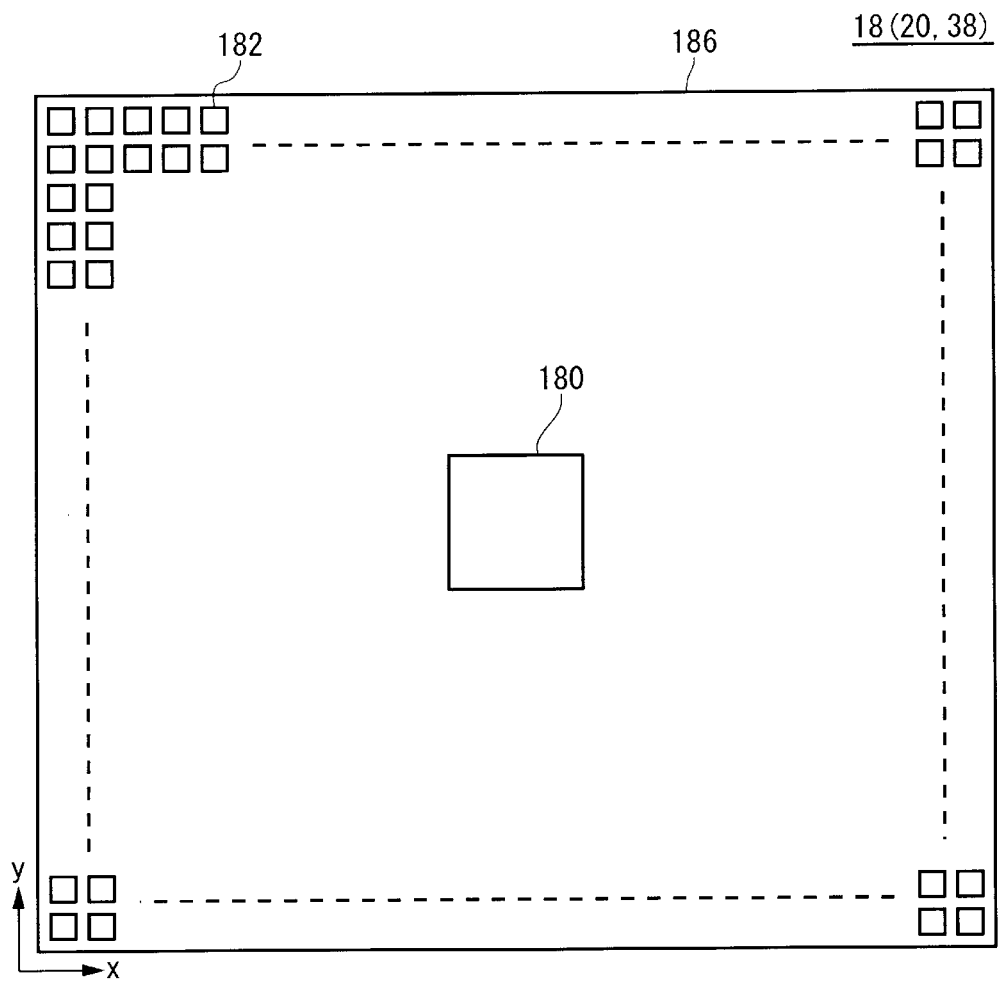
FIGS. 36A and 36B shows an exemplary arrangement of the first shaping-deflecting unit 18.
Figure 36B:
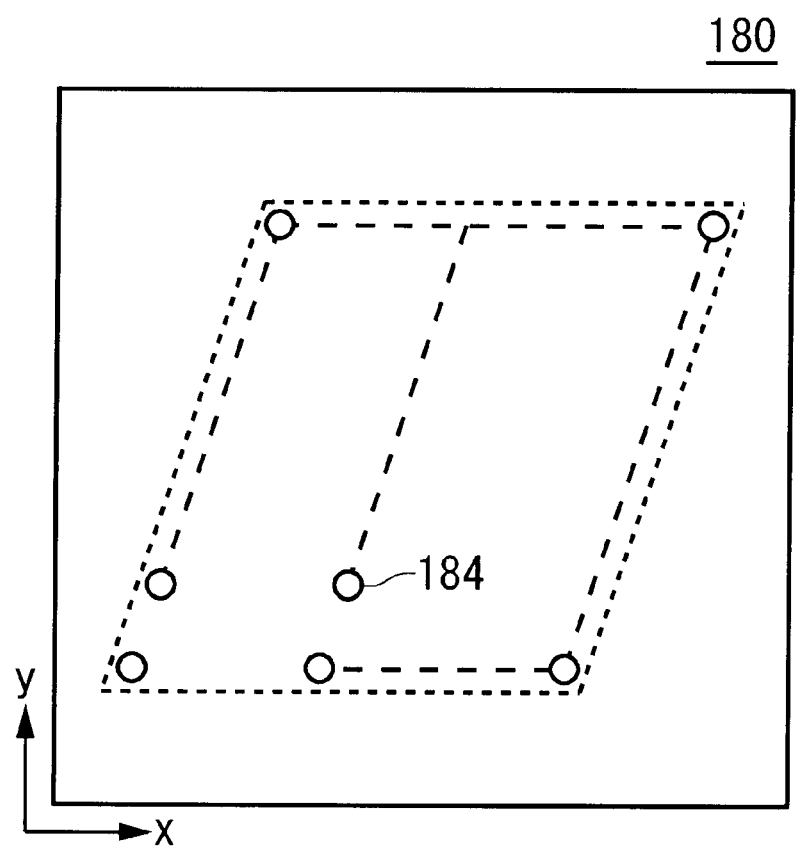

FIGS. 36A and 36B shows an exemplary arrangement of the first shaping-deflecting unit 18. FIG. 36A is an entire view of the first shaping-deflecting unit 18. Please note that the second shaping-deflecting unit 20 and the sub-deflecting unit 38 have the same structure as that of the first shaping-deflecting unit 18. Thus, in the following description, the structure of the deflecting unit is described based on the structure of the first shaping-deflecting unit 18 as a typical example.

The first shaping-deflecting unit 18 includes a substrate 186, a deflector array 180 and deflecting electrode pads 182 provided on the substrate 186. The deflector array 180 is provided at the center of the substrate 186, while the deflecting electrode pads 182 are provided in the peripheral region of the substrate 186. The deflector array 180 includes a plurality of deflectors each formed by a plurality of deflecting electrodes and an opening. The deflecting electrode pads 182 are electrically connected to the shaping-deflector controller 84 by being connected to a probe card, for example.

FIG. 36B shows the deflector array 180. The deflector array 180 includes the deflectors 184 for deflecting the electron beams, respectively. In FIG. 36B, the horizontal direction of the deflector array 180 is represented with an x-axis. The vertical direction thereof is represented with a y-axis. The x-axis corresponds to a direction in which the wafer stage 46 moves the wafer 44 in a graded manner during the exposure process, while the y-axis corresponds to a direction in which the wafer stage 46 moves the wafer 44 continuously during the exposure process. More specifically, with respect to the wafer stage 46, the y-axis is a direction in which the wafer 44 is scanned to be exposed, while the x-axis is a direction in which the wafer 44 is moved in a graded manner after the scanning exposure has been completed, in order to expose an area of the wafer 44 that has not been exposed.

It is preferable that the deflectors 184 adjacent to each other in the x-axis direction are arranged at a constant interval. In this case, referring to FIG. 33, it is preferable to determine the interval between the deflectors 184 to be equal to or less than the maximum deflection amount by which the main deflecting unit 42 deflects the electron beam. With reference to FIG. 35B, the deflectors 184 of the deflector array 180 are provided to correspond to the apertures of the blanking electrode array 26, respectively.

In conventional techniques, the coaxial lens has been used in order to reduce the beam size. The size-reducing coaxial lens reduces the diameter of the electron beam incident thereon and also converges a plurality of electron beams so as to reduce the interval between the electron beams. Thus, in accordance with the conventional techniques, especially, the interval between the adjacent electron beams reaching the sub-deflecting unit 38 is very small, and therefore it is hard to form the deflector 184 for each of the electron beams.

According to the present invention, the multi-axis electron lens is used. Thus, after the electron beams have passed through the multi-axis electron lens for reducing the electron beams, the interval between the adjacent electron beams is not reduced although the diameter of each of the electron beams is reduced. That is, the interval between the adjacent electron beams is sufficient even after the electron beams are reduced, it is possible to easily arrange the deflectors 184 having deflection abilities that can deflect the electron beams by desired amounts at positions in the deflector array 180 that provide a satisfactory deflection efficiency.

Figure 37:
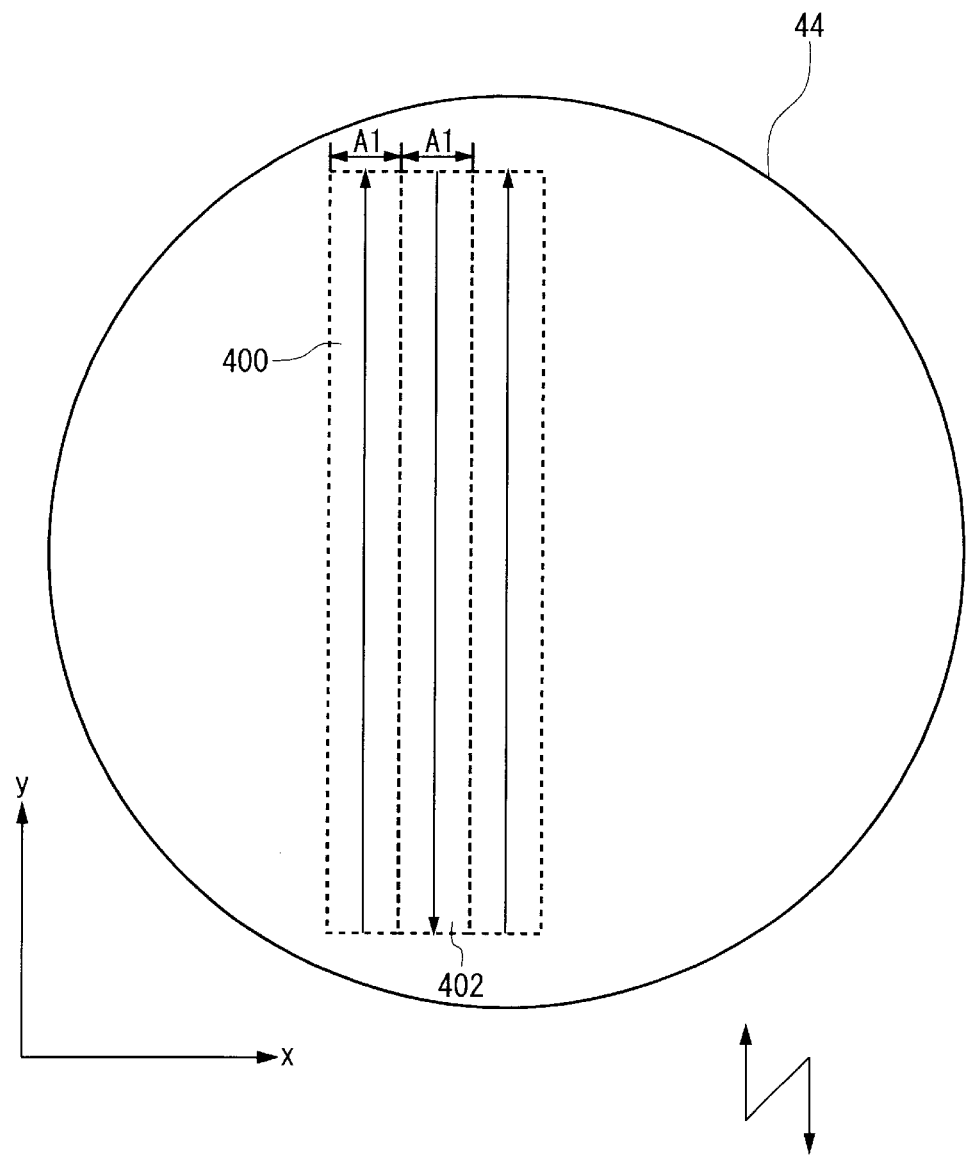
FIG. 37 illustrates an exposure operation for a wafer 44 on the electron beam exposure apparatus 100 according to the second embodiment.

FIG. 37 is a drawing for explaining the exposure operation for the wafer 44 on the electron beam exposure apparatus 100 according to the present embodiment. First, the operation of the wafer stage 46 during the exposure process is described. In FIG. 37, the horizontal direction of the wafer 44 is represented with an x-axis while the vertical direction thereof is represented with a y-axis. An exposure width A1 is a width that can be exposed without moving the wafer stage 46 in the x-axis direction, and corresponds to an interval of the apertures 166 of the blanking electrode array 26 that are adjacent to each other in the x-axis direction, referring to FIG. 35. With reference to FIG. 33, the shaping-deflector controller 84 controls the shape of the electron beam to be incident, while the blanking electrode array controller 86 controls whether or not the electron beam is to be incident onto the wafer 44. Then, the wafer-stage controller 92 moves the wafer stage 46 in the y-axis direction, while the main deflector controller 94 and the sub-deflector controller 92 control the positions of the wafer 44 to be illuminated with the electron beams, thereby a first exposure area 400 having the exposure width A1 can be exposed. After the first exposure area 400 has been exposed, the wafer stage 46 is moved in the x-direction by the amount corresponding to the exposure width A1 and then starts to be moved in a direction opposite to the direction in which the wafer stage 46 is moved for exposing the first exposure area 400, so that a second exposure area 402 can be exposed. By repeating the above-mentioned exposure operation for the entire surface of the wafer 44, a desired exposure pattern can be exposed onto the entire surface of the wafer 44. In the example shown in FIG. 37, a single scan performs the exposure from one end to another end of the wafer 44. Alternatively, only a part of the surface of the wafer 44 may be exposed by the single scan.

Figure 38A:
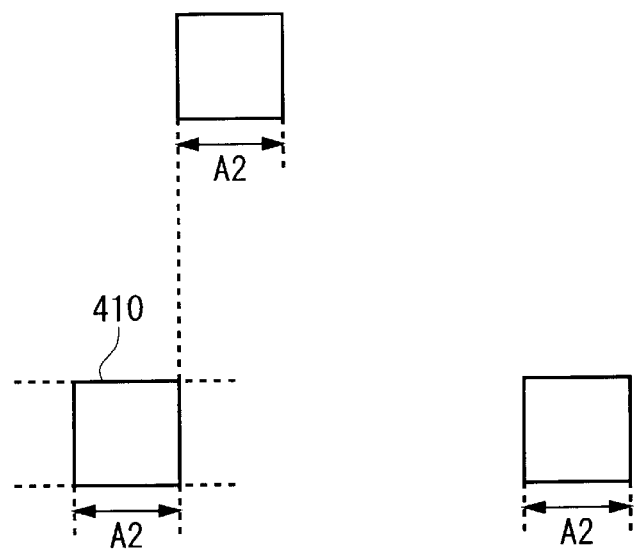
FIGS. 38A and 38B schematically show deflection operations of the main deflecting unit 42 and the sub-deflecting unit 38 in the exposure process.
Figure 38B:
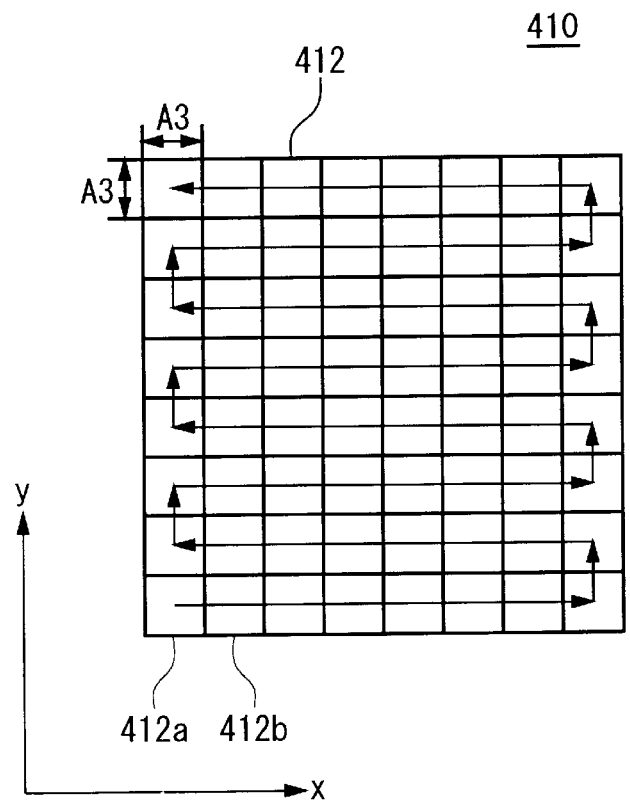

FIGS. 38A and 38B schematically show deflection operations of the main deflecting unit 42 and the sub-deflecting unit 38 in the exposure process. FIG. 38A shows a main deflection area 410 of the wafer 44 is to be exposed mainly by the deflection operation of the main deflecting unit 42. One side A2 of the main deflection area 410 corresponds to the amount by which the main deflecting unit 42 deflects the electron beam during the exposure process. It is preferable that the main deflection areas 410 adjacent to each other in the x-direction are arranged to be in contact with each other. However, the main deflection areas 410 may be arranged in such a manner that at least one of the main deflection areas 410 overlaps the other main deflection area 410 in the x-direction.

FIG. 38B schematically shows an exposing operation for exposing the deflection area 410 by the electron beams. One side A3 of a sub-deflection area 412 of the wafer 44 which is exposed by the deflection operation of the sub-deflecting unit 38 corresponds to the amount by which the sub-deflecting unit 38 can deflect the electron beams during the exposure process. In the present example, the main deflection area 410 is eight times as large as the sub-deflection area 412.

The sub-deflection area 412a is exposed by the deflection operation of the sub-deflecting unit 38 to have a desired exposure pattern. After the exposure for the sub-deflecting area 412 has been completed, the main deflecting unit 42 moves the electron beams to the sub-deflection area 412b. The sub-deflection area 412b is then exposed by the deflection operation of the sub-deflecting unit 38 to have a desired exposure pattern. Similarly, the deflection operations of the main deflecting unit 42 and the sub-deflecting unit 38 are repeated along an arrow in FIG. 38B so as to expose desired exposure patterns, thereby the exposure for the main deflection area 410 is completed.

Figure 39:
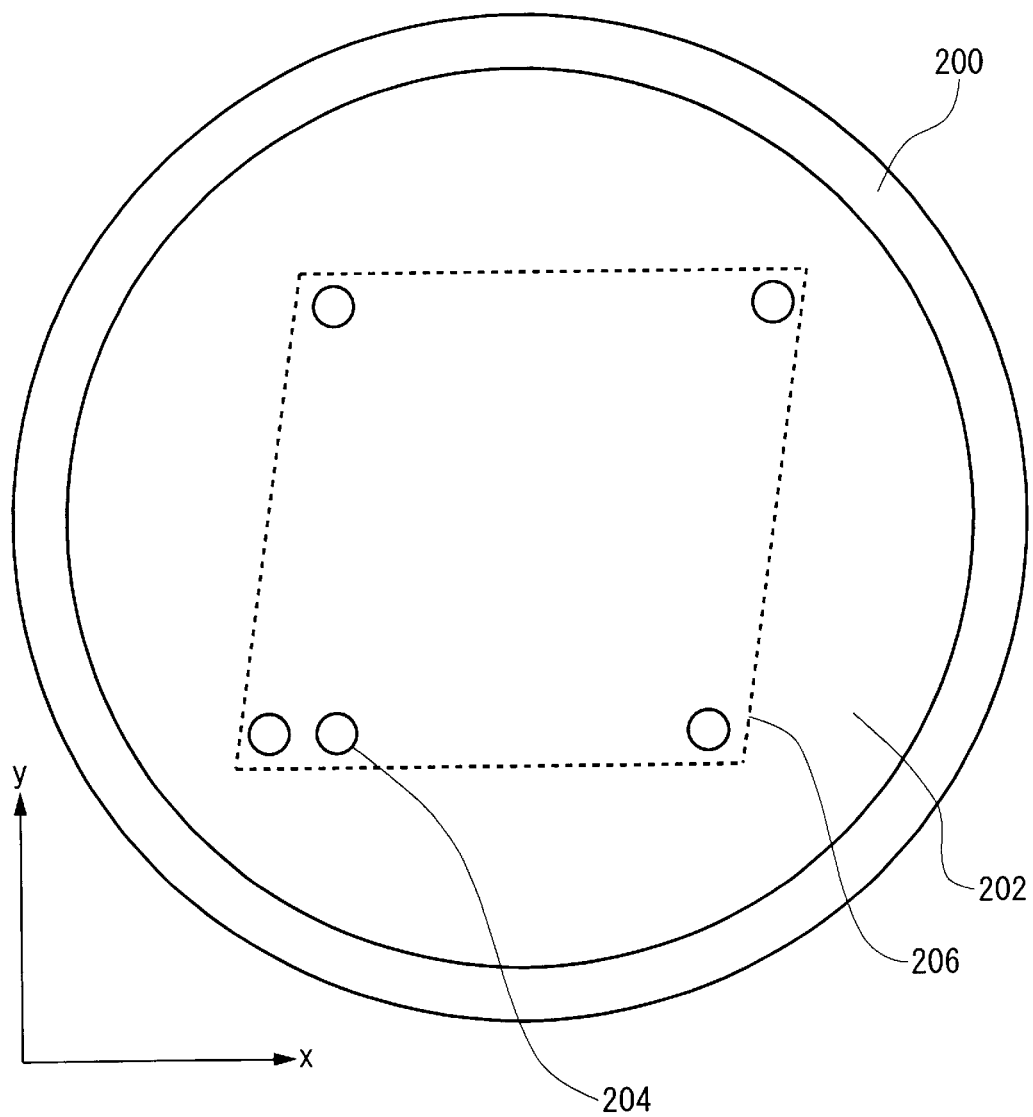
FIG. 39 shows an example of the first multi-axis electron lens 16.

FIG. 39 shows an example of the first multi-axis electron lens 16. Please note that the second, third and fourth multi-axis electron lenses 24, 34 and 36 have the same structure as that of the first multi-axis electron lens 16. Therefore, the structure of the multi-axis electron lens is described based on the first multi-axis electron lens 16 as a typical example in the following description.

The first multi-axis electron lens 16 includes a coil part 200 for generating a magnetic field and a lens part 202. The lens part 202 includes lens openings 204 allowing the electron beams to pass there-through, respectively, and a lens region 206 where the lens openings 204 are provided. The y-axis of the lens region 206 corresponds to the scanning direction of the wafer stage 46 (shown in FIG. 33), while the x-axis thereof corresponds to the direction in which the wafer stage 46 is moved in a graded manner.

The lens openings 204 are arranged in such a manner that x-coordinates of centers of the respective lens openings 204 have a constant interval, and preferably have an interval corresponding to the amount by which the main deflecting unit 42 deflects the electron beam when the wafer 44 is exposed by the electron beam, referring to FIG. 33. More specifically, it is preferable that the lens openings 204 are arranged to correspond to the apertures 166 of the blanking electrode array 26 and the positions of the deflectors 184 included in the deflector array 180, respectively, referring to FIGS. 35A to 36B. Moreover, the lens part 202 preferably includes at least one dummy opening 205 described with reference to FIGS. 8–11.

Figure 40A:
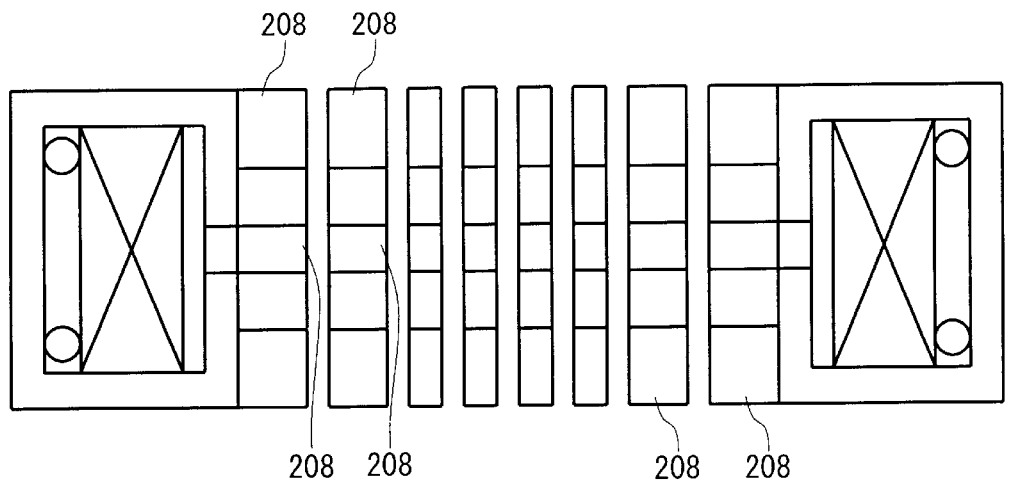
FIGS. 40A and 40B show examples of the cross section of the first multi-axis electron lens 16.
Figure 40B:
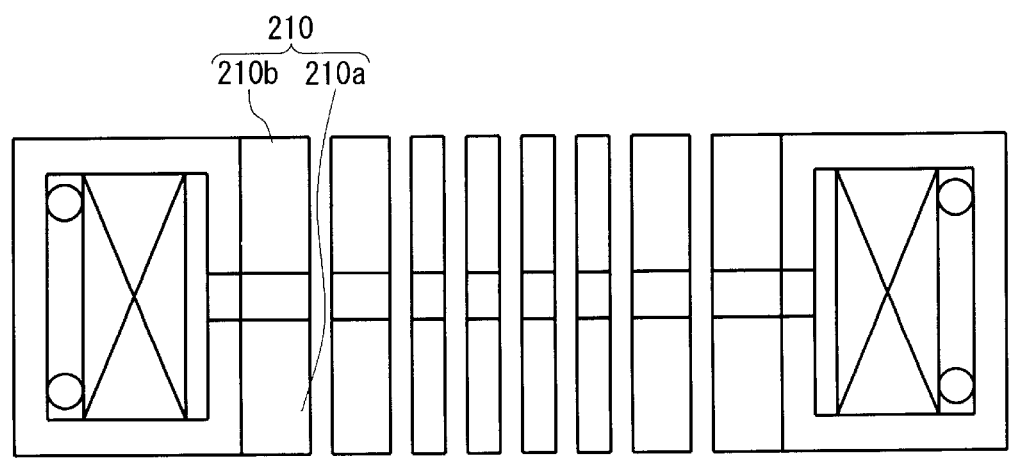

FIGS. 40A and 40B show examples of the cross section of the first multi-axis electron lens 16. As shown in FIG. 40A, the lens part 202 may include non-magnetic conductive members 208 to interpose lens magnetic conductive members 210. Moreover, the lens magnetic conductive members 210 may be made thicker, as shown in FIG. 40B. In this case, coulomb force generated between the adjacent electron beams can be blocked more strongly. In this example, the lens magnetic conductive member 210 maybe made thicker in such a manner that the surfaces of the lens part 202 are positioned on substantially the same place as that the surfaces of the coil part 200, as shown in FIG. 40B. Alternatively, the lens magnetic conductive member 210 may be formed to be thicker so that the lens part 202 is thicker than the coil part 200.

Figure 41:
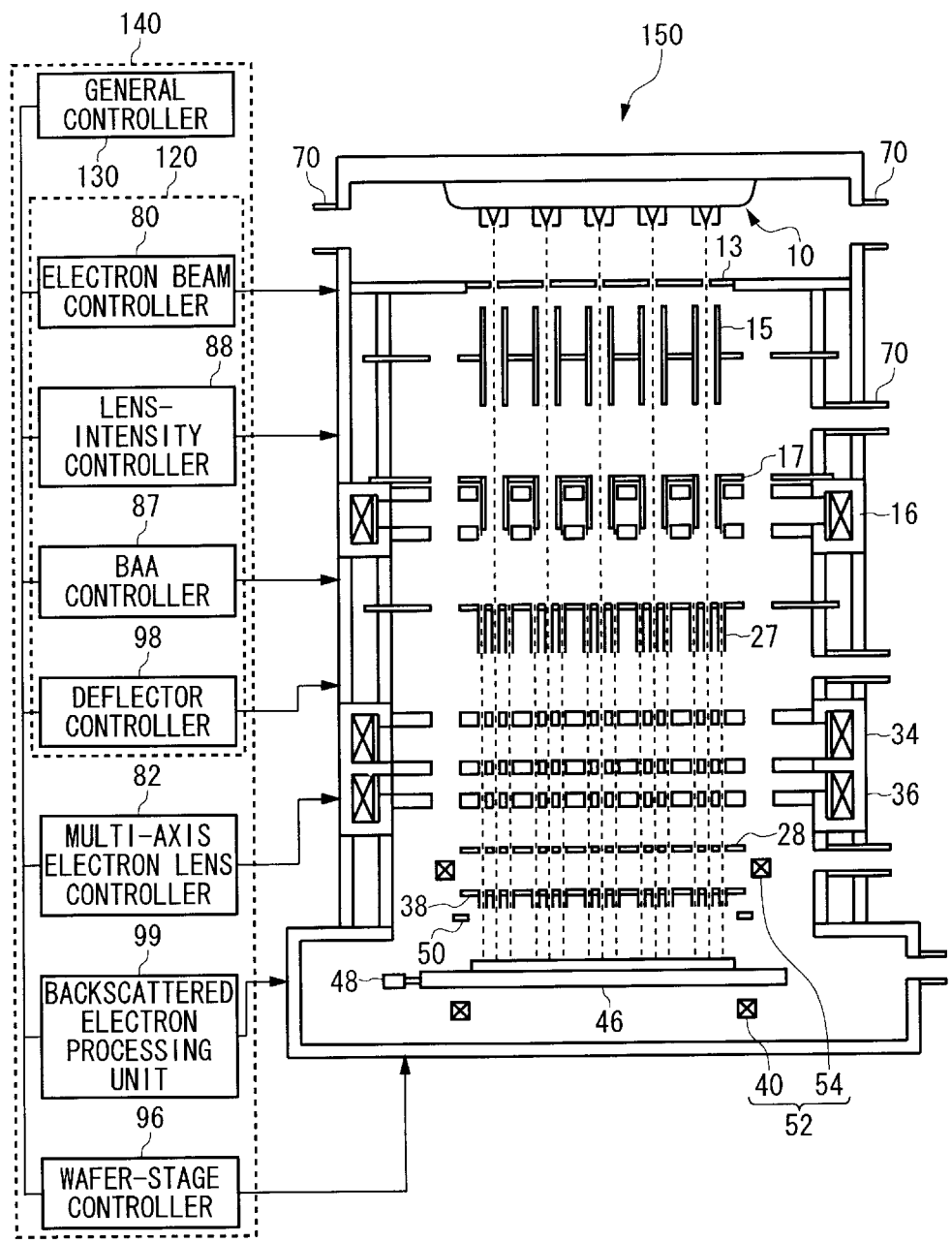
FIG. 41 shows an electron beam exposure apparatus 100 according to still another embodiment of the present invention.

FIG. 41 shows an electron beam exposure apparatus 100 according to another embodiment of the present invention. The electron beam apparatus 100 includes a blanking aperture array (BAA) device 27 in place of the blanking electrode array 26 included in the electron beam exposure apparatus shown in FIG. 1. Moreover, the electron beam exposure apparatus 100 of the present embodiment includes electron lenses and deflecting units having the same functions and operations as those of the electron lenses and deflecting units provided in the electron beam exposure apparatus shown in FIG. 33, thereby illuminating the wafer with the electron beams divided by the BAA device 27 (that are divided by shaping members). The components labeled with the same reference numerals in the electron beam exposure apparatus shown in FIG. 41 may have the same structures and functions as those shown in FIG. 1 and/or FIG. 33. In the following description, the structures, operations and functions that are different from those of the electron beam exposure apparatuses shown in FIGS. 1 and 33 are described.

The electron beam exposure apparatus 100 includes the exposure unit 150 for performing a predetermined exposure process using electron beams for a wafer 44, and a controlling system 140 for controlling operations of the respective components included in the exposure unit 150.

The exposure unit 150 includes: a body 80 provided with a plurality of exhaust holes 70; an electron beam shaping unit which can emit a plurality of electron beams and shape a cross-sectional shape of each electron beam into a desired shape; an illumination switching unit which can switch for each electron beam independently whether or not the electron beam is cast onto the wafer 44; and an electron optical system including a wafer projection system which can adjust the orientation and size of a pattern image transferred onto the wafer 44. In addition, the exposure unit 150 includes a stage system having a wafer stage 46 on which the wafer 44 onto which the pattern is to be transferred by exposure can be placed and a wafer-stage driving unit 48 which can drive the wafer stage 46.

The electron beam shaping unit includes an electron beam generator 10 which can generate a plurality of electron beams, an anode 13 which allows the generated electron beams to be radiated, a slit deflecting unit 15 for deflecting the electron beams after passing through the anode 13 independently of each other, a first multi-axis electron lens 16 which can converge the electron beams to adjust focal points of the electron beams independently of each other, a first lens-intensity adjuster 17 which can adjust the lens intensity of the first multi-axis electron lens 16 for each of the electron beams independently of the other electron beams, and the BAA device 27 for dividing the electron beams that have passed through the first multi-axis electron lens 16.

The illumination switching unit includes the BAA device 27 that switches for each of the electron beams whether or not the electron beam is to be incident on the wafer 44, and an electron beam blocking member 28 that has a plurality of openings allowing the electron beams to pass there-through and can block the electron beams deflected by the BAA device 27. In this example, the BAA device 27 serves as a component of the electron beam shaping unit for shaping the cross-sectional shapes of the electron beams incident thereon and a component of the illumination switching unit. The openings included in the electron beam blocking member 28 may have cross-sectional shapes each of which becomes wider along the illumination direction of the electron beams in order to allow the electron beams to efficiently pass.

The wafer projection system includes: a third multi-axis electron lens 34 which can adjust the rotations of the electron beams to be incident onto the wafer 44; a fourth multi-axis electron lens 36 which can converge a plurality of electron beams independently of each other and adjust the reduction ratio of each electron beam to be incident onto the wafer 44; a deflecting unit 60 which can deflect a plurality of electron beams independently of each other to direct desired portions on the wafer 44; and a coaxial lens 52 which has a first coil 40 and a second coil 54 and can serve as an objective lens for the wafer 44 by converging a plurality of electron beams independently of each other. In this example, it is preferable that the coaxial lens 52 is arranged to be closer to the wafer 44 than the multi-axis electron lens. Moreover, although the third multi-axis electron lens 34 and the fourth multi-axis electron lens 36 are integrated with each other in this example, they may be formed as separate components in an alternative example.

The controlling system 140 includes a general controller 130, a multi-axis electron lens controller 82, a coaxial lens controller 90, a backscattered electron processing unit 99, a wafer-stage controller 96 and an individual controller 120 which can control exposure parameters for each of the electron beams. The general controller 130 is, for example, a work station and can control the respective controllers included in the individual controller 120. The multi-axis electron lens controller 82 controls currents to be respectively supplied to the first, third and fourth multi-axis electron lenses 16, 34 and 36. The coaxial electron lens controller 90 controls the amounts of currents to be supplied to the first and second coils 40 and 54 of the coaxial lens 52. The backscattered electron processing unit 99 receives a signal based on the amount of backscattered electrons or secondary electrons detected in a backscattered electron detector 50 and notify the general controller 130 that the backscattered electron processing unit 99 received the signal. The wafer-stage controller 96 controls the wafer-stage driving unit 48 so as to move the wafer stage 46 to a predetermined position.

The individual controller 120 includes an electron beam controller 80 for controlling the electron beam generator 10, a lens-intensity controller 88 for controlling the lens-intensity adjuster 17, a BAA device controller 87 for controlling voltages to be applied to deflection electrodes included in the BAA device 27 and a deflector controller 98 for controlling voltages to be applied to electrodes included in the deflectors of the deflecting unit 60.

Next, the operation of the electron beam exposure apparatus 100 in the present embodiment is described. First, the electron beam generator 10 generates a plurality of electron beams. The generated electron beams pass through the anode 13 to enter the slit deflecting unit 15. The slit deflecting unit 15 adjusts the incident positions on the BAA device 27 onto which the electron beams after passing through the anode 13 are incident.

The first multi-axis electron lens 16 converges the electron beams after passing through the slit deflecting unit 15 independently of each other, thereby the focus adjustment of the electron beam with respect to the BAA device 27 can be performed for each electron beam. The first lens-intensity adjuster 17 adjusts the lens intensity in each lens opening of the first multi-axis electron lens 16 in order to correct the focus position of the corresponding electron beam incident on the lens opening. The electron beams after passing through the first multi-axis electron lens 16 is incident on a plurality of aperture parts provided in the BAA device 27.

The BAA device controller 87 controls whether or not voltages are applied to deflection electrodes provided in the vicinity of the respective apertures of the BAA device 27. Based on the voltages applied to the deflection electrodes, the BAA device 27 switches for each of the electron beams whether or not the electron beam is to be incident on the wafer 44. When the voltage is applied, the electron beam passing through the corresponding aperture is deflected. Thus, the deflected electron beam cannot pass through a corresponding opening of the electron beam blocking member 28, so that it cannot be incident on the wafer 44. When the voltage is not applied, the electron beam passing through the corresponding aperture is shaped in the BAA device 27 without being deflected, so that it can pass through the corresponding opening of the electron beam blocking member 28. Thus, the electron beam can be incident on the wafer 44.

The electron beam that has not been deflected by the BAA device 27 passes through the electron beam blocking member 28 to be incident on the third multi-axis electron lens 34. The third multi-axis electron lens 34 then adjusts the rotation of the electron beam image to be incident on the wafer 44. Moreover, the fourth multi-axis electron lens 36 reduces the illumination diameter of the electron beam incident thereon.

The deflector controller 98 controls a plurality of deflectors included in the deflecting unit 60 independently of each other. The deflecting unit 60 deflects the electron beams incident on the deflectors independently of each other, in such a manner that the deflected electron beams are incident on the desired positions on the wafer 44. The electron beams after passing through the deflecting unit 60 are subjected to the focus adjustment with respect to the wafer 44 by the coaxial lens 52 having the first and second coils 40 and 54, respectively, so as to be made incident on the wafer 44.

During the exposure process, the wafer-stage controller 96 moves the wafer stage 48 in predetermined directions. The BAA device controller 87 determines the apertures that allow the electron beams to pass there-through and performs an electric-power control for the respective apertures. In accordance with the movement of the wafer 44, the apertures allowing the electron beams to pass there-through are changed and the electron beams after passing through the apertures are deflected by the deflecting unit 60. In this way, the wafer 44 is exposed to have a desired circuit pattern transferred.

The electron beam exposure apparatus 100 of the present embodiment converges a plurality of electron beams independently of each other. Thus, although a cross over is formed for each electron beam, all the electron beams as a whole do not have a cross over. Therefore, even in a case where the current density of each electron beam is increased, the electron beam error that may cause a shift of the focus or position of the electron beam due to coulomb interaction can be greatly reduced.

Figure 42A:
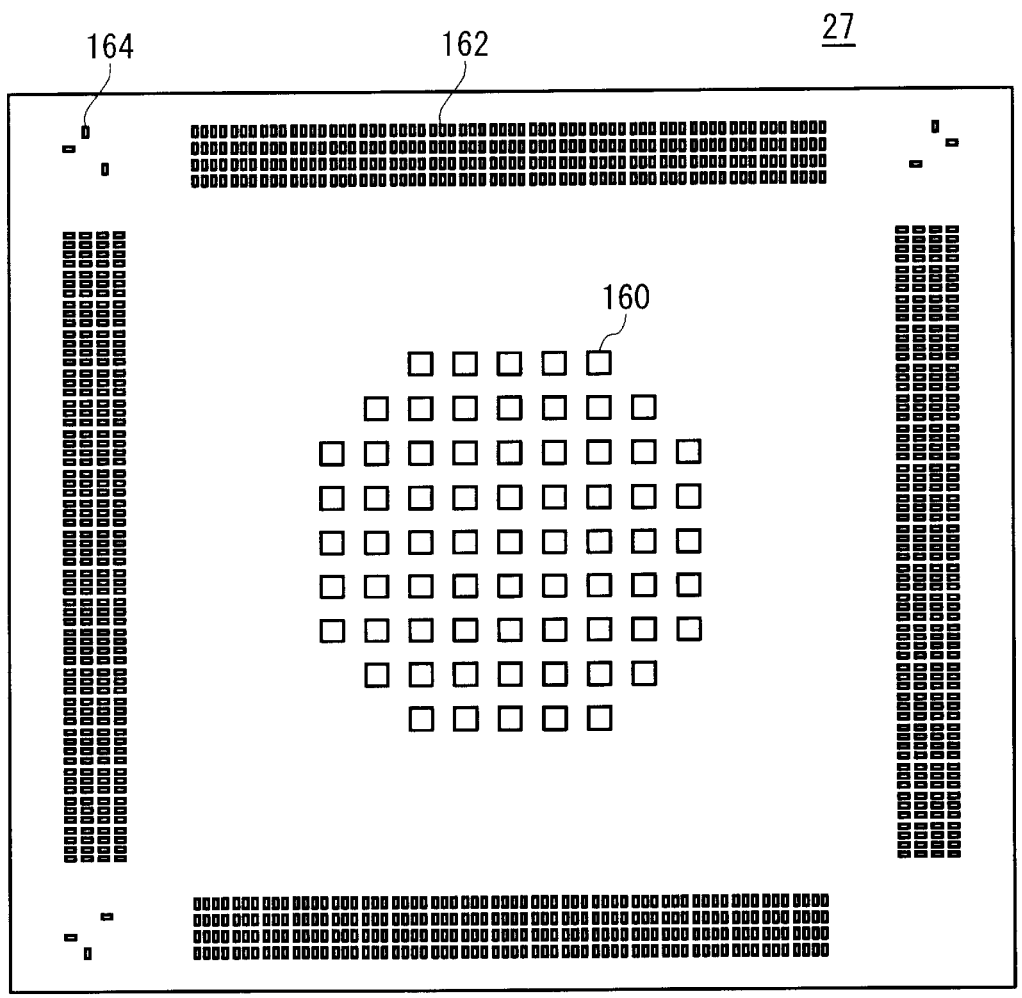
FIGS. 42A and 42B show an exemplary arrangement of the BAA device 27.
Figure 42B:
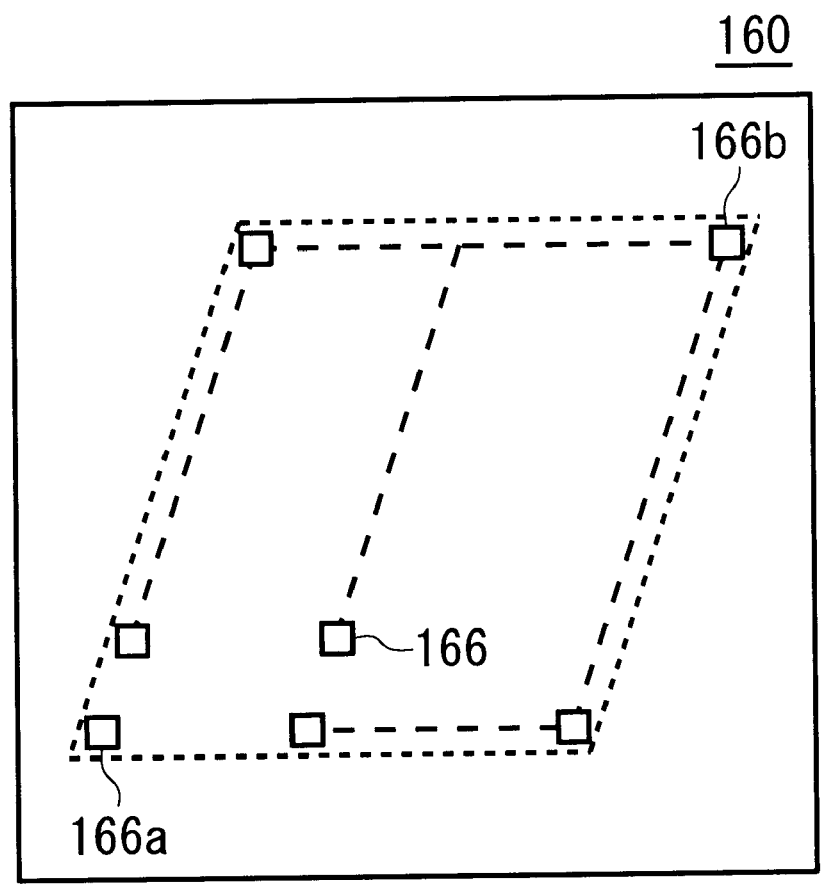

FIGS. 42A and 42B show an exemplary arrangement of the BAA device 27. As shown in FIG. 42A, the BAA device 27 includes a plurality of aperture parts 160 each having a plurality of apertures 166 allowing the electron beams to pass, and deflecting electrode pads 162 and grounded electrode pads 164 both of which are used as connectors with the BAA controller 87 shown in FIG. 41. It is desirable that each pf the aperture parts 160 and the corresponding lens opening of the first multi-axis electron lens 16 are arranged coaxially. Also, it is preferable that the BAA device 27 includes at least one dummy opening 205 (see FIG. 41) through which no electron beam passes provided in the surrounding area of the aperture parts 160. In this case, the inductance of the exhaustion in the body 8 can be reduced, allowing the efficient reduction of the pressure in the body 8.

FIG. 42B is a top view of the aperture part 160. As described above, the aperture part 160 includes a plurality of apertures 166. It is preferable that the aperture 166 has a rectangular shape. The electron beam incident on each aperture part 160 is divided and shaped so that the divided electron beams have cross-sectional shapes in accordance with the shapes of apertures 166. As described above, since the electron beam exposure apparatus 100 of the present embodiment includes the BAA device 27, the electron beam exposure apparatus 100 can divide each of the electron beams generated by the electron beam generator 10 into a plurality of beams so that the wafer 44 is exposed by the divided electron beams. Thus, it is possible to make a number of electron beams incident on the wafer 44, thereby it takes an extremely short time to expose the pattern onto the wafer 44.

Figure 43A:
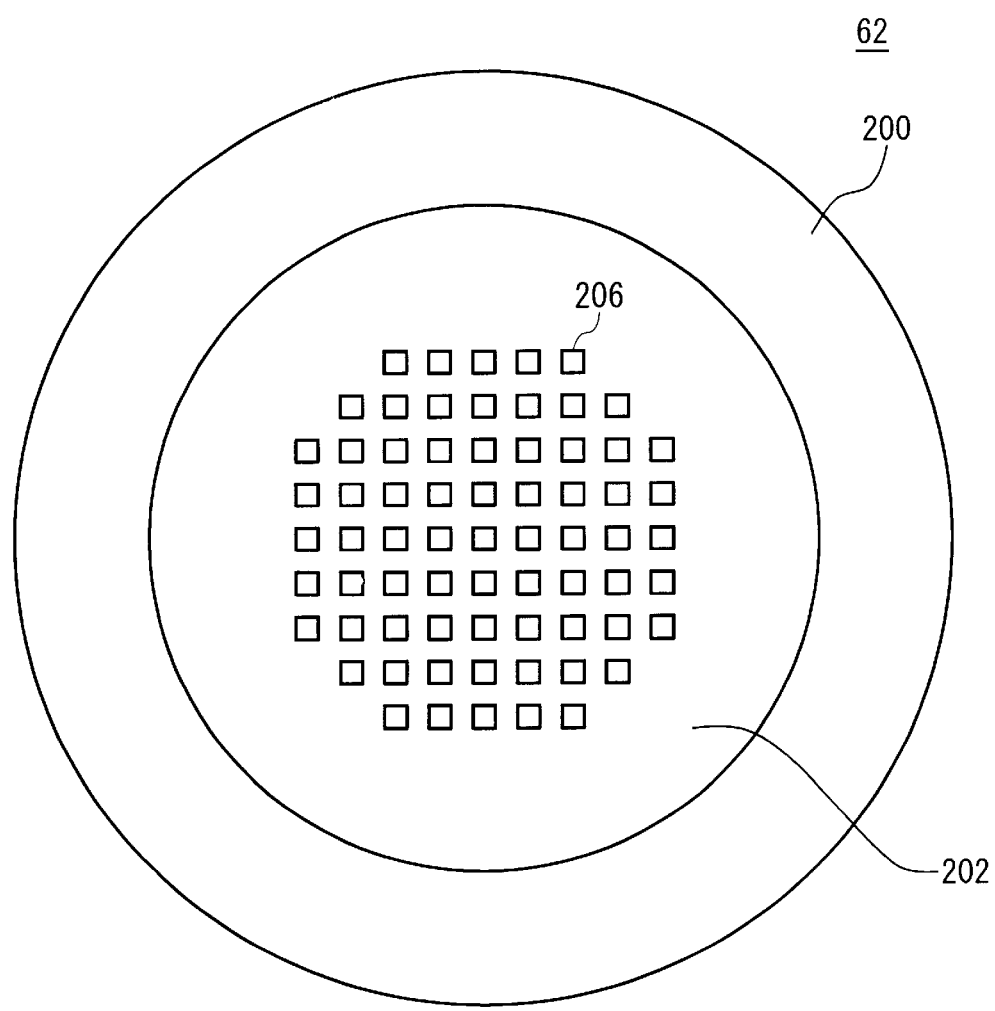
FIGS. 43A and 43B show the third multi-axis electron lens 34.

FIG. 43A is a top view of the third multi-axis electron lens 34. Please note that the fourth multi-axis electron lens 36 may have the same structure as that of the third multi-axis electron lens 34. Therefore, in the following description, the structure of the third multi-axis electron lens 34 is described as a typical example.

As shown in FIG. 43A, the third multi-axis electron lens 34 includes a coil part 200 for generating a magnetic field and a lens part 202. The lens part 202 has a plurality of lens regions 206 in each of which a plurality of lens openings through which the electron beams pass are provided. It is desirable to coaxially arrange the lens region 206 of the lens part 202, the corresponding lens opening of the first multi-axis electron lens 16 and the corresponding aperture part 160 of the BAA device 27.

Figure 43B:
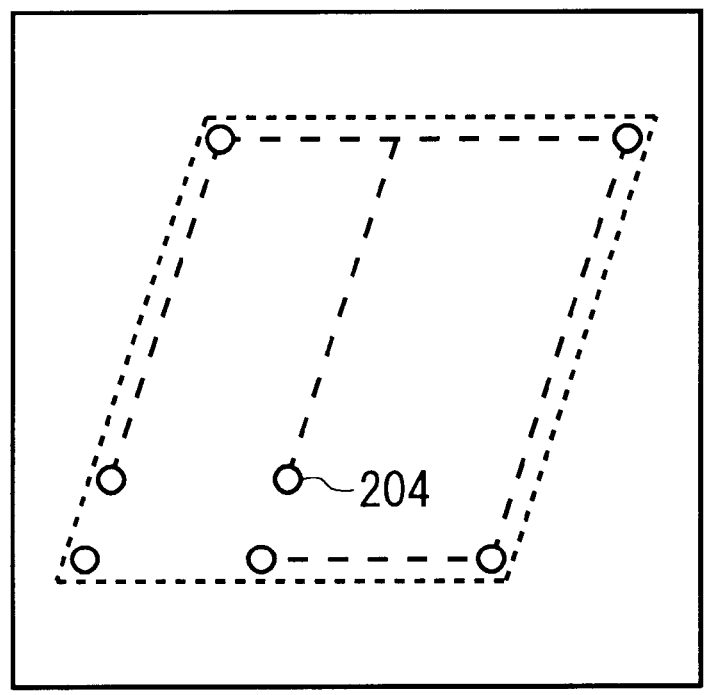

FIG. 43B shows each lens region 206. The lens region 206 has a plurality of lens openings 204. It is desirable to arrange each lens opening 204, a corresponding one of the apertures 166 provided in the aperture part 160 of the BAA device 27, and a corresponding one of the deflectors 184 included in the deflector array 180 coaxially. Moreover, the lens part 202 preferably includes at least one dummy opening 205 described referring to FIGS. 8–11. In this case, it is preferable that the dummy opening 205 is provided on the outer side of the region where a plurality of lens regions 206 are provided.

Figure 44A:
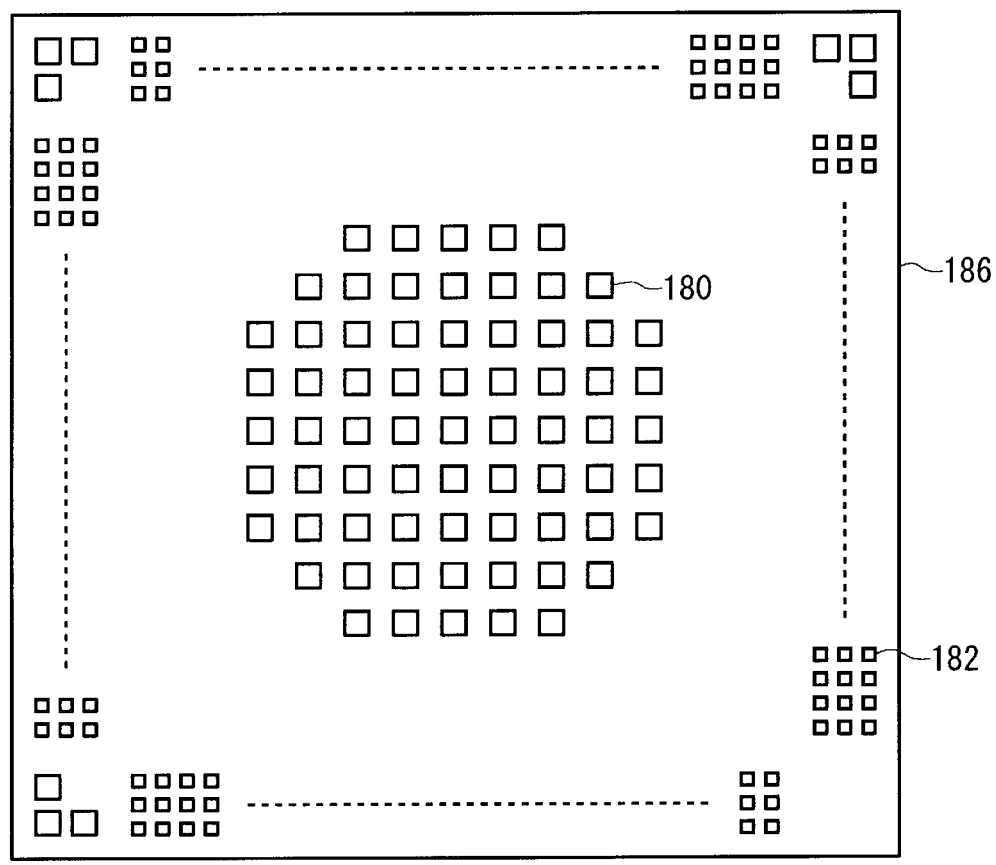

FIG. 44A is a top view of the deflecting unit 60. The deflecting unit 60 includes a substrate 186, a plurality of deflector arrays 180 and a plurality of deflecting electrode pads 182. The deflector arrays 180 are desirably arranged at the center of the substrate 186, while the deflecting electrode pads 182 are provided in the peripheral region of the substrate 186. It is also desirable that each of the deflector arrays 180, the corresponding aperture part 160 of the BAA device 27, and the corresponding lens regions 206 of the third and fourth multi-axis electron lenses 34 and 36 are arranged coaxially. Moreover, the deflecting electrode pads 182 are electrically connected to the deflector controller 98 (shown in FIG. 41) via a connector such as a probe card or a pogo pin array.

Figure 44B:
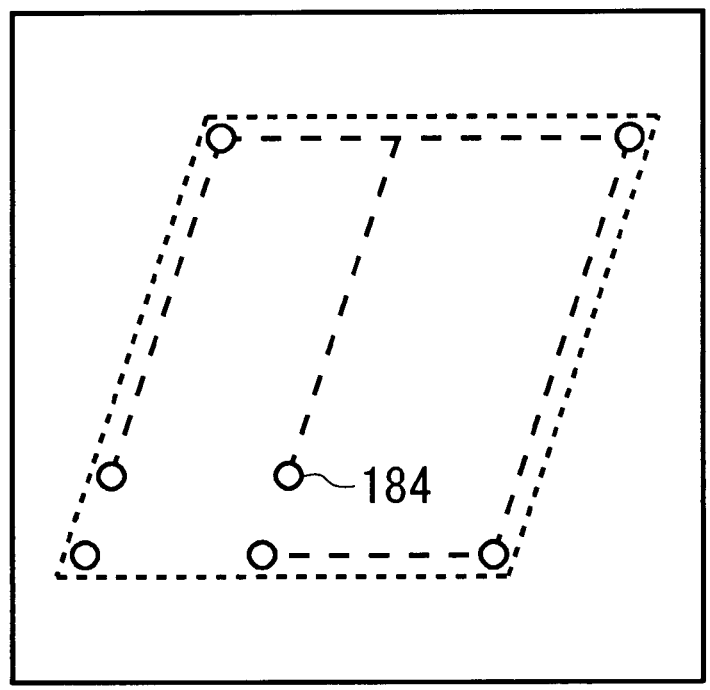

FIG. 44B shows an example of the deflector array 180. The deflector array 180 has a plurality of deflectors 184 each formed by a plurality of deflecting electrodes and an opening. It is desirable to arrange the deflector 184 coaxially with a corresponding one of the apertures 166 in the aperture part 160 of the BAA device 27, and corresponding ones of the lens openings 204 provided in the lens regions 206 of the third and fourth multi-axis electron lenses 34 and 36.

Figure 45A:
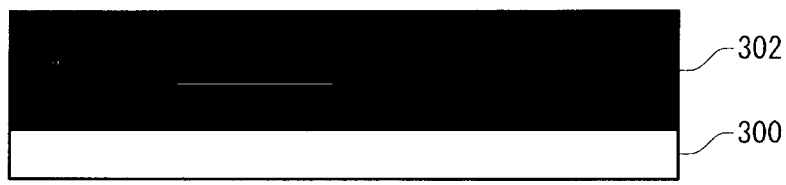
FIGS. 45A through 45G illustrate an exemplary fabrication process of the lens part 202 of the multi-axis electron lens according to an embodiment of the present invention.

FIGS. 45A through 45G illustrate a fabrication process of the lens part 202 included in the multi-axis electron lens according to an embodiment of the present invention. First, a conductive substrate 300 is prepared. As shown in FIG. 45A, a photosensitive layer 302 is applied onto the conductive substrate 300. The photosensitive layer 302 is preferably formed by spin-coating or making a thick resist film having a predetermined thickness adhere to the substrate 300, for example. The photosensitive layer 302 is formed to have a thickness equal to or thicker than the thickness of the lens part 202.

Figure 45B:
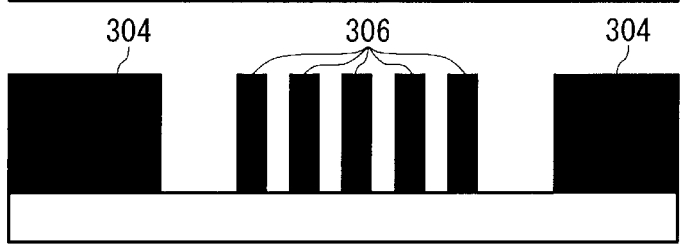

FIG. 45B shows an exposure process in which a predetermined pattern is formed by exposure and the first removal process in which a predetermined area is removed. The predetermined pattern is formed based on the diameter of the lens part 202 and the pattern of the lens openings 204 through which a plurality of electron beams pass, referring to FIGS. 8–11, 39, 43A and 43B. More specifically, the predetermined pattern is determined by the diameter of the lens part 202 and the diameter and position of the lens opening 204. Then, a lens-forming mold 304 and a lens-opening-forming mold 306 to be used for forming the lens part 202 and the lens opening 204 in an electro forming process described later are formed based on the diameter of the lens part 202 and the diameter and position of the lens opening 204, respectively, by the exposure process and the first removal process.

The predetermined pattern may be further formed based on a pattern of the dummy opening through which no electron beam passes. In this case, a dummy-opening-forming mold to be used for forming the dummy opening may be formed by the exposure process and the first removal process. The dummy-opening-forming mold may be formed to have a different diameter from that of the lens-opening forming mold.

In the exposure process, it is preferable to use an exposure method corresponding to an aspect ratio that is a ratio of the opening diameter to the opening depth of the lens opening 204. The opening diameter of the lens opening 204 is preferably in the range of 0.1 mm to 2 mm, while the opening depth is preferably in the range of 5 mm to 50 mm. In this example, the lens opening has an opening diameter of about 0.5 mm and an opening depth of about 20 mm, that is, the aspect ratio is about 40. Therefore, it is preferable to use an X-ray exposure method that has a high transmissivity for the photosensitive layer and therefore can easily form a high aspect-ratio pattern. In this case, the photosensitive layer 302 is preferably a positive or negative type photoresist for X-ray exposure, and is exposed with an X-ray exposure mask having a pattern corresponding to the patterns of the lens-forming mold 304 and the lens-opening-forming mold 306. Then, an exposed area in a case of the positive type photosensitive layer 302 or an area that is not exposed in a case of the negative type photosensitive layer 302 is removed, thereby forming the lens-forming mold 304 and the lens-opening-forming mold 306 are obtained.

Figure 45C:
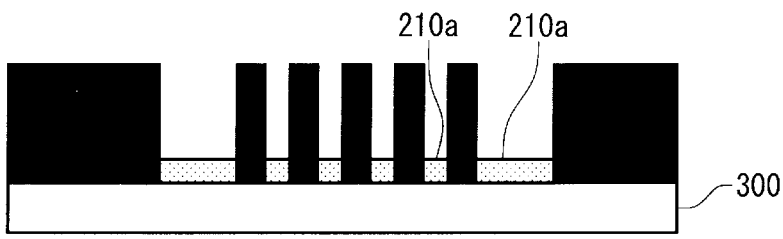

In a process shown in FIG. 45C, the first magnetic conductive member 210a is formed by electro forming. The first magnetic conductive member 210a is formed of, for example, nickel alloy to have a thickness of about 5 mm by electroplating using the conductive substrate 300 as an electrode.

Figure 45D:
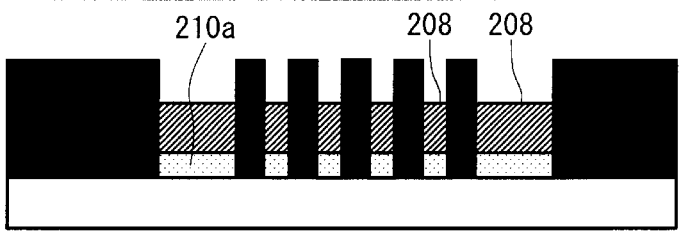

In a process shown in FIG. 45D, the non-magnetic conductive member 242 is formed by electro forming. The non-magnetic conductive member 242 is formed of, for example, copper to have a thickness of about 5–20 mm by electroplating using the first magnetic conductive member 210a as an electrode.

Figure 45E:
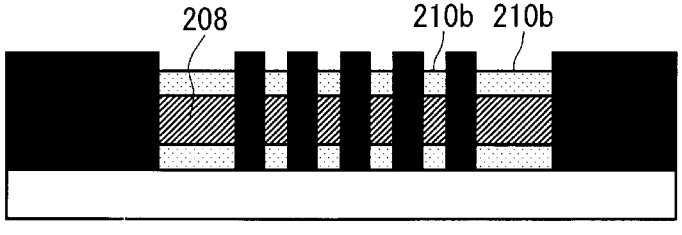

The second magnetic conductive member 210b is then formed by electro forming in a process shown in FIG. 45E. The second magnetic conductive member 210b is formed of, for example, nickel alloy to have a thickness of about 5–20 mm by electroplating using the non-magnetic conductive member 242 as an electrode.

Figure 45F:
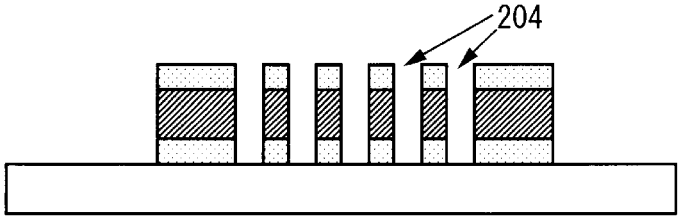

The photosensitive layer 302 is then removed in the second removal process shown in FIG. 45F. In the second removal process, the remaining parts of the photosensitive layer 302, that is, the lens-forming mold 304 and the lens-opening-forming mold 306 are removed. As a result, the lens openings 204 that have a plurality of first openings included in the first magnetic conductive member 210a, a plurality of through holes included in the non-magnetic conductive member that are arranged coaxially with the first openings, and a plurality of second openings included in the second magnetic conductive member 210b that are arranged coaxially with the first openings and the through holes are formed, respectively.

Figure 45G:
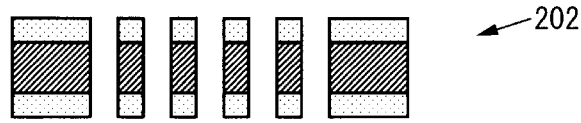

FIG. 45G illustrates a peeling process in which the conductive substrate 300 is peeled off. By peeling the conductive substrate 300 off, the lens part 202 is obtained. The conductive substrate 300 may be removed by using a drug solution that can remove the conductive substrate 300 with substantially no reaction with the first and second magnetic conductive members 210a and 210b and the non-magnetic conductive member 242.

Figure 46A:
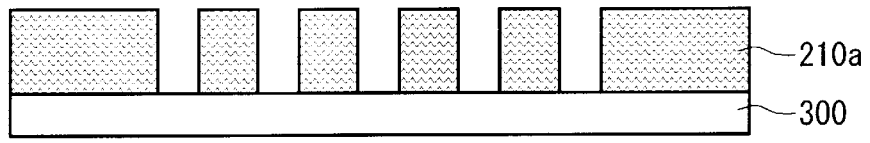
FIGS. 46A through 46E illustrate exemplary processes for forming projections 218.
Figure 46B:
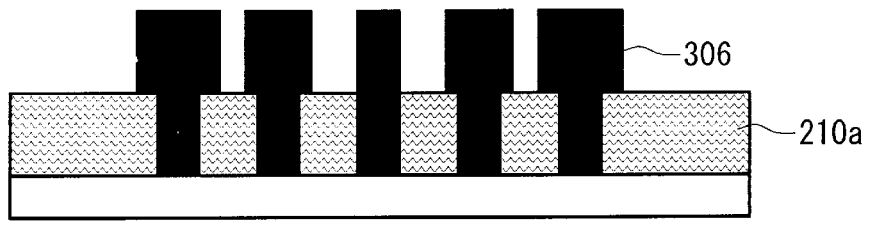
Figure 46C:
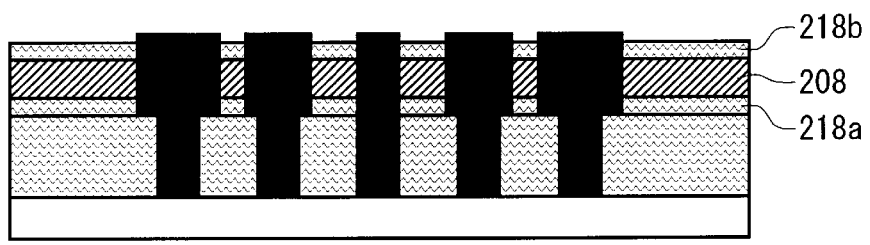
Figure 46D:
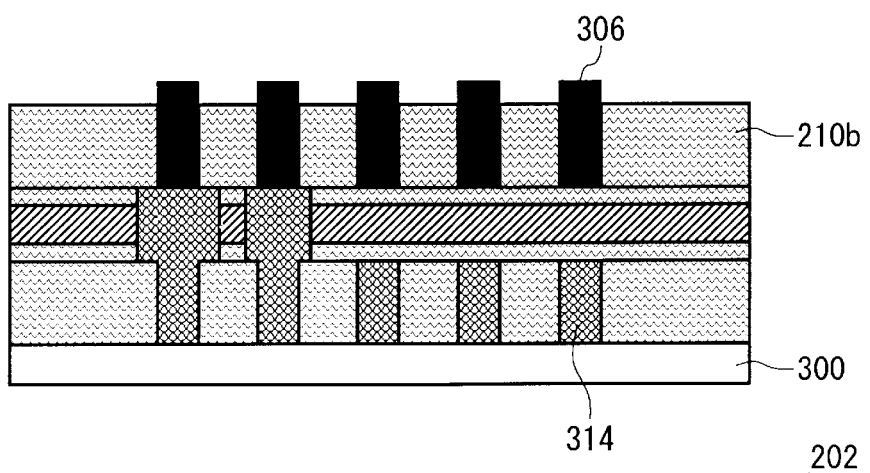

FIGS. 46A through 46E illustrate processes for forming the projections 218. FIG. 46A shows the first lens magnetic conductive member 210a formed on the conductive substrate 300 in the process shown in FIG. 45C. On the first lens magnetic conductive member 210a, the lens-opening-forming molds 306 are formed so as to correspond to positions at which the projections 218 described with reference to FIG. 14B are to be formed. Then, as shown in FIG. 46C, first projections 218a, the non-magnetic member 242 and second projections 218b are formed by a similar process to that described in FIGS. 45C through 45E.

Figure 46E:
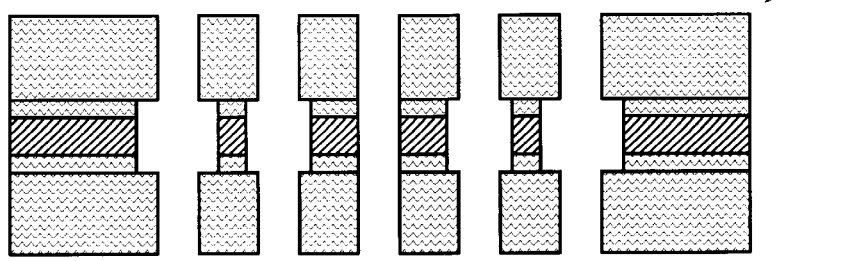

The lens-opening-forming molds 306 are then removed and thereafter opening areas where the lens-opening-forming molds 306 are removed are filled with a filling member 314. It is desirable to form the filling member 34 from material that can be removed selectively with respect to materials for the magnetic conductive members 210, the projections 218 and the non-magnetic conductive member 242. It is also desirable that the filling member 314 is formed to have such a thickness that the levels of the filling member 314 and the second projections 218 are substantially the same. After the formation of the filling member 314, the lens-opening-forming molds 306a reformed again in a similar manner to the processes described before, thereby forming the second magnetic conductive member 210b. Then, the lens-opening-forming molds 306, the filling member 314 and the conductive substrate 300 are removed, as shown in FIG. 46E, so that the lens part 202 is obtained.

The first and second projections 218a and 218b may be formed from material having a different magnetic permeability from the material for the lens magnetic conductive members 210. Moreover, the cut portions may be formed by forming lens-opening-forming molds having a pattern obtained by reversing the lens-opening-forming molds 306 as shown in FIG. 46B, and then etching the lens magnetic conductive members 210 by using the lens-opening-forming molds as a mask.

Figure 47A:
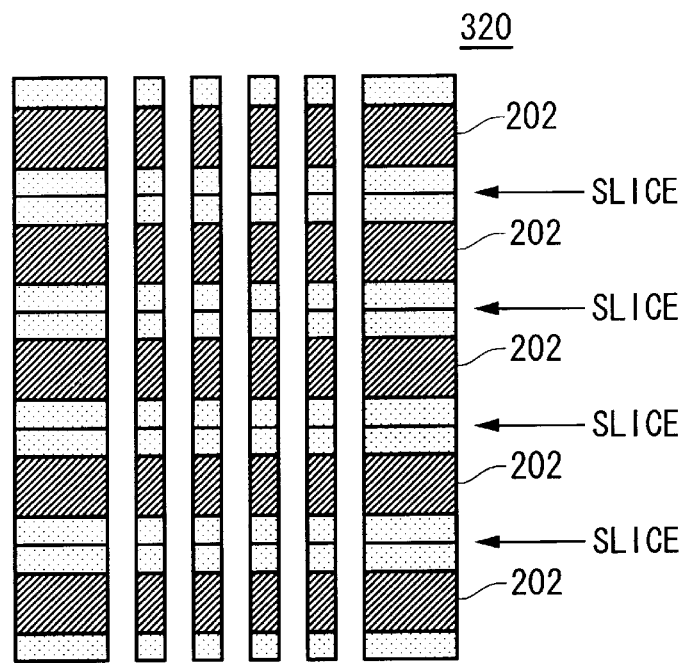
FIGS. 47A and 47B illustrate another example of the fabrication method of the lens part 202.
Figure 47B:
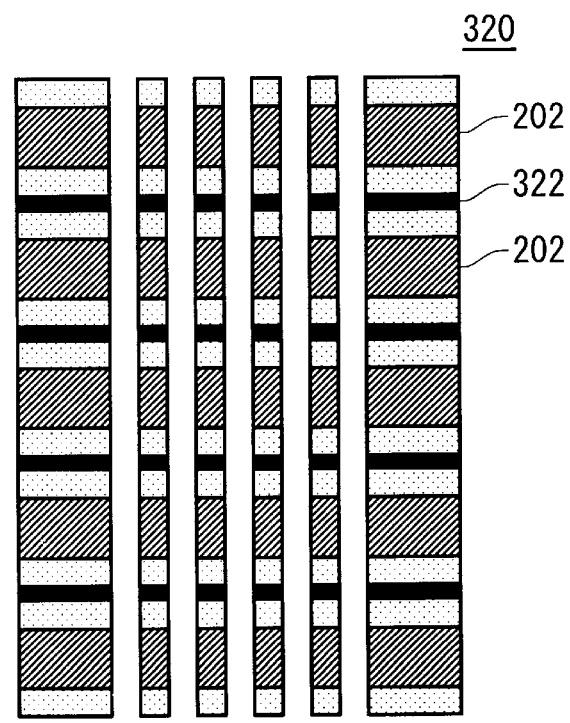

FIGS. 47A and 47B illustrate another example of the fabrication method of the lens part 202. After the formation of the second magnetic conductive member has been completed, the formation of the first magnetic conductive member, the formation of the non-magnetic conductive member, and the formation of the second magnetic conductive member are performed a plurality of times repeatedly. Then, by performing the second removal process and the peeling process, a lens block 320 including a plurality of lens parts 202 is obtained, as shown in FIG. 47A. The individual lens parts 202 may be obtained by slicing the lens block 320, as shown in FIG. 47A. Alternatively, the lens parts 202 may be obtained by forming the lens block 320 so as to include separation members 322 between the lens parts 202 and then removing only the separation members 322 by using a drug solution that can remove the separation members 322 with substantially no reaction with the non-magnetic conductive member 242 and the second magnetic conductive member 210b. In these examples, the photosensitive layer 302 is desirably formed to have a thickness thicker than the thickness of the lens block 320.

Figure 48A:
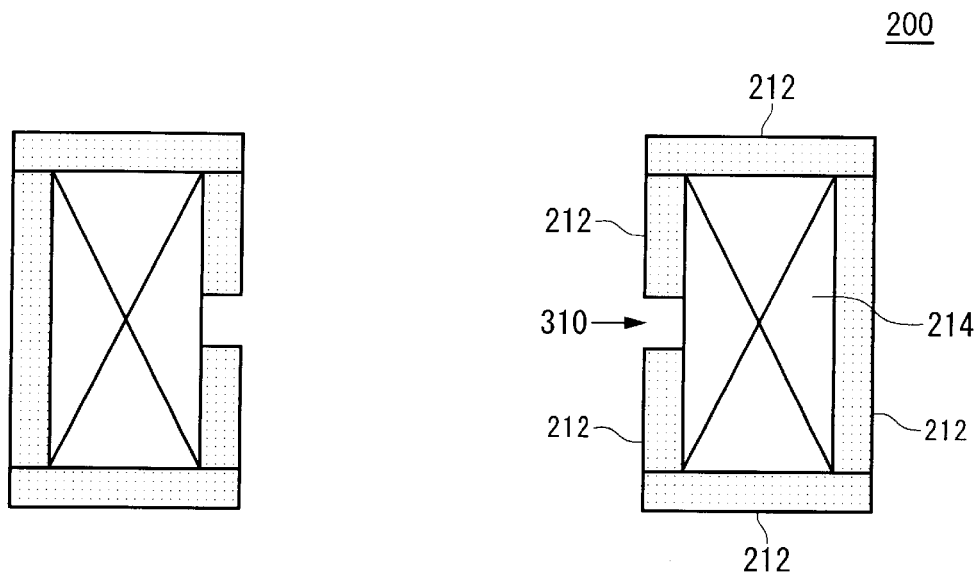
FIGS. 48A, 48B and 48C illustrate a fixing process for fixing the coil part 200 and the lens part 202.
Figure 48B:
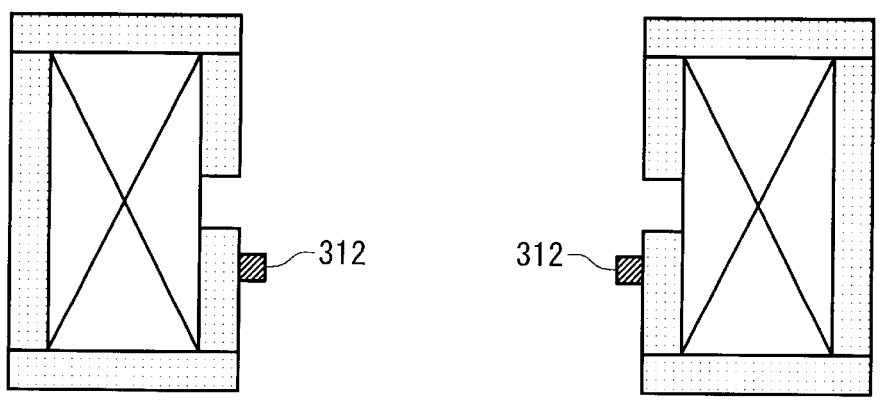
Figure 48C:
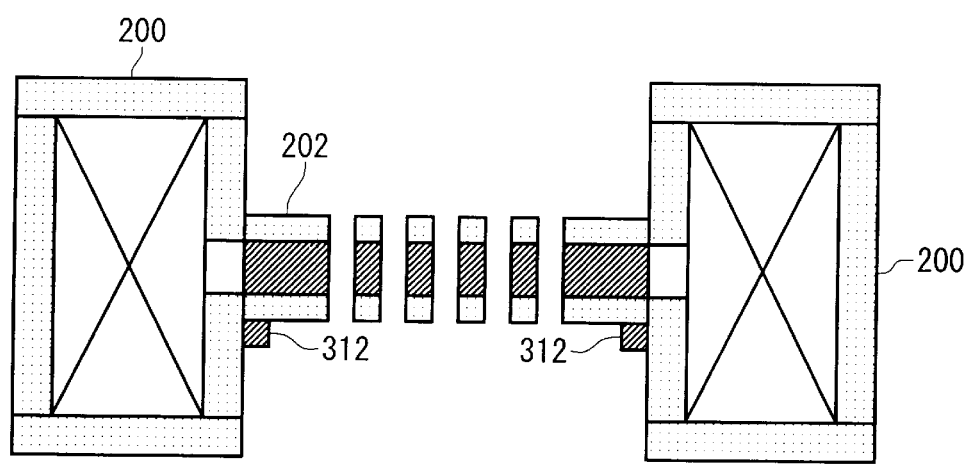

FIGS. 48A through 48C illustrate a fixing process for fixing the coil part 200 and the lens part 202. FIG. 48A shows the coil part 200 for generating the magnetic field. It is preferable that the coil part 200 has an inner diameter corresponding to the diameter of the lens part 202 so as to have an annular shape. The coil part 200 has the coil magnetic conductive member 212 provided in the surrounding area of the coil 214 that can generate the magnetic field and a space 310. The space 310 may include a non-magnetic conductive member or be filled with the non-magnetic conductive member. It is preferable that the coil magnetic conductive member 212 and the coil 214 are formed by fine machining, for example. The coil part 200 is formed by joining the magnetic conductive member 212 and the coil 214 by fine machining, such as screwing, welding or bonding. The coil magnetic conductive member 212 is preferably formed from material having a different magnetic permeability from that of the material for the lens magnetic conductive member 210.

FIG. 48B shows a process for forming a support 312 used for fixing the lens part 202 to the coil part 200. After the coil part 200 has been formed, the support 312 formed of non-magnetic conductive material is joined to the coil part 200 by fine machining, such as screwing, welding or bonding. It is desirable to arrange the support 312 at such a position that the support 312 supports the lens part 202 so as to fit the space 310 of the coil part 200 to the non-magnetic conductive member 242 of the lens part 202 in the fixing process described later. The support 312 may be a single annular member or include a plurality of convex members that supports the lens part 202 as a plurality of supporting points. Moreover, the support 312 may be formed integrally with the magnetic conductive member 212. More specifically, the magnetic conductive member 312 may be formed to include a convex portion serving as the support 312. In this case, it is desirable that the support 312 is formed to have such a dimension that the support 312 has no effect on the magnetic field generated in the lens opening 204 by the first and second lens magnetic conductive members 210a and 210b.

FIG. 48C shows the fixing process for fixing the coil part 200 and the lens part 202 by means of the support 312. The lens part 202 is preferably joined to be fixed to the coil part 200 by bonding or fitting the space 310 of the coil part 200 to the non-magnetic conductive member 242 or meshing the space 310 with the non-magnetic conductive member 242. The support 312 may be removed after the lens part 202 is fixed to the coil part 200.

Figure 49:
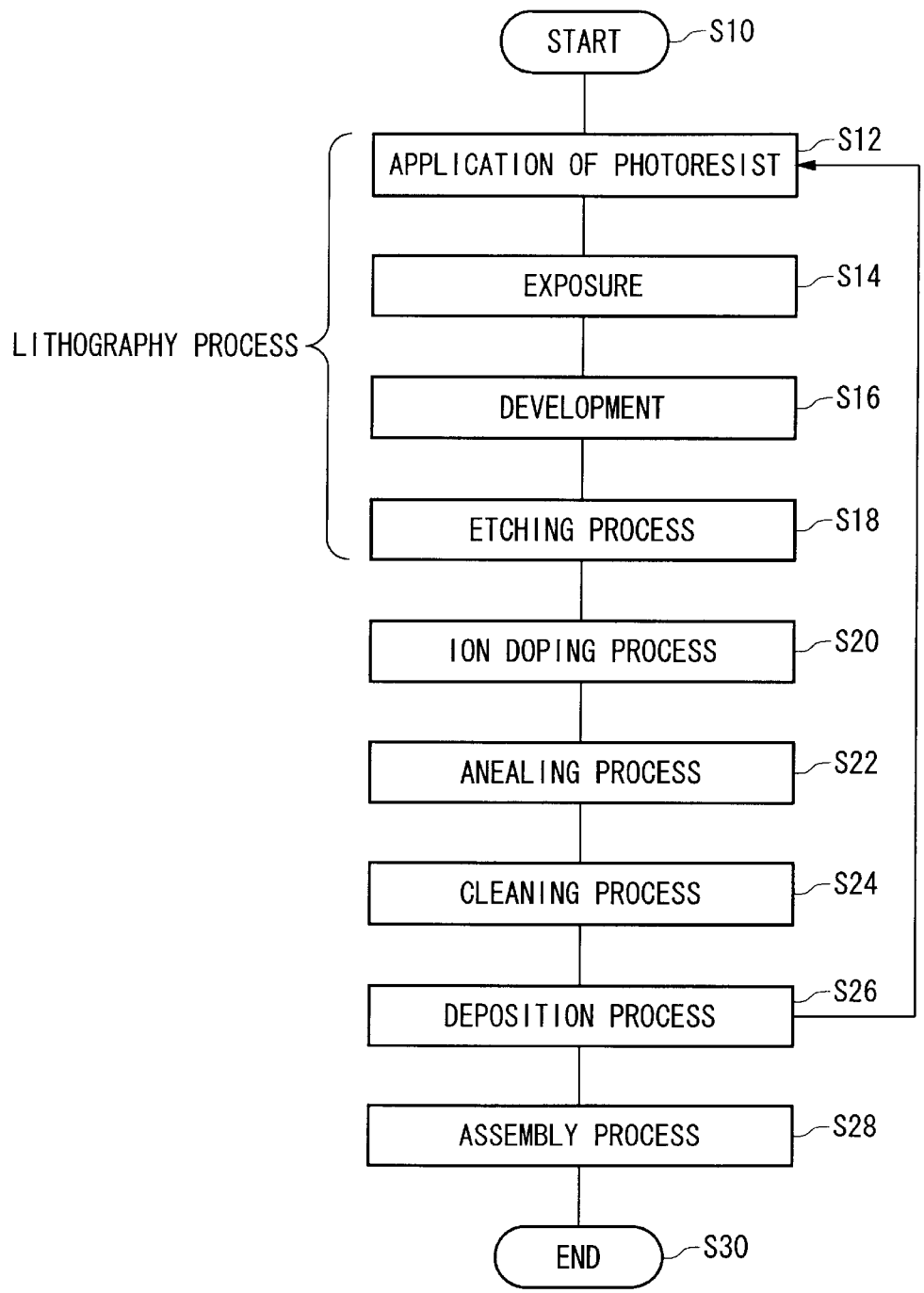
FIG. 49 is a flowchart of processes for fabricating a semiconductor device from a wafer according to an embodiment of the present invention.

FIG. 49 is a flowchart of a fabrication process of a semiconductor device according to an embodiment of the present invention, in which the semiconductor device is fabricated from a wafer. In Step S10, the fabrication process starts. First, photoresist is applied onto an upper surface of the wafer 44 in Step S12. The wafer 44 on which the photoresist is applied is then placed on the wafer stage 46 in the electron beam exposure apparatus 100, referring to FIGS. 1 and 17. The wafer 44 is exposed to have a pattern image transferred thereon by being illuminated with the electron beams by the focus adjustment process in which the focus adjustment of the electron beam is performed for each of the electron beams independently of other electron beams by means of the first, second, third, and fourth multi-axis electron lenses 16, 24, 34 and 36, and the illumination switching process in which it is switched by the blanking electrode array 26 for each electron beam independently of other electron beams whether or not the electron beam is to be incident on the wafer 44, as described before referring to FIGS. 1, 33 and 41.

The wafer 44 exposed in Step S14 is then immersed into developing solution to be developed, and thereafter unnecessary resist is removed (Step S16). In Step S18, a silicon substrate, an insulating layer or a conductive layer in areas of the wafer where the photoresist is removed are etched by anisotropic etching using plasma. In Step S20, impurities such as boron or arsenic ions are doped into the wafer in order to fabricate a semiconductor device such as a transistor or a diode. In Step S22, the impurities are activated by annealing. In Step S24, the wafer 44 is cleaned by a cleaning solution to remove organic contaminant or metal contaminant on the wafer. Then, a conductive layer and an insulating layer are deposited to form a wiring layer and an insulator between the wirings. By appropriately combining the processes in Steps S12 to S26 and repeating the combined processes, it is possible to fabricate the semiconductor device having an isolation region, a device region and wirings on the wafer. In Step S28, the wafer on which a desired circuit has been formed is cut, and then assembly of chips is performed. In Step S30, the fabrication flow of the semiconductor device is finished.

As is apparent from the above description, according to the present invention, a plurality of electron beams can be converged independently of each other and can be controlled for each of the electron beams whether or not to be incident on the wafer, by including the multi-axis electron lens and the illumination switching unit. Thus, since the electron beams can be controlled independently without cross over, it is possible to greatly improve throughput.

Although the present invention has been described by way of exemplary embodiments, it should be understood that those skilled in the art might make many changes and substitutions without departing from the spirit and the scope of the present invention which is defined only by the appended claims.

What is claimed is:

1. An electron beam exposure apparatus for exposing a wafer, comprising:
   a multi-axis electron lens operable to converge a plurality of electron beams independently of each other; and
   a lens-intensity adjuster including a substrate provided to be substantially parallel to said multi-axis electron lens, and a lens-intensity adjusting unit operable to adjust the lens intensity of said multi-axis electron lens applied to said electron beams passing through said lens openings, respectively.

2. An electron beam exposure apparatus as claimed in claim 1, wherein said multi-axis electron lens includes a plurality of magnetic conductive members arranged to be substantially parallel to each other, said plurality of magnetic conductive members having a plurality of lens openings forming a plurality of lens openings allowing said plurality of electron beams to pass therethrough, respectively.

3. An electron beam exposure apparatus as claimed in claim 2, wherein said lens-intensity adjusting unit includes an adjusting electrode provided to surround said electron beams from said substrate to said lens opening, said adjusting electrode being insulated from said plurality of magnetic conductive members.

4. An electron beam exposure apparatus as claimed in claim 3, wherein a length of said adjusting electrode in a direction in which said electron beams are radiated is longer than an inner diameter of said adjusting electrode.

5. An electron beam exposure apparatus as claimed in claim 3, wherein said adjusting electrode is provided to project from one of said magnetic conductive members other than a magnetic conductive member opposed to said substrate.

6. An electron beam exposure apparatus as claimed in claim 3, wherein said lens-intensity adjusting unit includes a plurality of adjusting electrodes provided to surround said electron beams, respectively, from said substrate to said lens openings.

7. An electron beam exposure apparatus as claimed in claim 6, wherein said lens-intensity adjusting unit includes a means operable to apply different voltages to said plurality of adjusting electrodes.

8. An electron beam exposure apparatus as claimed in claim 2, wherein said lens-intensity adjusting unit includes an adjusting coil operable to adjust magnetic field intensities in said lens openings, said adjusting coil being provided to surround said electron beams from said substrate along a direction in which said electron beams are radiated.

9. An electron beam exposure apparatus as claimed in claim 8, wherein said adjusting coil is arranged to be insulated from said magnetic conductive members.

10. An electron beam exposure apparatus as claimed in claim 8, wherein said lens-intensity adjusting unit further includes:
  a plurality of adjusting coils provided to surround said electron beams from said substrate to said plurality of lens openings; and
  an adjusting coil controller operable to supply different currents to said plurality of adjusting coils.

11. An electron beam exposure apparatus as claimed in claim 2, wherein said multi-axis electron lens further includes a non-magnetic conductive member provided between said plurality of magnetic conductive members, said non-magnetic conductive member having a plurality of through holes,
  wherein said through holes of said non-magnetic conductive member and said openings of said plurality of magnetic conductive members form together said plurality of lens openings.

12. An electron beam exposure apparatus as claimed in claim 1, wherein said multi-axis electron lens further includes a coil part having: a coil provided in an area surrounding said magnetic conductive members for generating a magnetic field; and a coil magnetic conductive member provided in an area surrounding said coil.

13. An electron beam exposure apparatus as claimed in claim 12, wherein said coil magnetic conductive member is formed from a material having a different magnetic permeability from that of a material for said plurality of magnetic conductive members.

14. An electron beam exposure apparatus as claimed in claim 1, further comprising at least one further multi-axis electron lens operable to reduce cross sections of said electron beams.

15. An electron beam exposure apparatus as claimed in claim 1, further comprising an electron beam shaping unit that comprises:
  a first shaping member having a plurality of first shaping openings operable to shape said plurality of electron beams;
  a first shaping-deflecting unit operable to deflect said plurality of electron beams after passing through said first shaping member, independently of each other; and
  a second shaping member having a plurality of second shaping openings operable to shape said plurality of electron beams after passing through said first shaping-deflecting unit to have desired shapes.

16. An electron beam exposure apparatus as claimed in claim 15, wherein said electron beam shaping unit further includes a second shaping-deflecting unit operable to deflect said plurality of electron beams deflected by said first shaping-deflecting unit independently of each other toward a direction substantially perpendicular to a surface of said wafer onto which said electron beams are incident,
  wherein said electron beam shaping unit allows said plurality of electron beams deflected by said second shaping-deflecting unit to pass through said second shaping member so as to shape said electron beams to have said desired shapes.

17. An electron beam exposure apparatus as claimed in claim 16, wherein said second shaping member includes a plurality of shaping-member illumination areas onto which said electron beams deflected by the second shaping-deflecting unit are incident, and
  said second shaping member includes said second shaping openings and other openings having different sizes from sizes of said second shaping openings in said shaping-member illumination area.

18. An electron beam exposure apparatus as claimed in claim 15, further comprising:
  a plurality of electron guns operable to generate said plurality of electron beams; and
  a further multi-axis electron lens operable to converge said generated electron beams to make said converged electron beams incident on said first shaping member,
  wherein said first shaping member divides said electron beams after passing through said further multi-axis electron lens.

19. An electron beam exposure apparatus as claimed in claim 1, wherein a plurality of multi-axis electron lenses are provided.

20. An electron beam exposure apparatus as claimed in claim 1, further comprising:
  a plurality of electron guns operable to generate said plurality of electron beams; and
  a voltage controller, connected to said electron guns, operable to apply different voltages to said plurality of electron guns.

21. A fabrication method of a semiconductor device on a wafer, comprising:
  performing focus adjustments for said plurality of electron beams independently of each other by a multi-axis electron lens having a plurality of lens openings for converging a plurality of electron beams independently of each other and a lens-intensity adjusting unit for adjusting a lens intensity of said multi-axis electron lens applied to said electron beams passing through said lens openings, said lens-intensity adjusting unit being provided on a substrate substantially parallel to said multi-axis electron lens; and
  exposing a pattern onto said wafer by illuminating said wafer with said plurality of electron beams.

* * * * *